(12) United States Patent
Sills et al.

(10) Patent No.: US 11,476,251 B2
(45) Date of Patent: Oct. 18, 2022

(54) CHANNEL INTEGRATION IN A THREE-NODE ACCESS DEVICE FOR VERTICAL THREE DIMENSIONAL (3D) MEMORY

(71) Applicant: Micron Technology, Inc., Boise, ID (US)

(72) Inventors: Scott E. Sills, Boise, ID (US); John A. Smythe, III, Boise, ID (US); Si-Woo Lee, Boise, ID (US); Gurtej S. Sandhu, Boise, ID (US); Armin Saeedi Vahdat, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/986,466

(22) Filed: Aug. 6, 2020

(65) Prior Publication Data

US 2022/0045060 A1 Feb. 10, 2022

(51) Int. Cl.
*H01L 27/108* (2006.01)
*H01L 29/786* (2006.01)
(Continued)

(52) U.S. Cl.
CPC .. *H01L 27/10802* (2013.01); *H01L 27/10805* (2013.01); *H01L 27/11578* (2013.01);
(Continued)

(58) Field of Classification Search
CPC ......... H01L 27/10802; H01L 27/10805; H01L 27/11511; H01L 27/11578;
(Continued)

(56) References Cited

U.S. PATENT DOCUMENTS 8,599,616 B2* 12/2013 Roizin .............. H01L 27/11582
438/211
9,379,018 B2* 6/2016 Choi ................... H01L 29/7853
(Continued)

OTHER PUBLICATIONS

U.S. Appl. No. 16/204,224, entitled, "Memory Arrays," filed Nov. 29, 2018, 43 pages.

*Primary Examiner* — Matthew E Warren
(74) *Attorney, Agent, or Firm* — Brooks, Cameron & Huebsch, PLLC

(57) ABSTRACT

Systems, methods and apparatus are provided for a three-node access device in vertical three dimensional (3D) memory. An example method includes a method for forming arrays of vertically stacked memory cells, having horizontally oriented access devices and vertically oriented access lines. The method includes depositing alternating layers of a dielectric material and a sacrificial material in repeating iterations to form a vertical stack. An etchant process is used to form a first vertical opening exposing vertical sidewalls in the vertical stack adjacent a first region. The first region is selectively etched to form a first horizontal opening removing the sacrificial material a first horizontal distance back from the first vertical opening. A first source/drain material, a replacement channel material having backchannel passivation, and a second source/drain material are deposited in the first horizontal opening to form the three-node access device for a memory cell among the arrays of vertically stacked memory cells.

43 Claims, 32 Drawing Sheets

(51) Int. Cl.
    *H01L 29/78*         (2006.01)
    *H01L 27/11578*    (2017.01)
    *H01L 27/11597*    (2017.01)

(52) U.S. Cl.
    CPC .... *H01L 27/11597* (2013.01); *H01L 29/7841* (2013.01); *H01L 29/7855* (2013.01); *H01L 29/7869* (2013.01)

(58) Field of Classification Search
    CPC ........... H01L 27/11597; H01L 29/7841; H01L 29/785; H01L 29/7855; H01L 29/78696
    See application file for complete search history.

(56) References Cited

U.S. PATENT DOCUMENTS

| | | | |
|---|---|---|---|
| 9,570,459 B2* | 2/2017 | Bateman | G11C 16/0483 |
| 10,468,414 B2* | 11/2019 | Kim | H01L 29/74 |
| 10,535,659 B2* | 1/2020 | Kim | H01L 27/10805 |
| 10,607,995 B2 | 3/2020 | Roberts et al. | |
| 11,195,836 B2* | 12/2021 | Kim | H01L 21/02603 |
| 2014/0054538 A1* | 2/2014 | Park | H01L 45/14 |
| | | | 257/5 |
| 2018/0323200 A1 | 11/2018 | Tang et al. | |
| 2019/0103406 A1 | 4/2019 | Tang et al. | |
| 2019/0164985 A1 | 5/2019 | Lee et al. | |

* cited by examiner

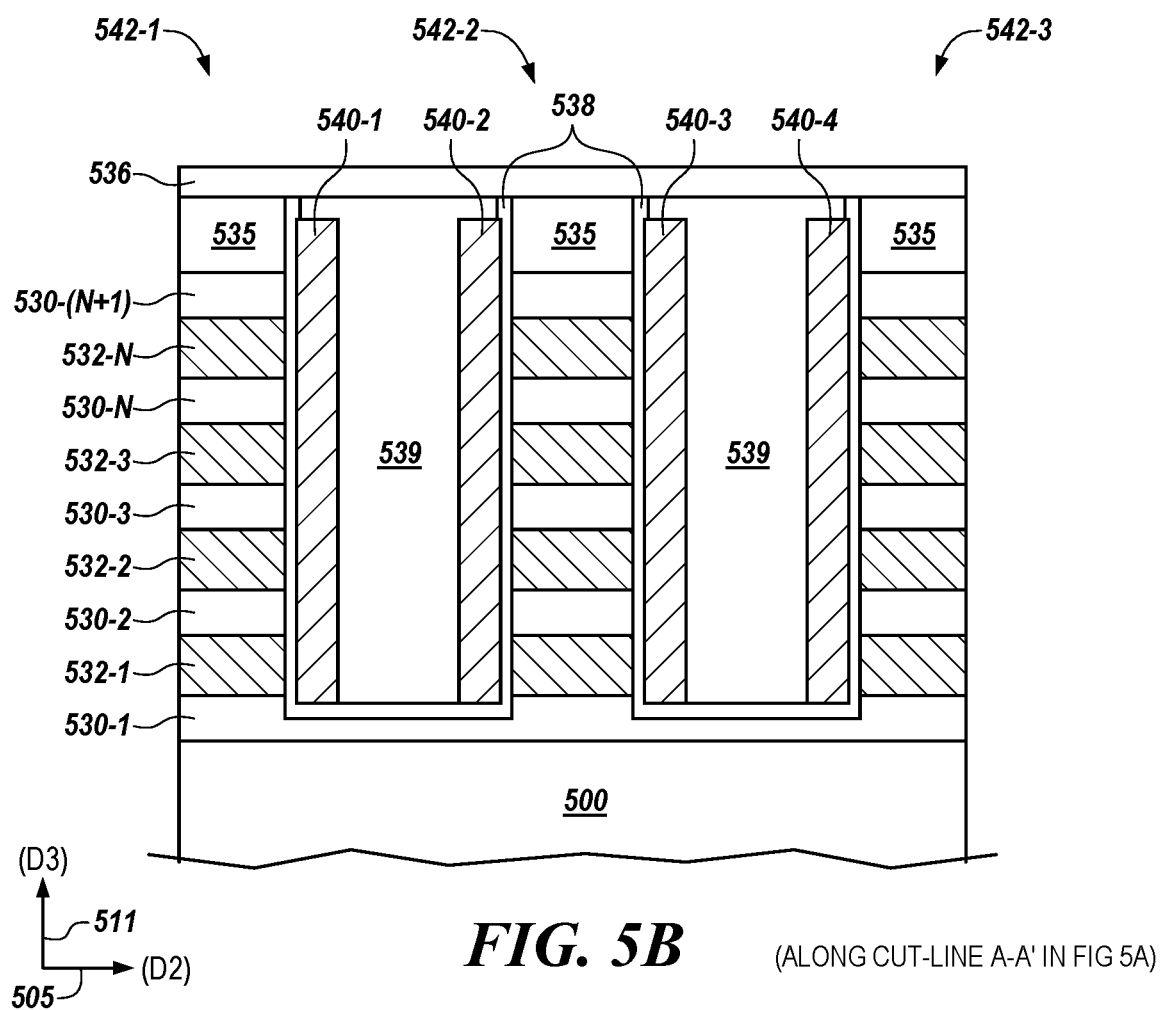
FIG. 5B (ALONG CUT-LINE A-A' IN FIG 5A)

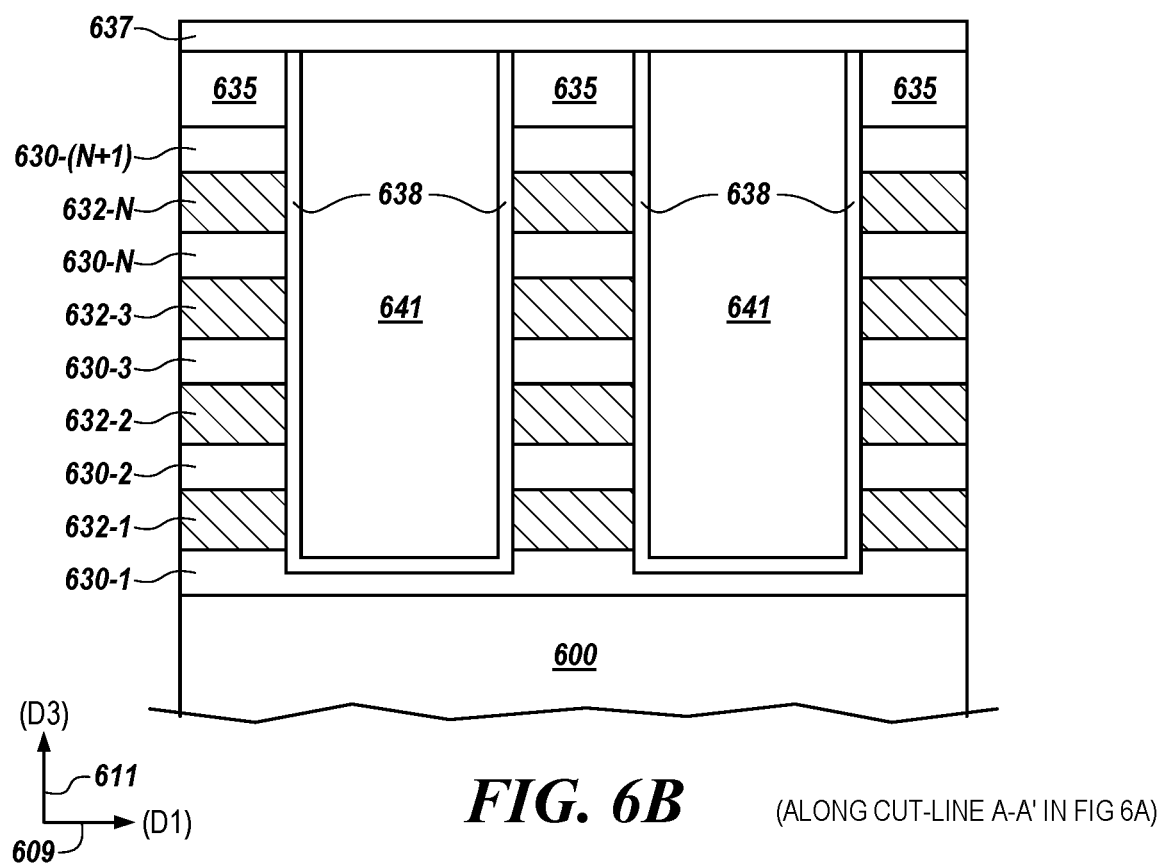
FIG. 6B (ALONG CUT-LINE A-A' IN FIG 6A)

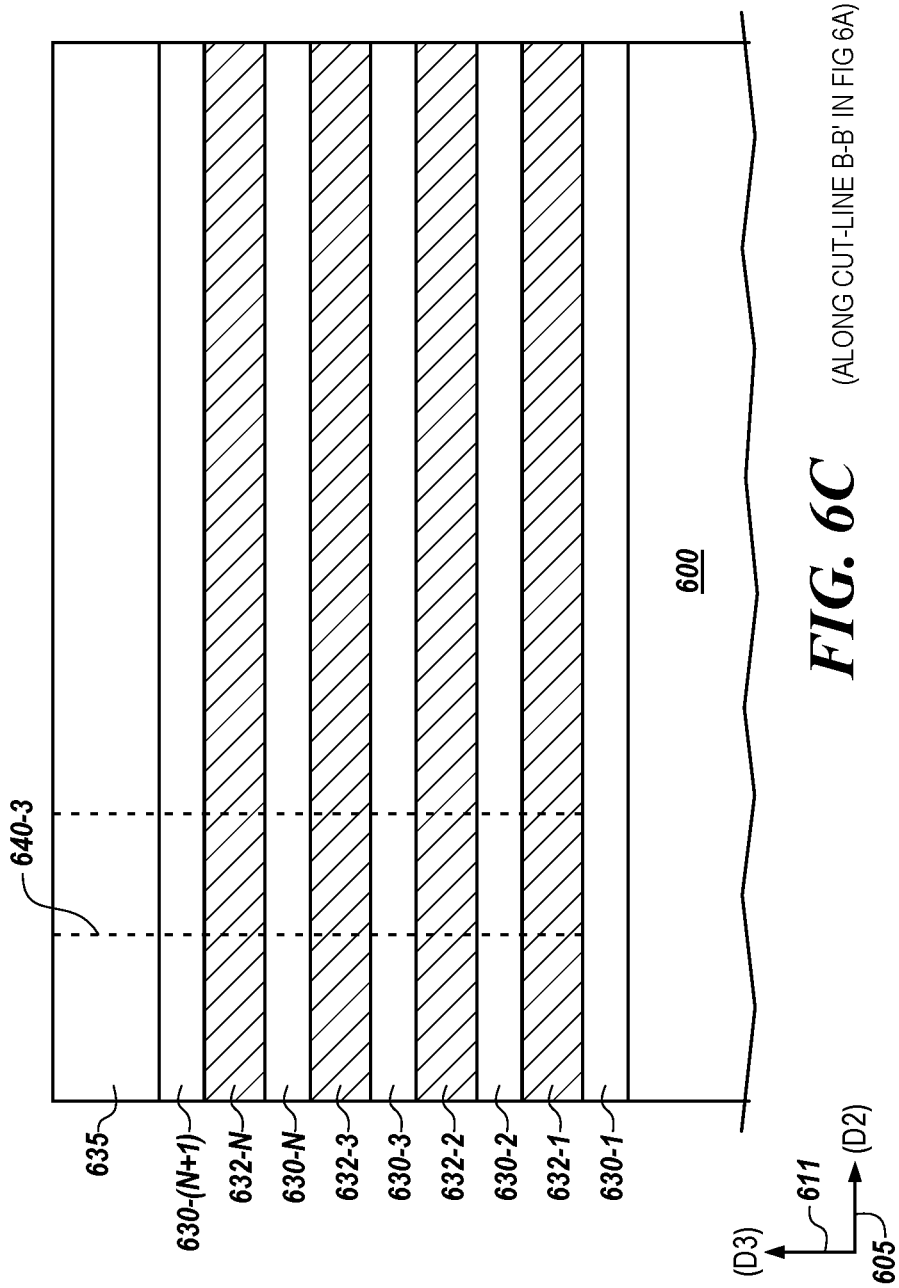
FIG. 6C (ALONG CUT-LINE B-B' IN FIG 6A)

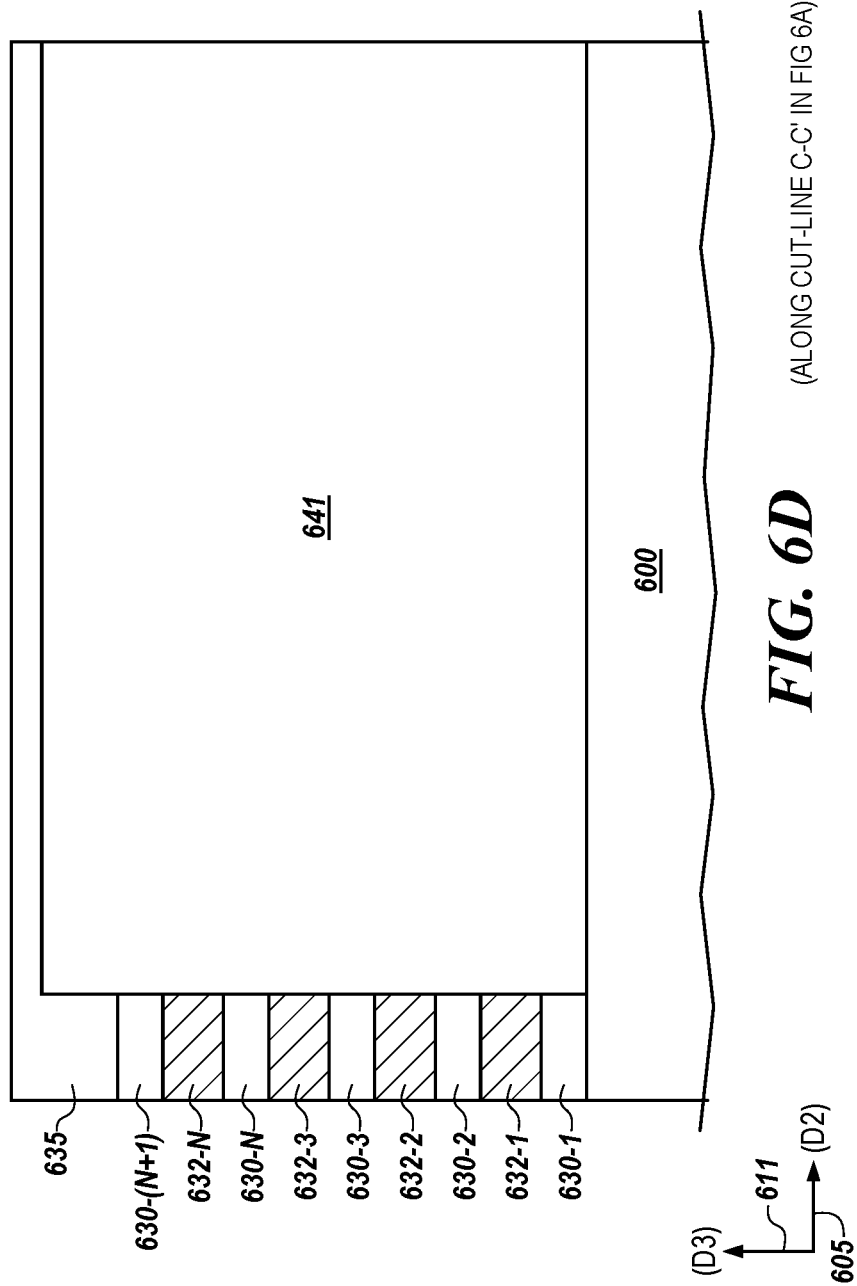

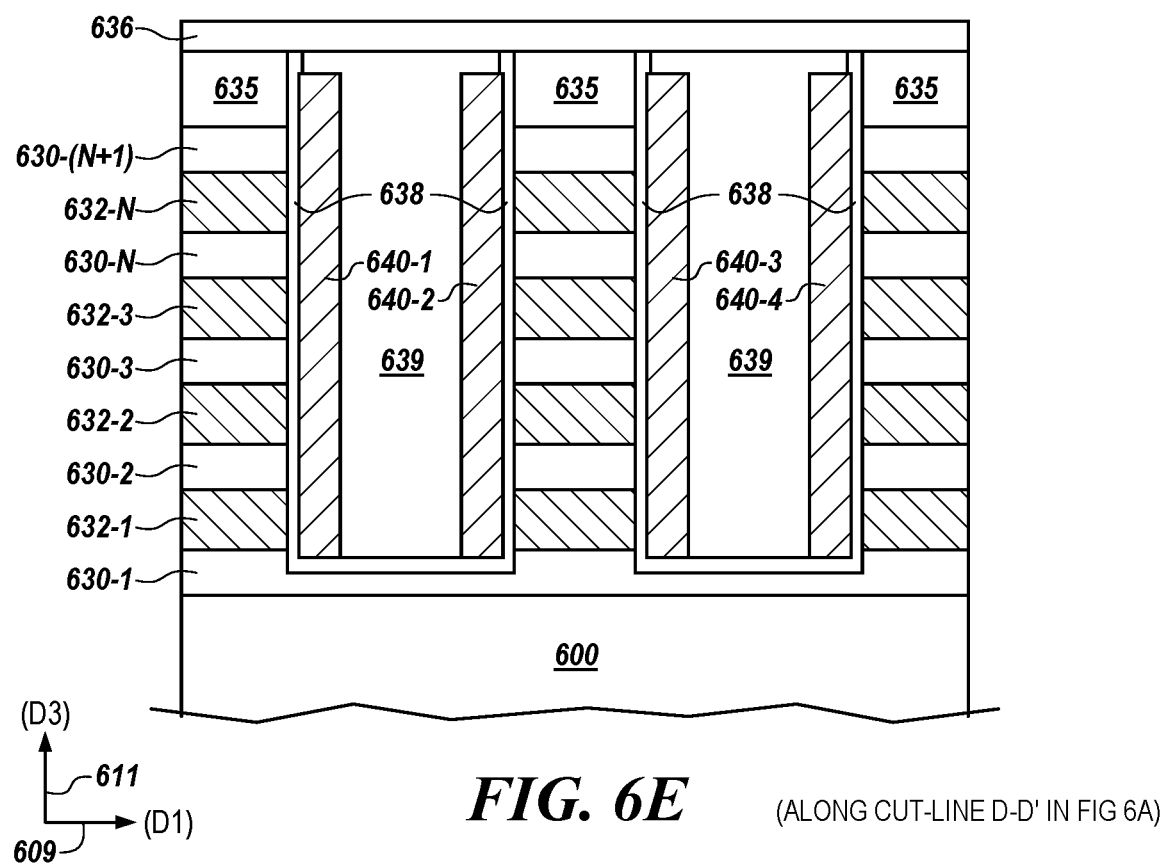
FIG. 6E (ALONG CUT-LINE D-D' IN FIG 6A)

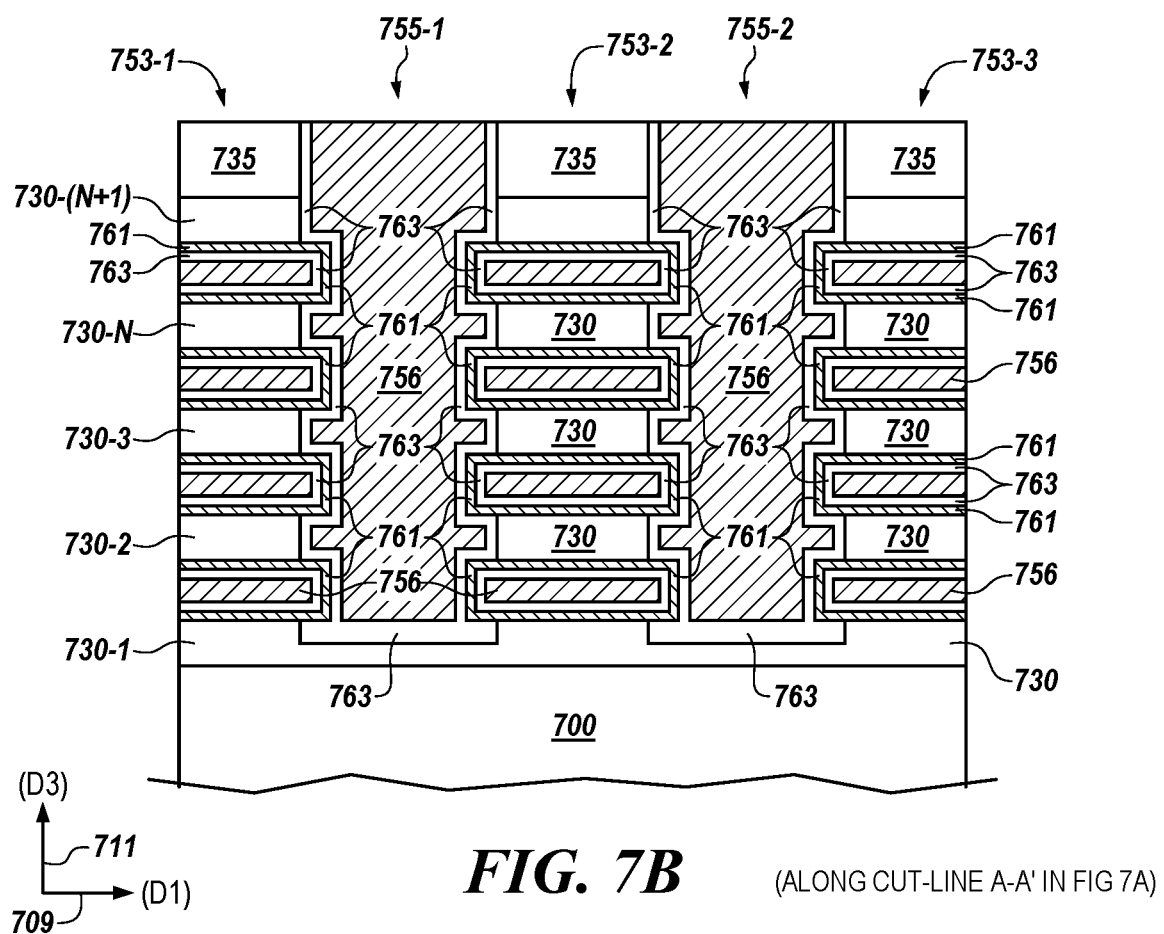
FIG. 7B  (ALONG CUT-LINE A-A' IN FIG 7A)

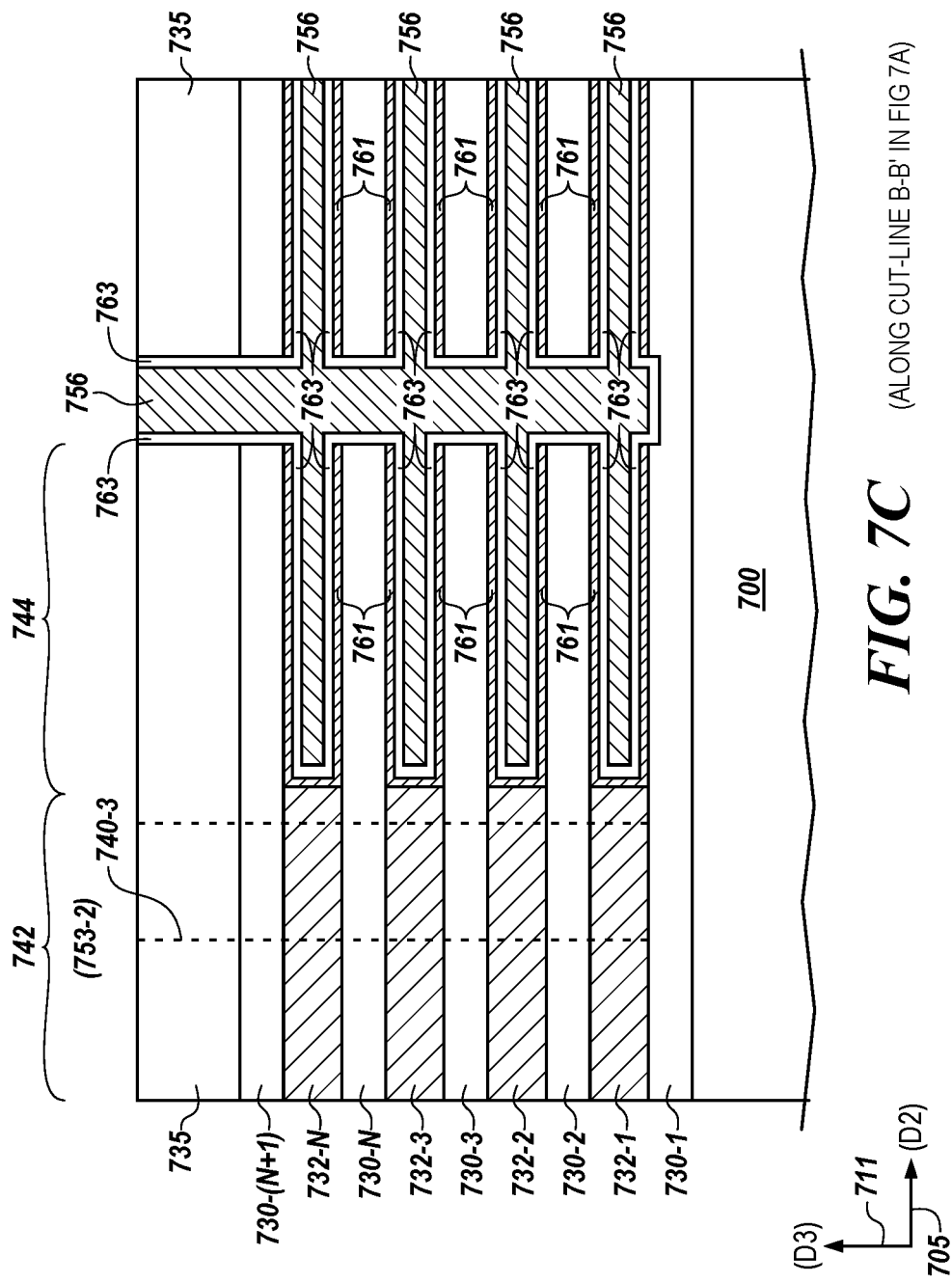
FIG. 7C (ALONG CUT-LINE B-B' IN FIG 7A)

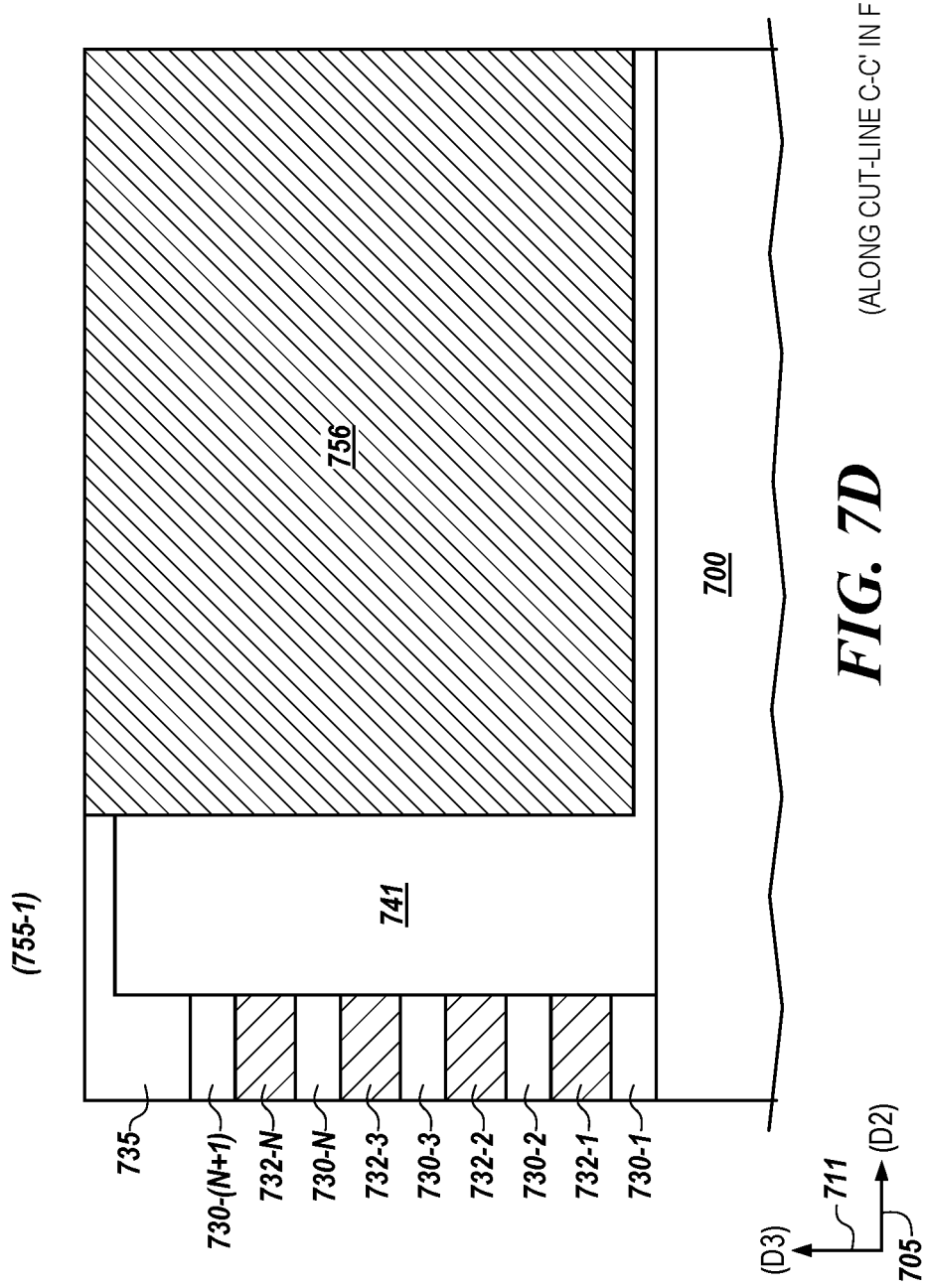
FIG. 7D (ALONG CUT-LINE C-C' IN FIG 7A)

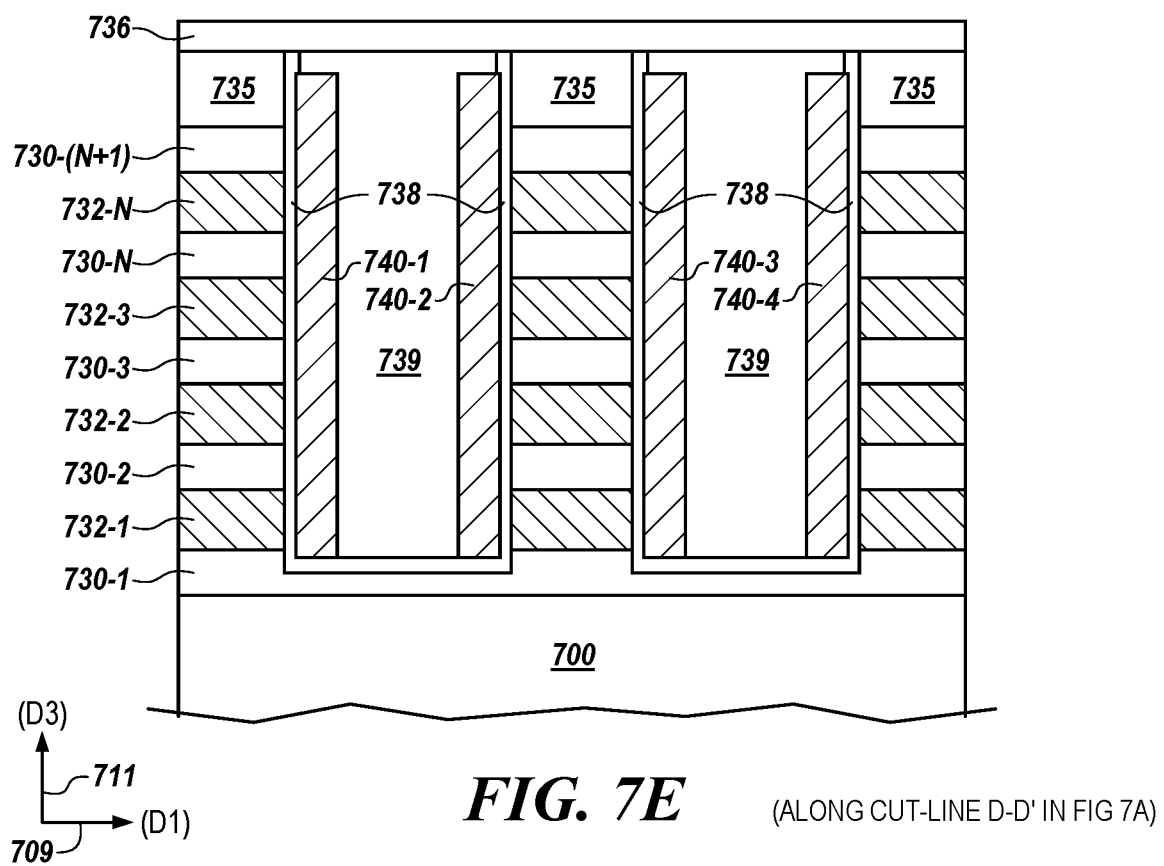
FIG. 7E (ALONG CUT-LINE D-D' IN FIG 7A)

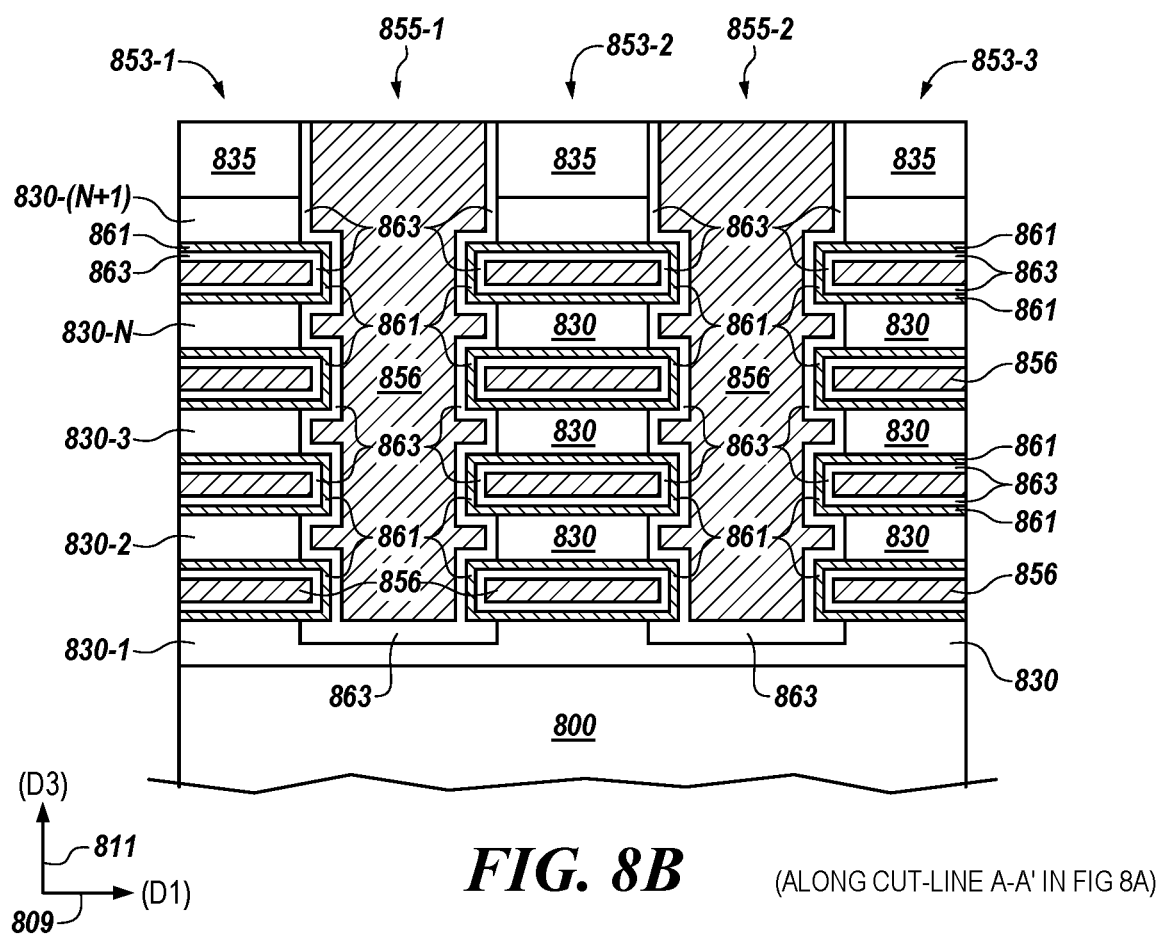
FIG. 8B  (ALONG CUT-LINE A-A' IN FIG 8A)

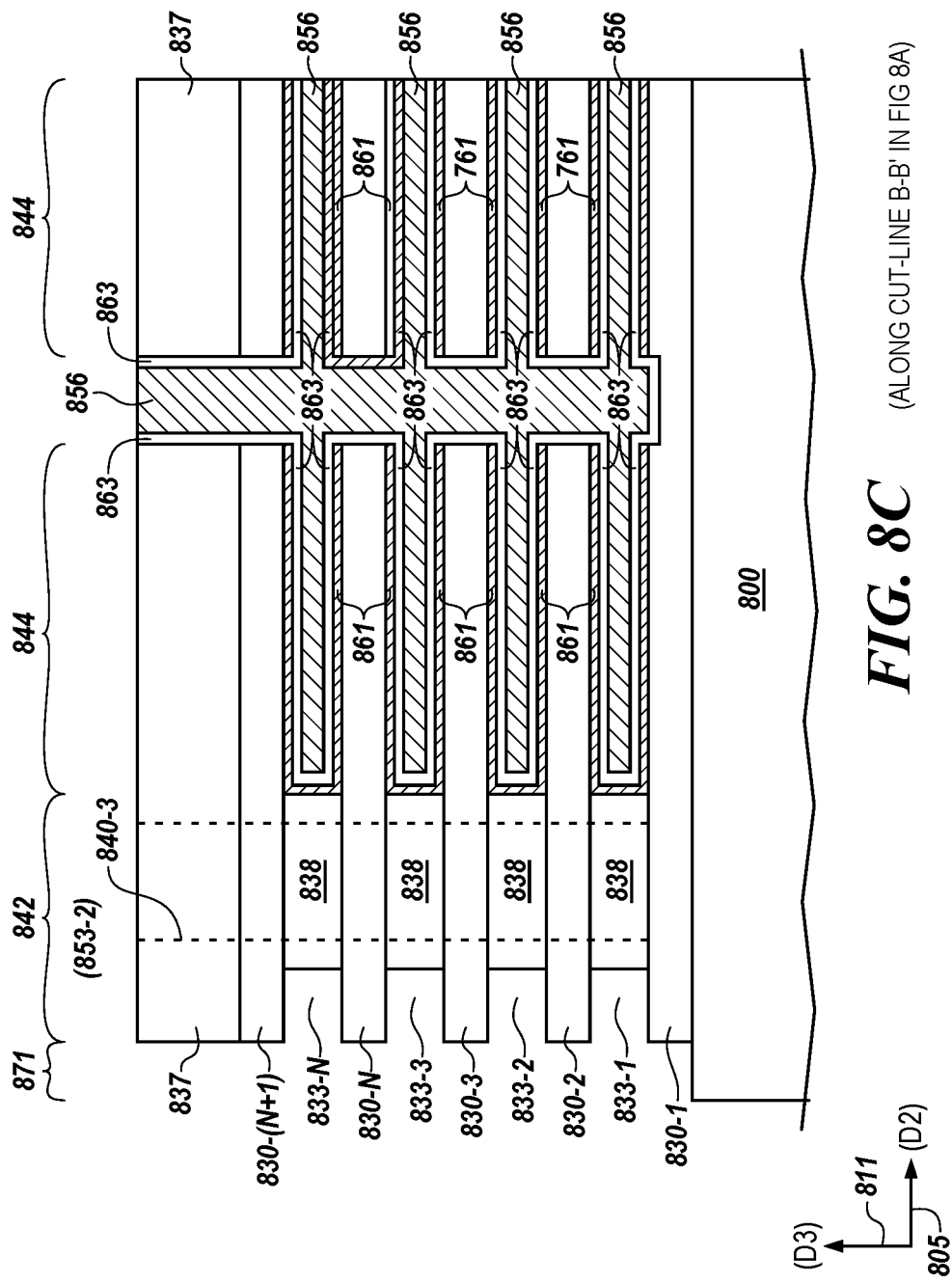
FIG. 8C (ALONG CUT-LINE B-B' IN FIG 8A)

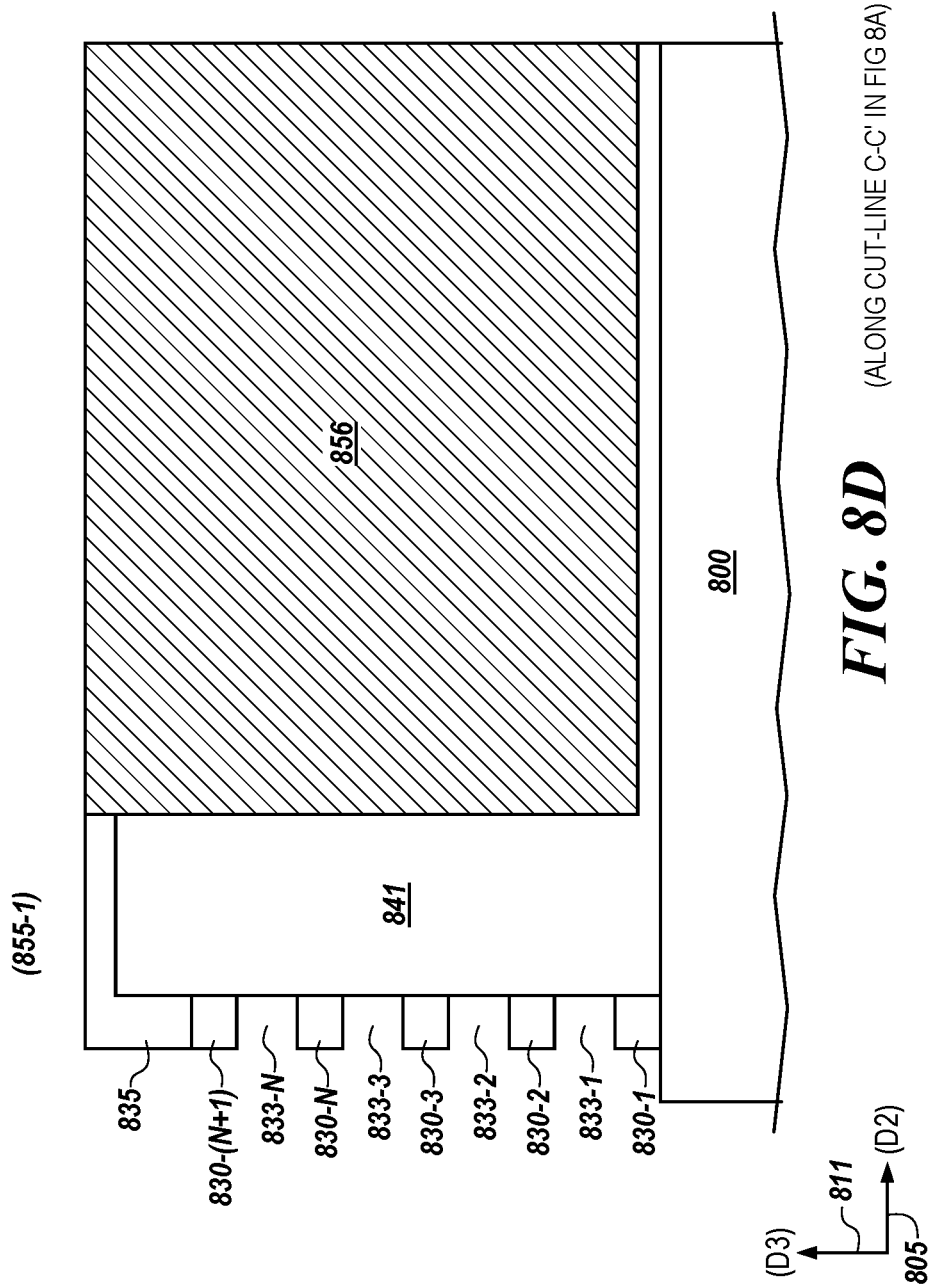
FIG. 8D (ALONG CUT-LINE C-C' IN FIG 8A)

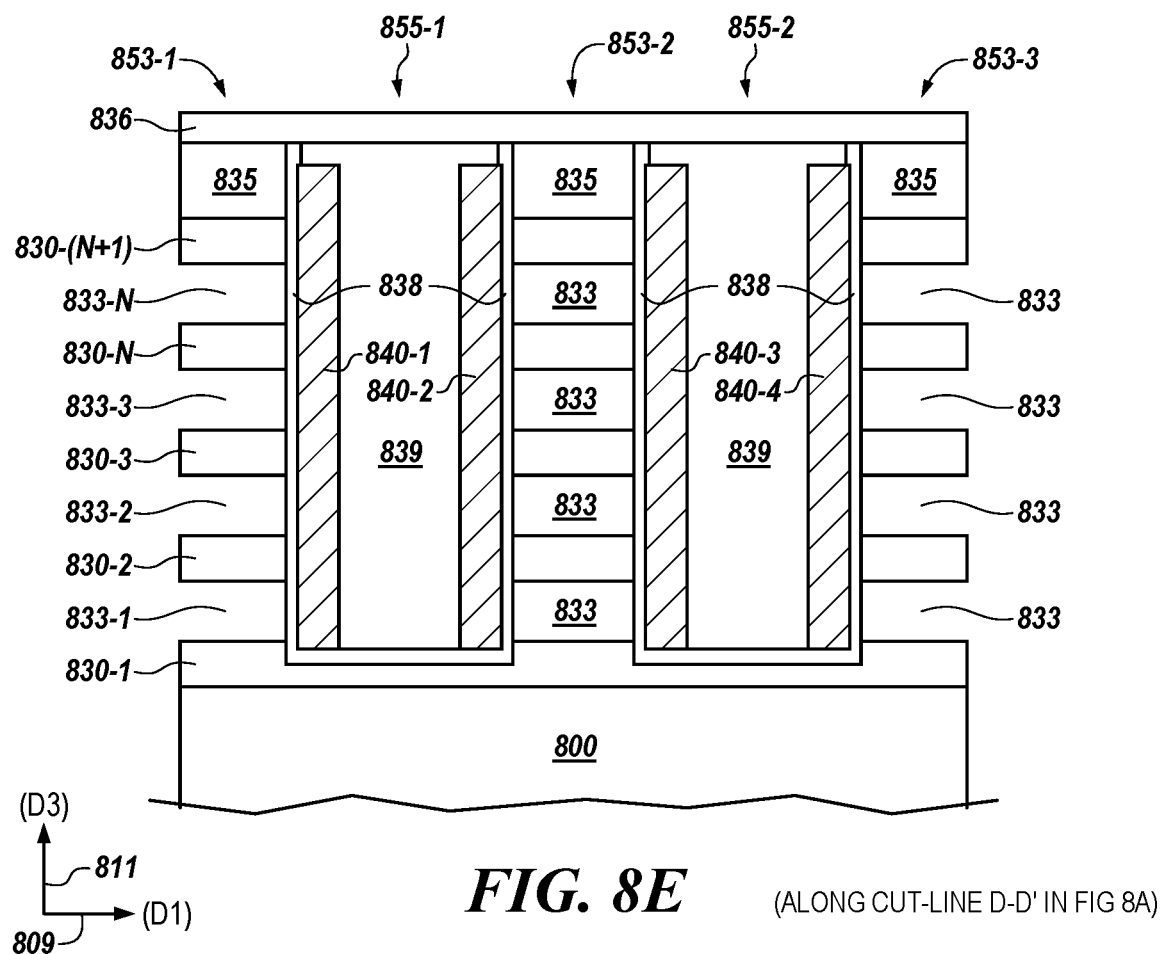
FIG. 8E (ALONG CUT-LINE D-D' IN FIG 8A)

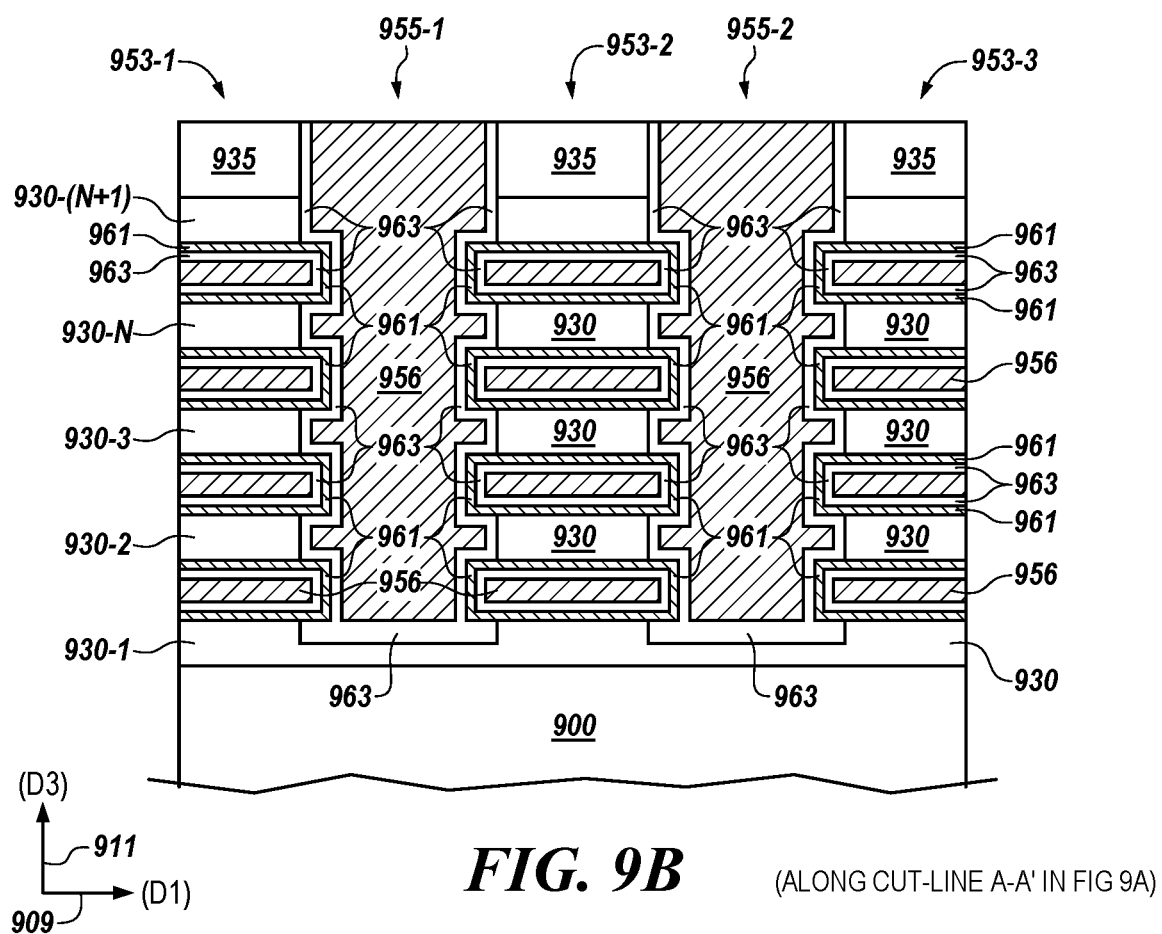
FIG. 9B (ALONG CUT-LINE A-A' IN FIG 9A)

(ALONG CUT-LINE B-B' IN FIG 9A)

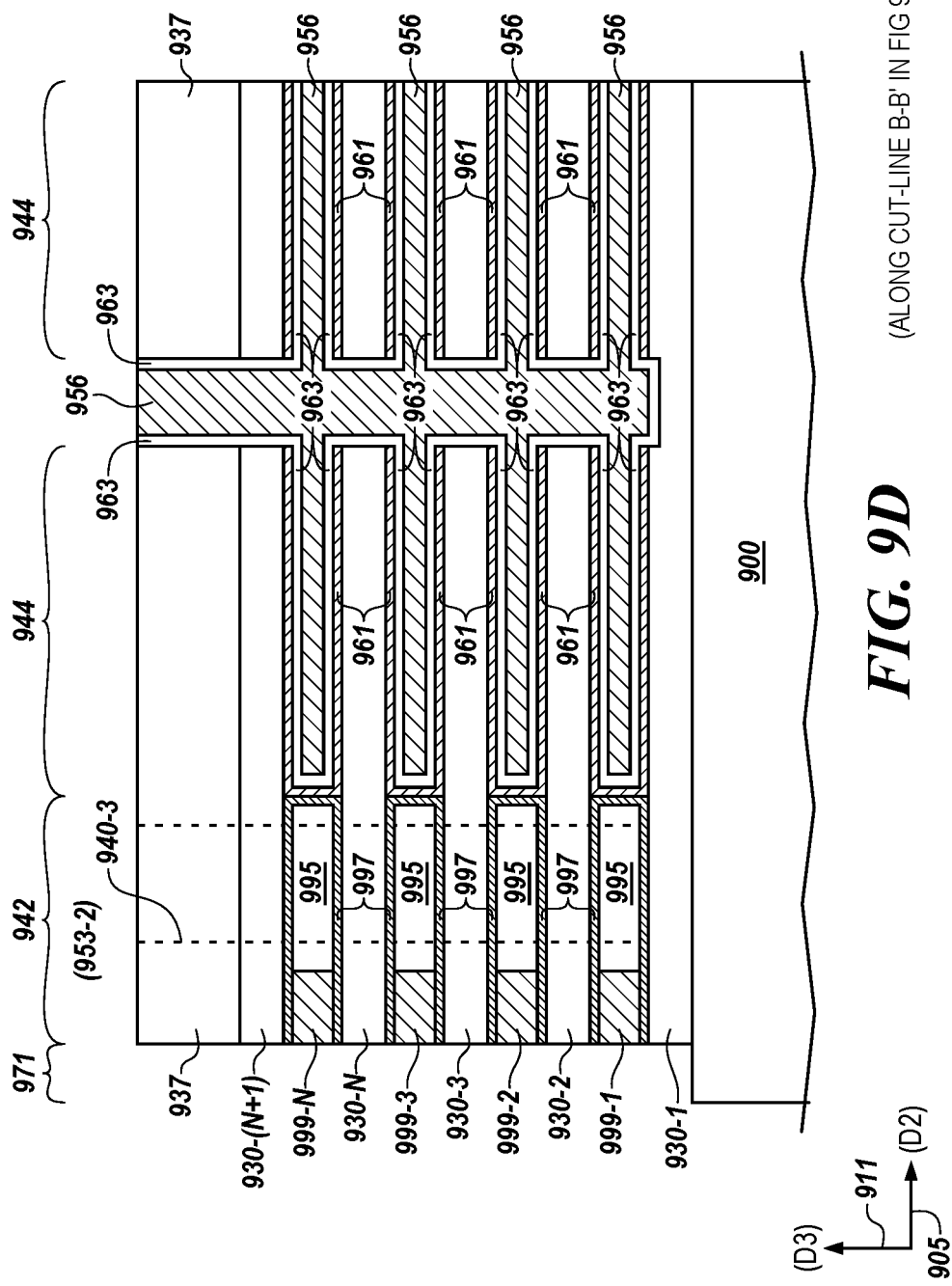
FIG. 9D (ALONG CUT-LINE B-B' IN FIG 9A)

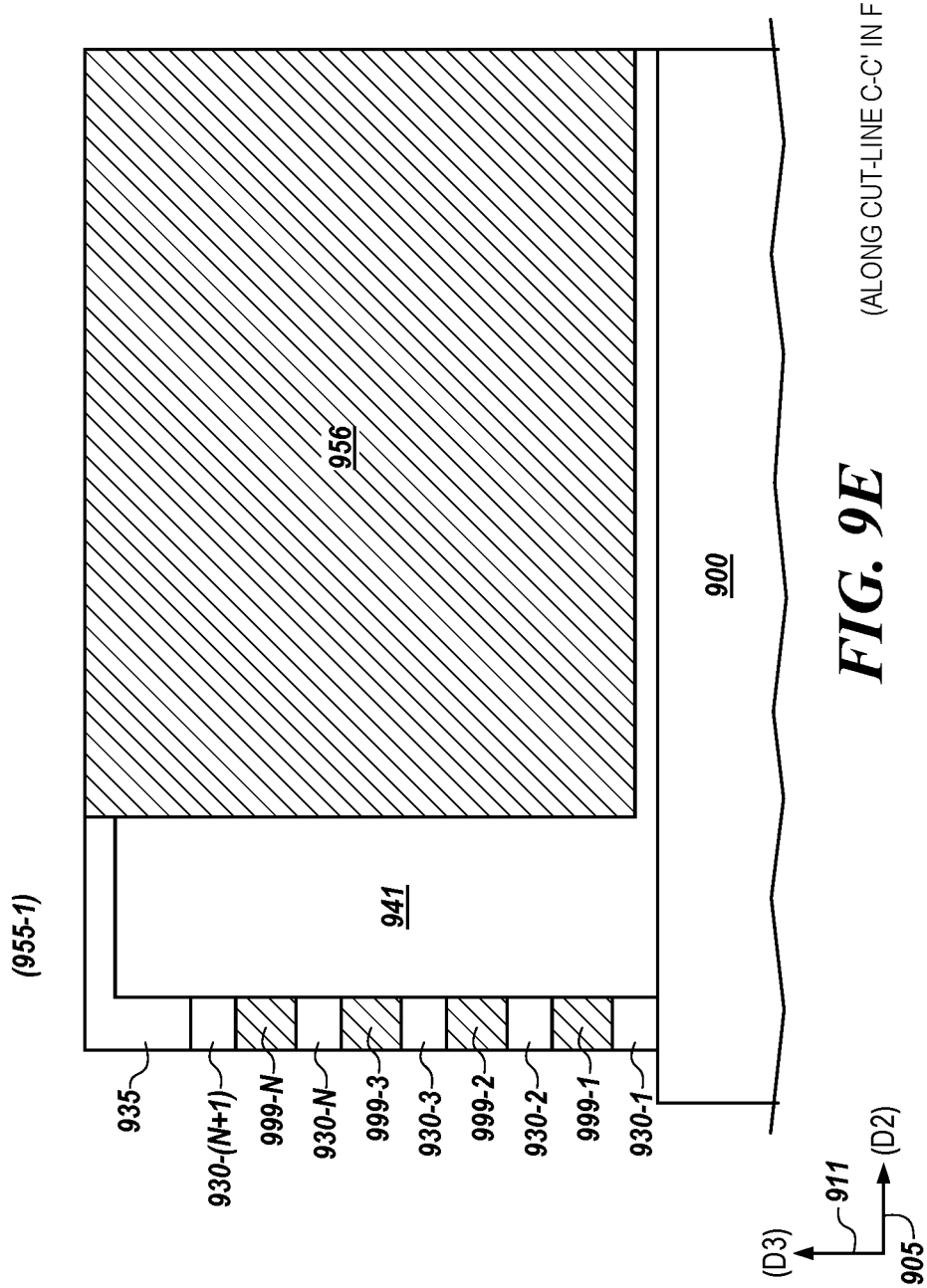

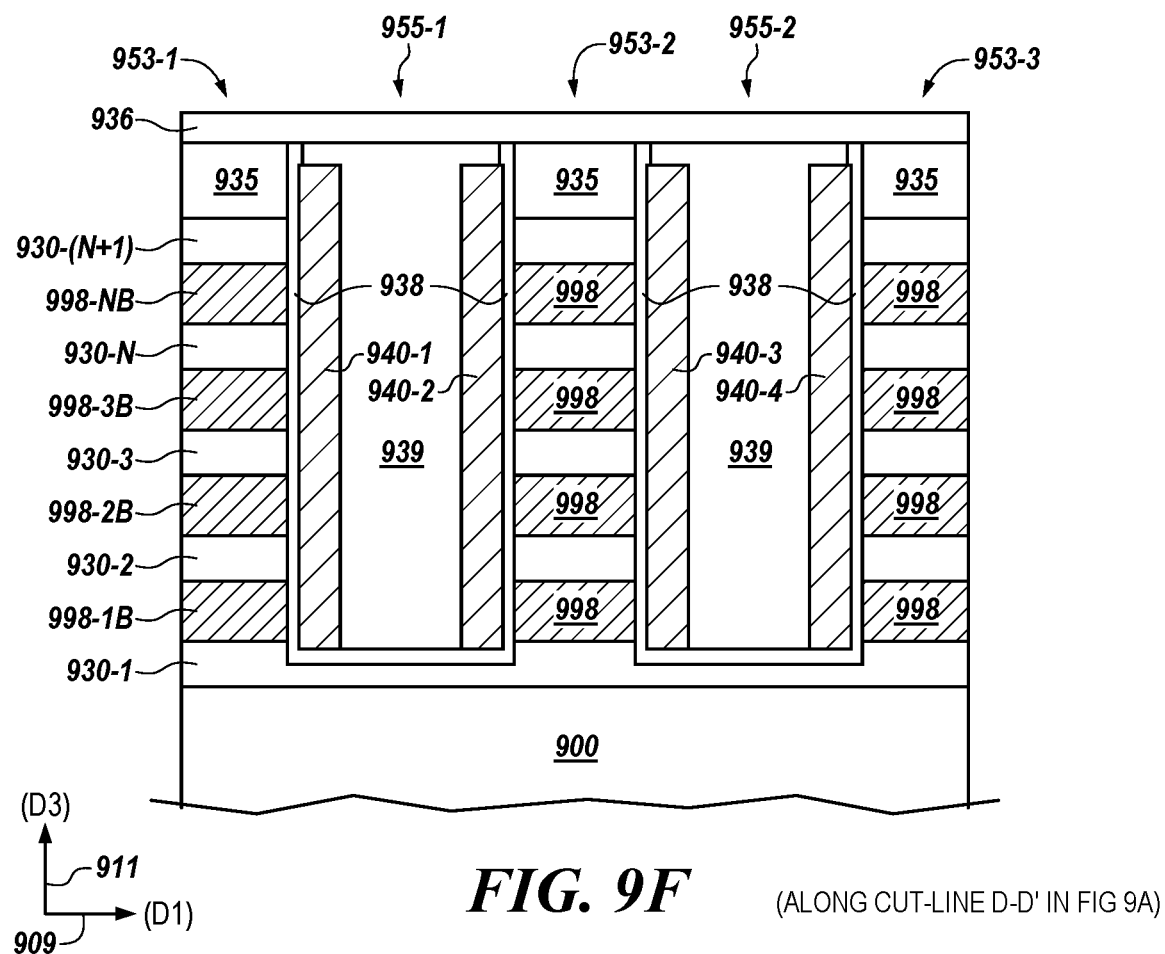
FIG. 9F (ALONG CUT-LINE D-D' IN FIG 9A)

FIG. 13 (ALONG CUT-LINE B-B' IN FIG 9A)

CHANNEL INTEGRATION IN A THREE-NODE ACCESS DEVICE FOR VERTICAL THREE DIMENSIONAL (3D) MEMORY

TECHNICAL FIELD

The present disclosure relates generally to memory devices, and more particularly, to channel integration in a three-node access device for vertical three dimensional (3D) memory.

BACKGROUND

Memory is often implemented in electronic systems, such as computers, cell phones, hand-held devices, etc. There are many different types of memory, including volatile and non-volatile memory. Volatile memory may require power to maintain its data and may include random-access memory (RAM), dynamic random-access memory (DRAM), static random-access memory (SRAM), and synchronous dynamic random-access memory (SDRAM). Non-volatile memory may provide persistent data by retaining stored data when not powered and may include NAND flash memory, NOR flash memory, nitride read only memory (NROM), phase-change memory (e.g., phase-change random access memory), resistive memory (e.g., resistive random-access memory), cross-point memory, ferroelectric random-access memory (FeRAM), or the like.

As design rules shrink, less semiconductor space is available to fabricate memory, including DRAM arrays. A respective memory cell for DRAM may include an access device, e.g., transistor, having a first and a second source/drain regions separated by a channel region. A gate may oppose the channel region and be separated therefrom by a gate dielectric. An access line, such as a word line, is electrically connected to the gate of the DRAM cell. A DRAM cell can include a storage node, such as a capacitor cell, coupled by the access device to a digit line. The access device can be activated (e.g., to select the cell) by an access line coupled to the access transistor. The capacitor can store a charge corresponding to a data value of a respective cell (e.g., a logic "1" or "0").

BRIEF DESCRIPTION OF THE DRAWINGS

FIGS. 5A-5B illustrate an example method, at another stage of a semiconductor fabrication process, for forming arrays of vertically stacked memory cells, having three-node horizontally oriented access devices and vertically oriented access lines, in accordance with a number of embodiments of the present disclosure.

FIGS. 6A to 6E illustrate an example method, at another stage of a semiconductor fabrication process, for forming arrays of vertically stacked memory cells, having three-node, horizontally oriented access devices and vertically oriented access lines, in accordance with a number of embodiments of the present disclosure.

FIGS. 7A to 7E illustrate an example method, at another stage of a semiconductor fabrication process, for forming arrays of vertically stacked memory cells, having three-node, horizontally oriented access devices and vertically oriented access lines, in accordance with a number of embodiments of the present disclosure.

FIGS. 8A to 8E illustrate an example method, at another stage of a semiconductor fabrication process, for forming arrays of vertically stacked memory cells, having three-node, horizontally oriented access devices and vertically oriented access lines, in accordance with a number of embodiments of the present disclosure.

FIGS. 9A to 9F illustrate an example method, at another stage of a semiconductor fabrication process, for forming arrays of vertically stacked memory cells, having three-node, horizontally oriented access devices and vertically oriented access lines, in accordance with a number of embodiments of the present disclosure.

DETAILED DESCRIPTION

Figure 1:
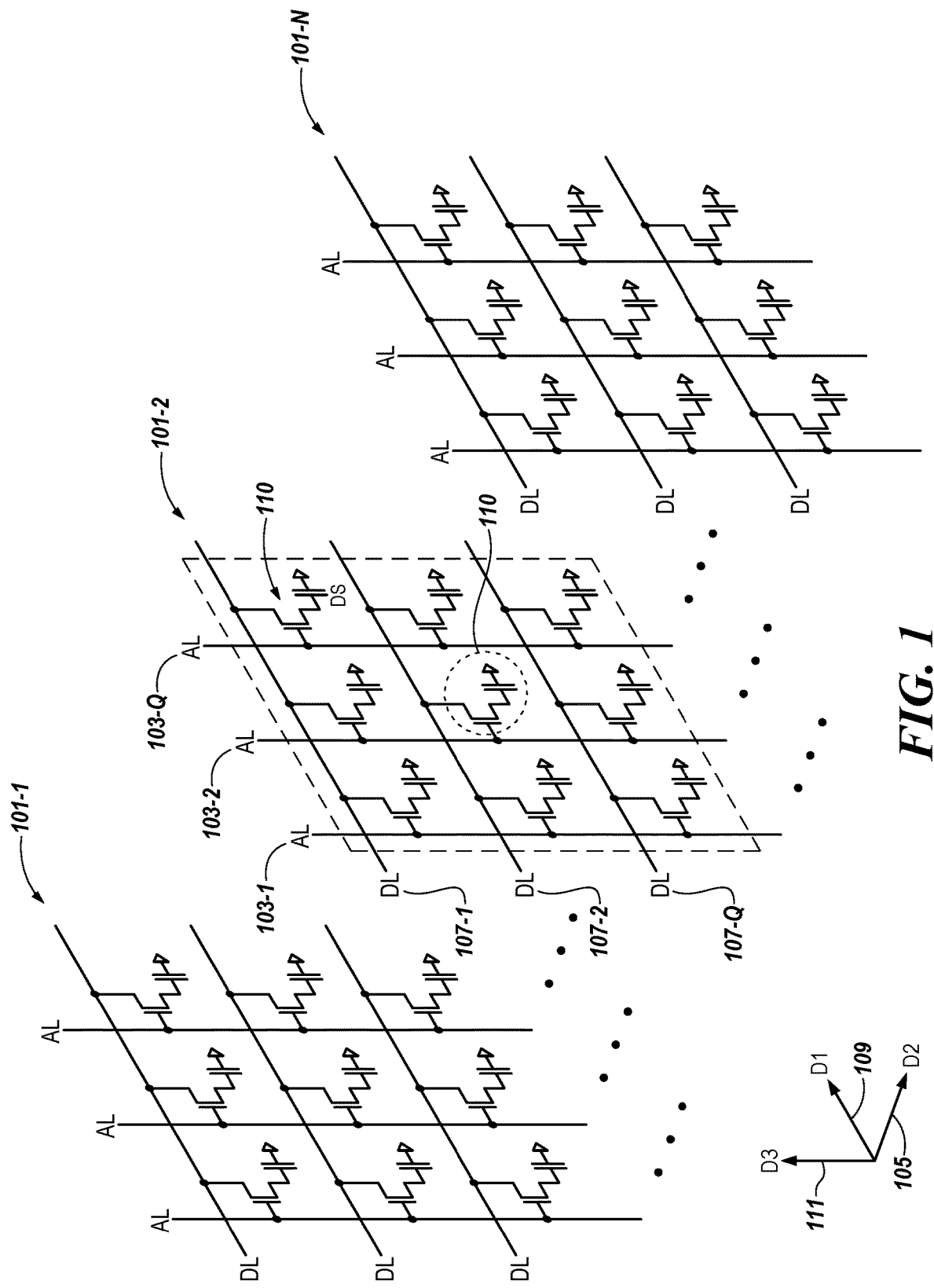
FIG. 1 is a schematic illustration of a vertical three dimensional (3D) memory in accordance a number of embodiments of the present disclosure.

Embodiments of the present disclosure describe a three-node access device for vertical three dimensional (3D) memory. Three-node horizontal access devices are formed without body region contacts. As used herein, three-node is intended to refer to an access device comprising (1) a first source/drain region and (2) a second source/drain region separated by a channel region, and (3) one or more gates(s) opposing the channel region. In the three-node access device, there is no direct, electrical contact from a body contact line to a body region and/or channel of the access device to control the body region or channel of the access device. As a result, semiconductor fabrication process overhead is reduced by not having to form such a body contact.

The three-node horizontal access devices are integrated with vertical access lines and integrated with horizontal digit lines. According to embodiments, the three-node horizontal access devices may be formed with a replacement channel such that the channel region has fewer, e.g., may operate free of, minority carriers thus removing the need to control a body potential to a body region of the access device. Thin film transistor (TFT) access devices using oxide semiconductor materials may exhibit current leakage through the backchannel region of the oxide semiconductor that is most distant from the gate electrode. Material constructions are provided that suppress leakage current in the backchannel region. Advantages to the structure and process described herein can include a lower off-current (Ioff) for the access devices, as compared to silicon based (Si-based) access devices, and/or reduced gate/drain induced leakage (GIDL) for the access devices.

In some embodiments channel and/or source/drain region replacement fabrication steps may be performed after a capacitor cell formation process, thus reducing a thermal budget. The digit line integration may be more easily achieved in the fabrication process since a body contact to a body region of the access device is not used. Additionally, the embodiments described herein may achieve a better lateral scaling path than achieved with doped polysilicon based channel regions due to less channel length and lower source/drain semiconductor fabrication process overhead. A further benefit is the avoidance, e.g., no use of, gas phase doping (GPD) in the formation of the source/drain regions.

The figures herein follow a numbering convention in which the first digit or digits correspond to the figure number of the drawing and the remaining digits identify an element or component in the drawing. Similar elements or components between different figures may be identified by the use of similar digits. For example, reference numeral 104 may reference element "04" in FIG. 1, and a similar element may be referenced as 204 in FIG. 2. Multiple analogous elements within one figure may be referenced with a reference numeral followed by a hyphen and another numeral or a letter. For example, 302-1 may reference element 302-1 in FIGS. 3 and 302-2 may reference element 302-2, which may be analogous to element 302-1. Such analogous elements may be generally referenced without the hyphen and extra numeral or letter. For example, elements 302-1 and 302-2 or other analogous elements may be generally referenced as 302.

FIG. 1 is a block diagram of an apparatus in accordance a number of embodiments of the present disclosure. FIG. 1 illustrates a circuit diagram showing a cell array of a three dimensional (3D) semiconductor memory device according to embodiments of the present disclosure. FIG. 1 illustrates a cell array may have a plurality of sub cell arrays 101-1, 101-2, . . . , 101-N. The sub cell arrays 101-1, 101-2, . . . , 101-N may be arranged along a second direction (D2) 105. Each of the sub cell arrays, e.g., sub cell array 101-2, may include a plurality of access lines 103-1, 103-2, . . . , 103-Q (which also may be referred to a wordlines). Also, each of the sub cell arrays, e.g., sub cell array 101-2, may include a plurality of digit lines 107-1, 107-2, . . . , 107-P (which also may be referred to as bitlines, data lines, or sense lines). In FIG. 1, the digit lines 107-1, 107-2, . . . , 107-P are illustrated extending in a first direction (D1) 109 and the access lines 103-1, 103-2, . . . , 103-Q are illustrated extending in a third direction (D3) 111. According to embodiments, the first direction (D1) 109 and the second direction (D2) 105 may be considered in a horizontal ("X-Y") plane. The third direction (D3) 111 may be considered in a vertical ("Z") plane. Hence, according to embodiments described herein, the access lines 103-1, 103-2, . . . , 103-Q are extending in a vertical direction, e.g., third direction (D3) 111.

A memory cell, e.g., 110, may include an access device, e.g., access transistor, and a storage node located at an intersection of each access line 103-1, 103-2, . . . , 103-Q and each digit line 107-1, 107-2, . . . , 107-P. Memory cells may be written to, or read from, using the access lines 103-1, 103-2, . . . , 103-Q and digit lines 107-1, 107-2, . . . , 107-P. The digit lines 107-1, 107-2, . . . , 107-P may conductively interconnect memory cells along horizontal columns of each sub cell array 101-, 101-2, . . . , 101-N, and the access lines 103-1, 103-2, . . . , 103-Q may conductively interconnect memory cells along vertical rows of each sub cell array 101-, 101-2, . . . , 101-N. One memory cell, e.g. 110, may be located between one access line, e.g., 103-2, and one digit line, e.g., 107-2. Each memory cell may be uniquely addressed through a combination of an access line 103-1, 103-2, . . . , 103-Q and a digit line 107-1, 107-2, . . . , 107-P.

The digit lines 107-1, 107-2, . . . , 107-P may be or include conducting patterns (e.g., metal lines) disposed on and spaced apart from a substrate. The digit lines 107-1, 107-2, . . . , 107-P may extend in a first direction (D1) 109. The digit lines 107-1, 107-2, . . . , 107-P in one sub cell array, e.g., 101-2, may be spaced apart from each other in a vertical direction, e.g., in a third direction (D3) 111.

The access lines 103-1, 103-2, . . . , 103-Q may be or include conductive patterns (e.g., metal lines) extending in a vertical direction with respect to the substrate, e.g., in a third direction (D3) 111. The access lines in one sub cell array, e.g., 101-2, may be spaced apart from each other in the first direction (D1) 109.

A gate of a memory cell, e.g., memory cell 110, may be connected to an access line, e.g., 103-2, and a first conductive node, e.g., first source/drain region, of an access device, e.g., transistor, of the memory cell 110 may be connected to a digit line, e.g., 107-2. Each of the memory cells, e.g., memory cell 110, may be connected to a storage node, e.g., capacitor. A second conductive node, e.g., second source/drain region, of the access device, e.g, transistor, of the memory cell 110 may be connected to the storage node, e.g., capacitor. While first and second source/drain region reference are used herein to denote two separate and distinct source/drain regions, it is not intended that the source/drain region referred to as the "first" and/or "second" source/drain regions have some unique meaning. It is intended only that one of the source/drain regions is connected to a digit line, e.g., 107-2, and the other may be connected to a storage node.

Figure 2:
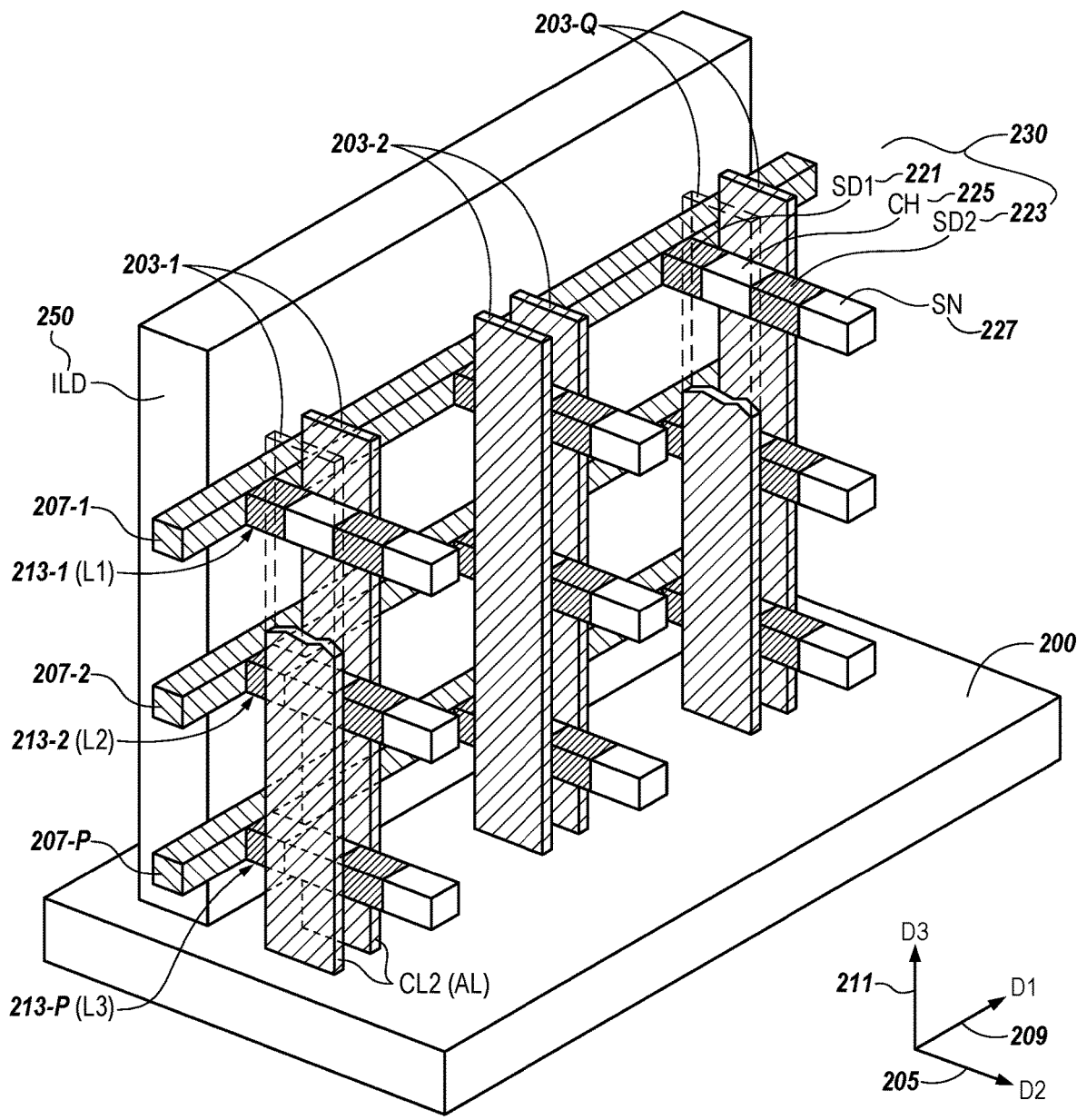
FIG. 2 is a perspective view illustrating a portion of a three-node access device in a vertical three dimensional (3D) memory array in accordance with a number of embodiments of the present disclosure.
Figure 3:
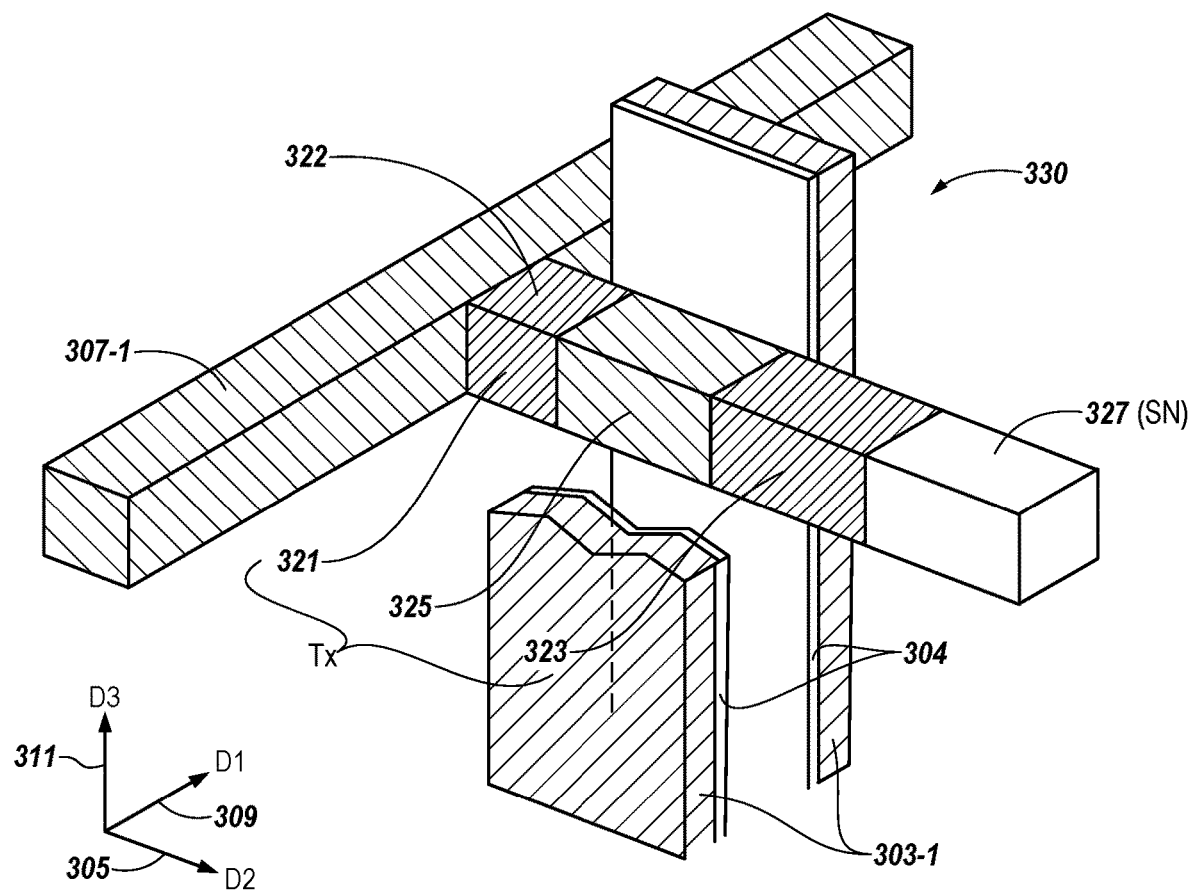
FIG. 3 is a perspective view illustrating a portion of a three-node access device in a vertical three dimensional (3D) memory cell in accordance with a number of embodiments of the present disclosure.

FIG. 2 illustrates a perspective view showing a three dimensional (3D) semiconductor memory device, e.g., a portion of a sub cell array 101-2 shown in FIG. 1 as a vertically oriented stack of memory cells in an array, according to some embodiments of the present disclosure. FIG. 3 illustrates a perspective view showing unit cell, e.g., memory cell 110 shown in FIG. 1, of the 3D semiconductor memory device shown in FIG. 2.

As shown in FIG. 2, a substrate 200 may have formed thereon one of the plurality of sub cell arrays, e.g., 101-2, described in connection with FIG. 1. For example, the substrate 200 may be or include a silicon substrate, a germanium substrate, or a silicon-germanium substrate, etc. Embodiments, however, are not limited to these examples.

As shown in the example embodiment of FIG. 2, the substrate 200 may have fabricated thereon a vertically oriented stack of memory cells, e.g., memory cell 110 in FIG. 1, extending in a vertical direction, e.g., third direction (D3) 111. According to some embodiments the vertically oriented stack of memory cells may be fabricated such that each memory cell, e.g., memory cell 110 in FIG. 1, is formed on plurality of vertical levels, e.g., a first level (L1), a second level (L2), and a third level (L3). The repeating, vertical levels, L1, L2, and L3, may be arranged, e.g., "stacked", a vertical direction, e.g., third direction (D3) 111 shown in FIG. 1. Each of the repeating, vertical levels, L1, L2, and L3 may include a plurality of discrete components, e.g., regions, to the laterally oriented access devices 230, e.g., transistors, and storage nodes, e.g., capacitors, including access line 103-1, 103-2, . . . , 103-Q connections and digit line 107-1, 107-2, . . . , 107-P connections. The plurality of discrete components to the horizontally oriented, three-node access devices, e.g., transistors 110 in FIG. 1, may be formed in a plurality of iterations of vertically, repeating layers within each level, as described in more detail below in connection with FIG. 4 et. seq., and may extend horizontally in the second direction (D2) 205, analogous to second direction (D2) 105 shown in FIG. 1.

The plurality of discrete components to the horizontally oriented three-node access devices 230, e.g., transistors, may include a first source/drain region 221 and a second source/drain region 223 separated by a channel region 225, extending laterally in the second direction (D2) 205. In some embodiments, the channel region 225 may include silicon, germanium, silicon-germanium, and/or indium gallium zinc oxide (IGZO). In some embodiments, the first and the second source/drain regions, 221 and 223, can include an n-type dopant region, e.g., semiconductor material, formed adjacent to a p-type doped channel region, e.g., semiconductor material, of the access device to form an n-type conductivity transistor. In some embodiments, the first and the second source/drain regions, 221 and 223, may include a p-type conductivity, e.g., doped semiconductor material, formed adjacent to an n-type conductivity channel region, e.g., doped semiconductor material, of the access device to form a p-type conductivity transistor. By way of example, and not by way of limitation, the n-type dopant may include Phosphorous (P) atoms and the p-type dopant may include atoms of Boron (B) formed in an oppositely doped body region of polysilicon semiconductor material. Embodiments, however, are not limited to these examples.

The storage node 227, e.g., capacitor, may be connected to one respective end of the access device. As shown in FIG. 2, the storage node 227, e.g., capacitor may be connected to the second source/drain region 223 of the access device. The storage node may be or include memory elements capable of storing data. Each of the storage nodes may be a memory element using one of a capacitor, a magnetic tunnel junction pattern, and/or a variable resistance body which includes a phase change material, etc. Embodiments, however, are not limited to these examples. In some embodiments, the storage node associated with each access device of a unit cell, e.g., memory cell 110 in FIG. 1, may similarly extend in the second direction (D2) 205, analogous to second direction (D2) 105 shown in FIG. 1.

As shown in FIG. 2 a plurality of horizontally oriented digit lines 207-1, 207-2, . . . , 207-P extend in the first direction (D1) 209, analogous to the first direction (D1) 109 in FIG. 1. The plurality of horizontally oriented digit lines 207-1, 207-2, . . . , 207-P may be analogous to the digit lines 107-1, 107-2, . . . , 107-P shown in FIG. 1. The plurality of horizontally oriented digit lines 207-1, 207-2, . . . , 207-P may be arranged, e.g., "stacked", along the third direction (D3) 211. The plurality of horizontally oriented digit lines 207-1, 207-2, . . . , 207-P may include a conductive material.

For example, the conductive material may include one or more of a doped semiconductor, e.g., doped silicon, doped germanium, etc., a conductive metal nitride, e.g., titanium nitride, tantalum nitride, etc., a metal, e.g., tungsten (W), titanium (Ti), tantalum (Ta), etc., and/or a metal-semiconductor compound, e.g., tungsten silicide, cobalt silicide, titanium silicide, etc. Embodiments, however, are not limited to these examples.

Among each of the vertical levels, (L1) 213-1, (L2) 213-2, and (L3) 213-M, the horizontally oriented memory cells, e.g., memory cell 110 in FIG. 1, may be spaced apart from one another horizontally in the first direction (D1) 209. However, as described in more detail below in connection with FIG. 4 et. seq., the plurality of discrete components to the laterally oriented access devices 230, e.g., first source/drain region 221 and second source/drain region 223 separated by a channel region 225, extending laterally in the second direction (D2) 205, and the plurality of horizontally oriented digit lines 207-1, 207-2, . . . , 207-P extending laterally in the first direction (D1) 209, may be formed within different vertical layers within each level. For example, the plurality of horizontally oriented digit lines 207-1, 207-2, . . . , 207-P, extending in the first direction (D1) 209, may be disposed on, and in electrical contact with, top surfaces of first source/drain regions 221 and orthogonal to laterally oriented access devices 230, e.g., transistors, extending in laterally in the second direction (D2) 205. In some embodiments, the plurality of horizontally oriented digit lines 207-1, 207-2, . . . , 207-P, extending in the first direction (D1) 209 are formed in a higher vertical layer, farther from the substrate 200, within a level, e.g., within level (L1), than a layer in which the discrete components, e.g., first source/drain region 221 and second source/drain region 223 separated by a channel region 225, of the laterally oriented access device are formed. In some embodiments, the plurality of horizontally oriented digit lines 207-1, 207-2, . . . , 207-P, extending in the first direction (D1) 209, may be connected to the top surfaces of the first source/drain regions 221 directly and/or through additional contacts including metal silicides.

As shown in the example embodiment of FIG. 2, the access lines, 203-1, 203-2, . . . , 203-Q, extend in a vertical direction with respect to the substrate 200, e.g., in a third direction (D3) 211. Further, as shown in FIG. 2, the access lines, 203-1, 203-2, . . . , 203-Q, in one sub cell array, e.g., sub cell array 101-2 in FIG. 1, may be spaced apart from each other in the first direction (D1) 209. The access lines, 203-1, 203-2, . . . , 203-Q, may be provided, extending vertically relative to the substrate 200 in the third direction (D3) 211 between a pair of the horizontally oriented, three-node access devices 230, e.g., transistors, extending laterally in the second direction (D2) 205, but adjacent to each other on a level, e.g., first level (L1), in the first direction (D1) 209. Each of the access lines, 203-1, 203-2, . . . , 203-Q, may vertically extend, in the third direction (D3), on sidewalls of respective ones of the plurality of horizontally oriented, three-node access devices 230, e.g., transistors, that are vertically stacked.

For example, and as shown in more detail in FIG. 3, a first one of the vertically extending access lines, e.g., 203-1, may be adjacent a sidewall of a channel region 225 to a first one of the horizontally oriented, three-node access devices 230, e.g., transistors, in the first level (L1) 213-1, a sidewall of a channel region 225 of a first one of the horizontally oriented, three-node access devices 230, e.g., transistors, in the second level (L2) 213-2, and a sidewall of a channel region 225 a first one of the horizontally oriented, three-node access devices 230, e.g., transistors, in the third level (L3) 213-M, etc. Similarly, a second one of the vertically extending access lines, e.g., 203-2, may be adjacent a sidewall to a channel region 225 of a second one of the horizontally oriented, three-node access devices 230, e.g., transistors, in the first level (L1) 213-1, spaced apart from the first one of horizontally oriented, three-node access devices 230, e.g., transistors, in the first level (L1) 213-1 in the first direction (D1) 209. And the second one of the vertically extending access lines, e.g., 203-2, may be adjacent a sidewall of a channel region 225 of a second one of the horizontally oriented, three-node access devices 230, e.g., transistors, in the second level (L2) 213-2, and a sidewall of a channel region 225 of a second one of the horizontally oriented, three-node access devices 230, e.g., transistors, in the third level (L3) 213-M, etc. Embodiments are not limited to a particular number of levels.

The vertically extending access lines, 203-1, 203-2, . . . , 203-Q, may include a conductive material, such as, for example, one of a doped semiconductor material, a conductive metal nitride, metal, and/or a metal-semiconductor compound. The access lines, 203-1, 203-2, . . . , 203-Q, may correspond to wordlines (WL) described in connection with FIG. 1.

As shown in the example embodiment of FIG. 2, an insulating layer dielectric (ILD) 250 may be formed extending in the first direction (D1) 209 along an end surface of the horizontally oriented, three-node access devices 230, e.g., transistors, in each level (L1) 213-1, (L2) 213-2, and (L3) 213-M above the substrate 200. The ILD 250 may isolate and separate the arrays of vertically stacked memory cells, e.g., 101-1, 101-2, . . . , 101-N in FIG. 1, along the second direction (D2) 205. The ILD 250 may include an insulating material, e.g., dielectric material, such as, for example, one of an oxide material, silicon oxide ($SiO_2$) material, silicon nitride (SiN) material, silicon oxynitride material, and/or combination thereof, etc.

Although not shown in FIG. 2, an insulating material may fill other spaces in the vertically stacked array of memory cells. For example, the insulating material may include one or more of a silicon oxide material, a silicon nitride material, and/or a silicon oxynitride material, etc. Embodiments, however, are not limited to these examples.

FIG. 3 illustrates in more detail a unit cell, e.g., memory cell 110 in FIG. 1, of the vertically stacked array of memory cells, e.g., within a sub cell array 101-2 in FIG. 1, according to some embodiments of the present disclosure. As shown in FIG. 3, the first and the second source/drain regions, 321 and 323, may be impurity doped regions to the horizontally oriented, three-node access devices 330, e.g., transistors. The first and the second source/drain regions, 321 and 323, may also comprise a metal, and/or metal composite materials containing ruthenium (Ru), molybdenum (Mo), nickel (Ni), titanium (Ti), copper (Cu), a highly doped degenerate semiconductor material, and/or at least one of indium oxide ($In_2O_3$), or indium tin oxide ($In_{2-x}Sn_xO_3$), formed using an atomic layer deposition process, etc. Embodiments, however, are not limited to these examples. As used herein, a degenerate semiconductor material is intended to mean a semiconductor material, such as polysilicon, containing a high level of doping with significant interaction between dopants, e.g., phosphorous (P), boron (B), etc. Non-degenerate semiconductors, by contrast, contain moderate levels of doping, where the dopant atoms are well separated from each other in the semiconductor host lattice with negligible interaction. The first and the second source/drain regions, 321 and 323, may be analogous to the first and the second source/drain regions 221 and 223 shown in FIG. 2.

The first and the second source/drain regions may be separated by a channel region 325, e.g., channel region, of the horizontally oriented, three-node access devices 330, e.g., transistors. The channel may be a low-doped (p-) polysilicon material. In some embodiments, the channel 325 may be a low-doped (p-) poly-germanium (Ge) material. In some embodiments, the channel 325 may be a low doped (p-) poly-silicon-germanium (poly-SiGe) material. However, in some embodiments the channel 325 may be comprised of a semiconductor oxide (also referred to herein as an "oxide semiconductor" or "oxide semiconductor material"). The semiconductor oxide may comprise any suitable composition; and in some embodiments may include one or more of indium, zinc, tin and gallium. Examples of oxide semiconductor materials and/or compositions, as used herein, including one or more of indium, zinc, tin and gallium may include such materials as $ZnO_x$, $InO_x$, $SnO_2$, $Zn_xO_yN$, $Mg_xZn_yO_z$, $In_xZn_yO_z$, $In_xZn_yO_z$, $In_xGa_yZn_zO_a$, $In_xGa_ySi_zO_a$, $Zr_xIn_yZn_zO_a$, $Hf_xIn_yZn_zO_a$, $Sn_xIn_yZn_zO_a$, $Al_xSn_yIn_zZn_aO_b$, $Si_xIn_yZn_zO_a$, $Zn_xSn_yO_z$, $Al_xZn_ySn_zO_a$, $Ga_xZn_ySn_zO_a$, and $Zr_xZn_ySn_zO_a$.

In additional embodiments, the channel 325 may be comprised of a two-dimensional (2D) material. The 2D material may comprise any suitable composition; and in some embodiments may include one or more of a transition metal dichalcogenide, including molybdenum disulfide ($MoS_2$), molybdenum diselenide ($MoSe_2$), molybdenum ditelluride ($MoTe_2$), tungsten sulfide ($WS_2$), and tungsten selenide ($WSe_2$). Embodiments, however, are not limited to these examples.

In some embodiments the channel 325 may comprise a composite material such as an indium gallium zinc oxide ($In_2Ga_2ZnO_7$) material (also referred to herein as "IGZO"). In some embodiments, the composite IGZO material is a multi-layer $I_2G_2ZnO_7$ channel that is indium (In) rich in a first layer, closest to a surface of the channel opposing a gate dielectric, relative to the multiple layers. In some embodiments, the composite IGZO material is a multi-layer $I_2G_2ZnO_7$ channel that is gallium (Ga) rich in an outer layer, farthest from a surface of the channel opposing a gate dielectric, relative to the multiple layers. And, in some embodiments, the composite IGZO material is a multi-layer $I_2G_2ZnO_7$ channel that is zinc (Zn) rich in an outer layer, farthest from a surface of the channel opposing a gate dielectric, relative to the multiple layers, etc. Embodiments, however, are not limited to these examples.

A digit line, e.g., 307-1, analogous to the digit lines 207-1, 207-2, . . . , 207-P in FIGS. 2 and 107-1, 107-2, . . . , 107-P shown in FIG. 1, may be formed in electrical contact with the first source/drain region 321. As shown in the example embodiment of FIG. 3, an access line, e.g., 303-1, analogous to the access lines 203-1, 203-2, . . . , 203-Q in FIGS. 2 and 103-1, 103-2, . . . , 103-Q in FIG. 1, may be vertically extending in the third direction (D3) 311 adjacent sidewall of the channel region 325 of the horizontally oriented, three-node access devices 330, e.g., transistors horizontally conducting between the first and the second source/drain regions 321 and 323 along the second direction (D2) 305. A gate dielectric material 304 may be interposed between the access line 303-1 (a portion thereof forming a gate to the horizontally oriented, three-node access devices 330, e.g., transistors) and the channel region 325. The gate dielectric material 304 may include, for example, a high-k dielectric material, a silicon oxide material, a silicon nitride material, a silicon oxynitride material, etc., or a combination thereof.

Embodiments are not so limited. For example, in high-k dielectric material examples the gate dielectric material 304 may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobite, etc.

Figure 4:
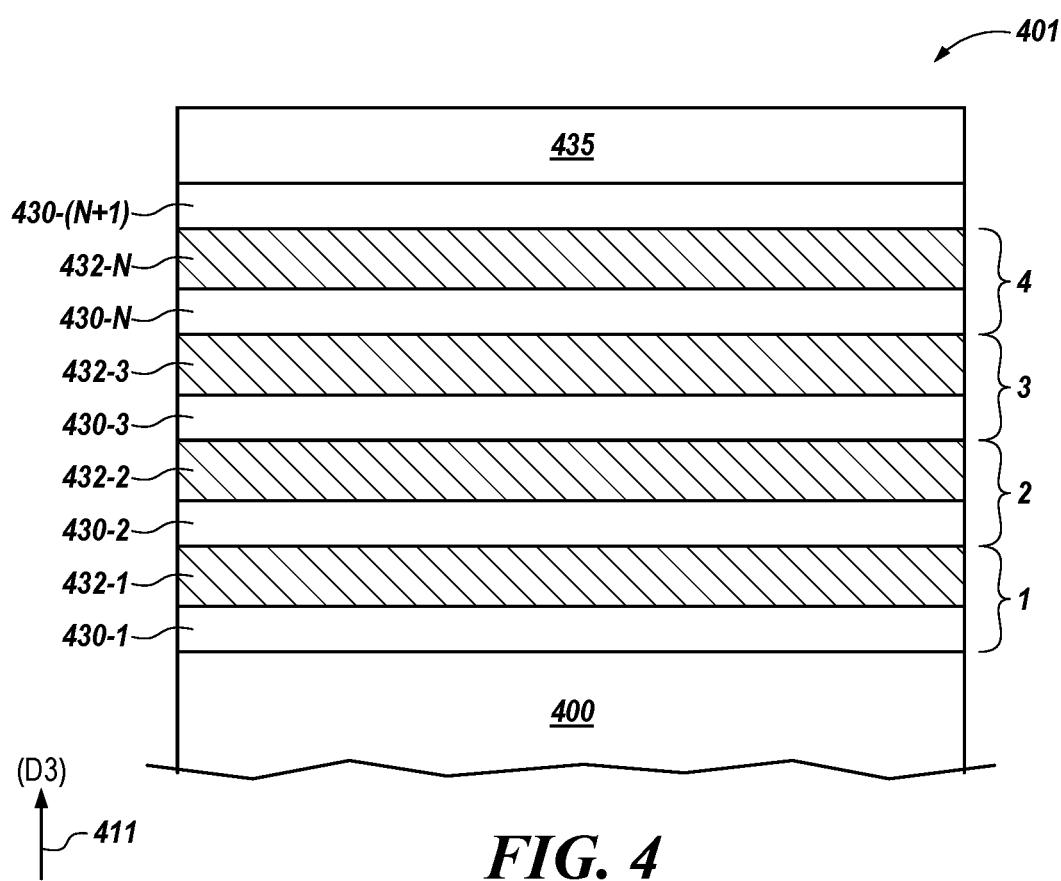
FIG. 4 illustrates an example method for forming arrays of vertically stacked memory cells, at one stage of a semiconductor fabrication process, to form three-node access devices in accordance with a number of embodiments of the present disclosure.

FIG. 4 illustrates an example method, at one stage of a semiconductor fabrication process, for forming arrays of vertically stacked memory cells, having horizontally oriented access devices and vertically oriented access lines, such as illustrated in FIGS. 1-3, and in accordance with a number of embodiments of the present disclosure. In the example embodiment shown in the example of FIG. 4, the method comprises depositing alternating layers of a dielectric material, 430-1, 430-2, ..., 430-N (also referred to independently and/or collectively herein as "430"), and a sacrificial material, 432-1, 432-2, ..., 432-N (also referred to independently and/or collectively as "432"), in repeating iterations to form a vertical stack 401 on a working surface of a semiconductor substrate 400. In one embodiment, the dielectric material 430 can be deposited to have a thickness, e.g., vertical height in the third direction (D3), in a range of twenty (20) nanometers (nm) to sixty (60) nm. In one embodiment, the sacrificial material 432 can be deposited to have a thickness, e.g., vertical height, in a range of twenty (20) nm to one hundred (100) nm. Embodiments, however, are not limited to these examples. In one example, the sacrificial material, 432-1, 432-2, ..., 432-N, can comprise a sacrificial semiconductor material such as polycrystalline silicon (Si), or even an oxide-based semiconductor composition. While the discussion herein will refer to a sacrificial semiconductor material example, embodiments are not limited to this example. It is intended that the sacrificial material may be selectively etched relative to the alternating layer of dielectric material, 430-1, 430-2, ..., 430-N.

As shown in FIG. 4, a vertical direction 411 is illustrated as a third direction (D3), e.g., z-direction in an x-y-z coordinate system, analogous to the third direction (D3), among first, second and third directions, shown in FIGS. 1-3. In the example of FIG. 4, four tiers, numbered 1, 2, 3, and 4, of the repeating iterations of the vertical stack 401 are shown. Embodiments, however, are not limited to this example and more or fewer repeating iterations may be included. A photolithographic hard mask (HM) layer 435 may be deposited as a top layer on the repeating iterations of the vertical stack 401.

In some embodiments, the dielectric material, 430-1, 430-2, ..., 430-N, may be an interlayer dielectric (ILD). By way of example, and not by way of limitation, the dielectric material, 430-1, 430-2, ..., 430-N, may comprise a silicon dioxide ($SiO_2$) material. In another example the dielectric material, 430-1, 430-2, ..., 430-N, may comprise a silicon nitride ($Si_3N_4$) material (also referred to herein a "SiN"). In another example the dielectric material, 430-1, 430-2, ..., 430-N, may comprise a silicon oxy-carbide ($SiO_xC_y$) material (also referred to herein as "SiOC"). In another example the dielectric material, 430-1, 430-2, ..., 430-N, may include silicon oxy-nitride ($SiO_xN_y$) material (also referred to herein as "SiON"), and/or combinations thereof. Embodiments are not limited to these examples. In some embodiments the sacrificial semiconductor material, 432-1, 432-2, ..., 432-N, may comprise a silicon (Si) material in a polycrystalline and/or amorphous state. In another example the sacrificial semiconductor material, 432-1, 432-2, ..., 432-N, may comprise a silicon nitride (SiN) material. Embodiments, however, are not limited to these examples.

The repeating iterations of alternating dielectric material, 430-1, 430-2, ..., 430-N, layers and sacrificial semiconductor material, 432-1, 432-2, ..., 432-N, layers may be deposited according to a semiconductor fabrication process such as chemical vapor deposition (CVD) in a semiconductor fabrication apparatus. Embodiments, however, are not limited to this example and other suitable semiconductor fabrication techniques may be used to deposit the alternating layers of a dielectric material, 430-1, 430-2, ..., 430-N, and a sacrificial semiconductor material, 432-1, 432-2, ..., 432-N, in repeating iterations to form a vertical stack 401, as shown in FIG. 4.

Figure 5A:
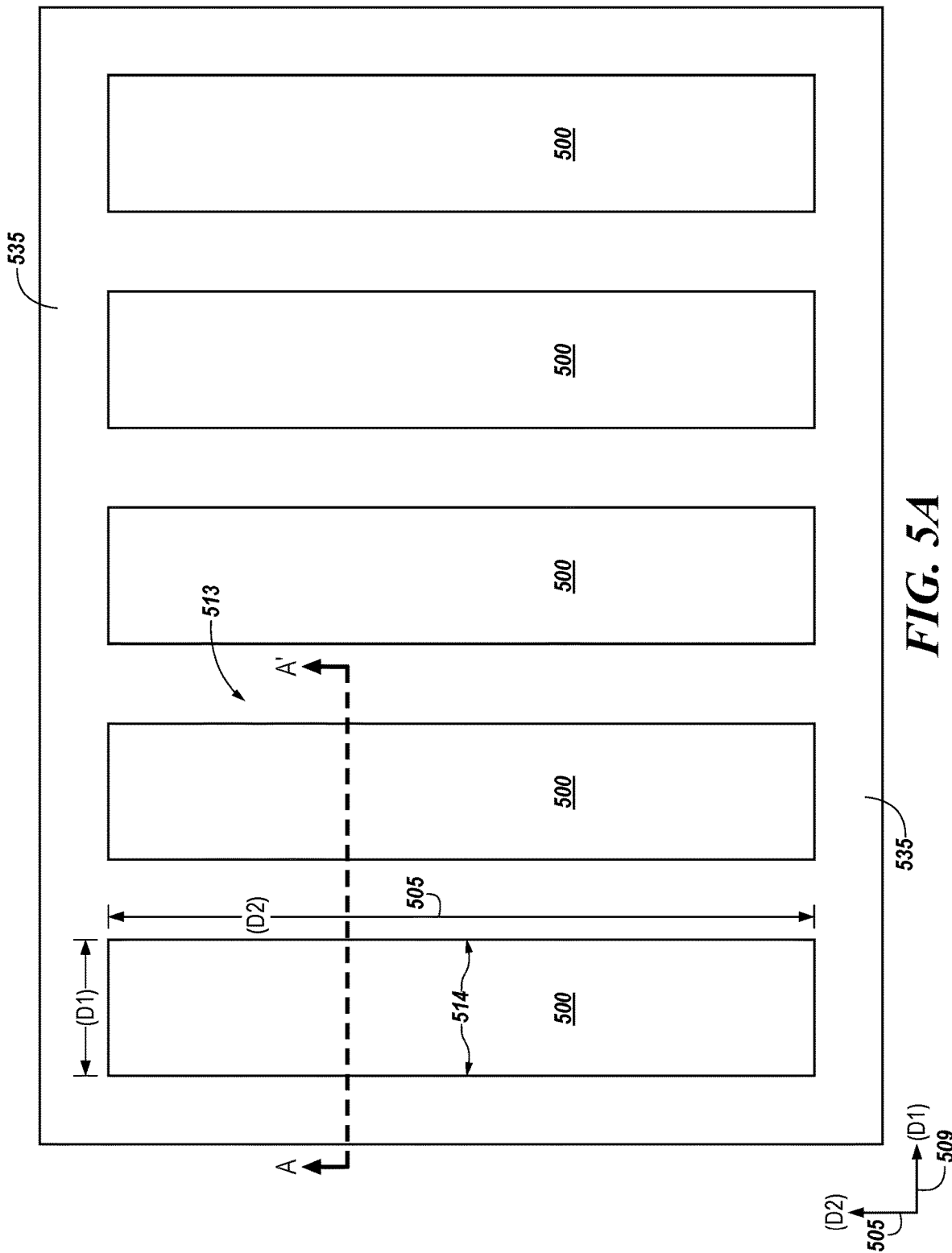

FIG. 5A illustrates an example method, at another stage of a semiconductor fabrication process, for forming arrays of vertically stacked memory cells, having horizontally oriented access devices and vertically oriented access lines, such as illustrated in FIGS. 1-3, and in accordance with a number of embodiments of the present disclosure. FIG. 5A illustrates a top down view of a semiconductor structure, at a particular point in time, in a semiconductor fabrication process, according to one or more embodiments. In the example embodiment shown in the example of FIG. 5A, the method comprises using an etchant process to form a plurality of first vertical openings 500, having a first horizontal direction (D1) 509 and a second horizontal direction (D2) 505, through the vertical stack to the substrate. In one example, as shown in FIG. 5A, the plurality of first vertical openings 500 are extending predominantly in the second horizontal direction (D2) 505 and may form elongated vertical, pillar columns 513 with sidewalls 514 in the vertical stack. The plurality of first vertical openings 500 may be formed using photolithographic techniques to pattern a photolithographic mask 535, e.g., to form a hard mask (HM), on the vertical stack prior to etching the plurality of first vertical openings 500.

FIG. 5B is a cross sectional view, taken along cut-line A-A' in FIG. 5A, showing another view of the semiconductor structure at a particular time in the semiconductor fabrication process. FIG. 5B illustrates that a conductive material, 540-1, 540-2, ..., 540-4, may be formed on a gate dielectric material 538 in the plurality of first vertical openings 500. By way of example and not by way of limitation, a gate dielectric material 538 may be conformally deposited in the plurality of first vertical openings 500 using a chemical vapor deposition (CVD) process, plasma enhanced CVD (PECVD), atomic layer deposition (ALD), or other suitable deposition process, to cover a bottom surface and the vertical sidewalls of the plurality of first vertical openings. The gate dielectric 538 may be deposited to a particular thickness (t1) as suited to a particular design rule, e.g., a gate dielectric thickness of approximately 10 nanometers (nm). Embodiments, however, are not limited to this example. By way of example, and not by way of limitation, the gate dielectric 538 may comprise a silicon dioxide ($SiO_2$) material, aluminum oxide ($Al_2O_3$) material, high dielectric constant (k), e.g, high-k, dielectric material, and/or combinations thereof as also described in FIG. 3.

Further, as shown in FIG. 5B, a conductive material, 540-1, 540-2, ..., 540-4, may be conformally deposited in the plurality of first vertical openings 500 on a surface of the gate dielectric material 538. By way of example, and not by way of limitation, the conductive material, 540-1, 540-2, ..., 540-4, may be conformally deposited in the plurality of first vertical openings 500 on a surface of the gate dielectric material 538 using a chemical vapor deposition process (CVD), plasma enhanced CVD (PECVD), atomic layer deposition (ALD), or other suitable deposition process, to cover a bottom surface and the vertical sidewalls of the plurality of first vertical openings over the gate dielectric 538. The conductive material, 540-1, 540-2, . . . , 540-4, may be conformally deposited to a particular thickness (t2) to form vertically oriented access lines, such as shown as access lines 103-1, 103-2, . . . , 103-Q (which also may be referred to a wordlines) shown in FIG. 1, et. seq., and as suited to a particular design rule. For example, the conductive material, 540-1, 540-2, . . . , 540-4, may be conformally deposited to a thickness of approximately 20 nanometers (nm). Embodiments, however, are not limited to this example. By way of example, and not by way of limitation, the conductive material, 540-1, 540-2, . . . , 540-4, may be comprise a metal such as tungsten (W), metal composition, titanium nitride (TiN), doped polysilicon, and/or some other combination thereof as also described in FIG. 3.

As shown in FIG. 5B, the conductive material, 540-1, 540-2, . . . , 540-4, may be recessed back to remain only along the vertical sidewalls of the elongated vertical, pillar columns, now shown as 542-1, 542-2, and 542-3 in the cross-sectional view of FIG. 5B. The plurality of separate, vertical access lines formed from the conductive material, 540-1, 540-2, . . . , 540-4, may be recessed back by using a suitable selective, anisotropic etch process remove the conductive material, 540-1, 540-2, . . . , 540-4, from a bottom surface of the first vertical openings, e.g., 500 in FIG. 5A, exposing the gate dielectric 538 on the bottom surface to form separate, vertical access lines, 540-1, 540-2, . . . , 540-4. As shown in FIG. 5B, a dielectric material 539, such as an oxide or other suitable spin on dielectric (SOD), may then be deposited in the first vertical openings 500, using a process such as CVD, to fill the first vertical openings 500. The dielectric may be planarized to a top surface of the hard mask 535 of the vertical semiconductor stack, e.g., 401 as shown in FIG. 4, using chemical mechanical planarization (CMP) or other suitable semiconductor fabrication technique. A subsequent photolithographic material 536, e.g., hard mask, may be deposited using CVD and planarized using CMP to cover and close the first vertical openings 500 over the separate, vertical access lines, 540-1, 540-2, . . . , 540-4. Similar semiconductor process techniques may be used at other points of the semiconductor fabrication process described herein.

Figure 6A:
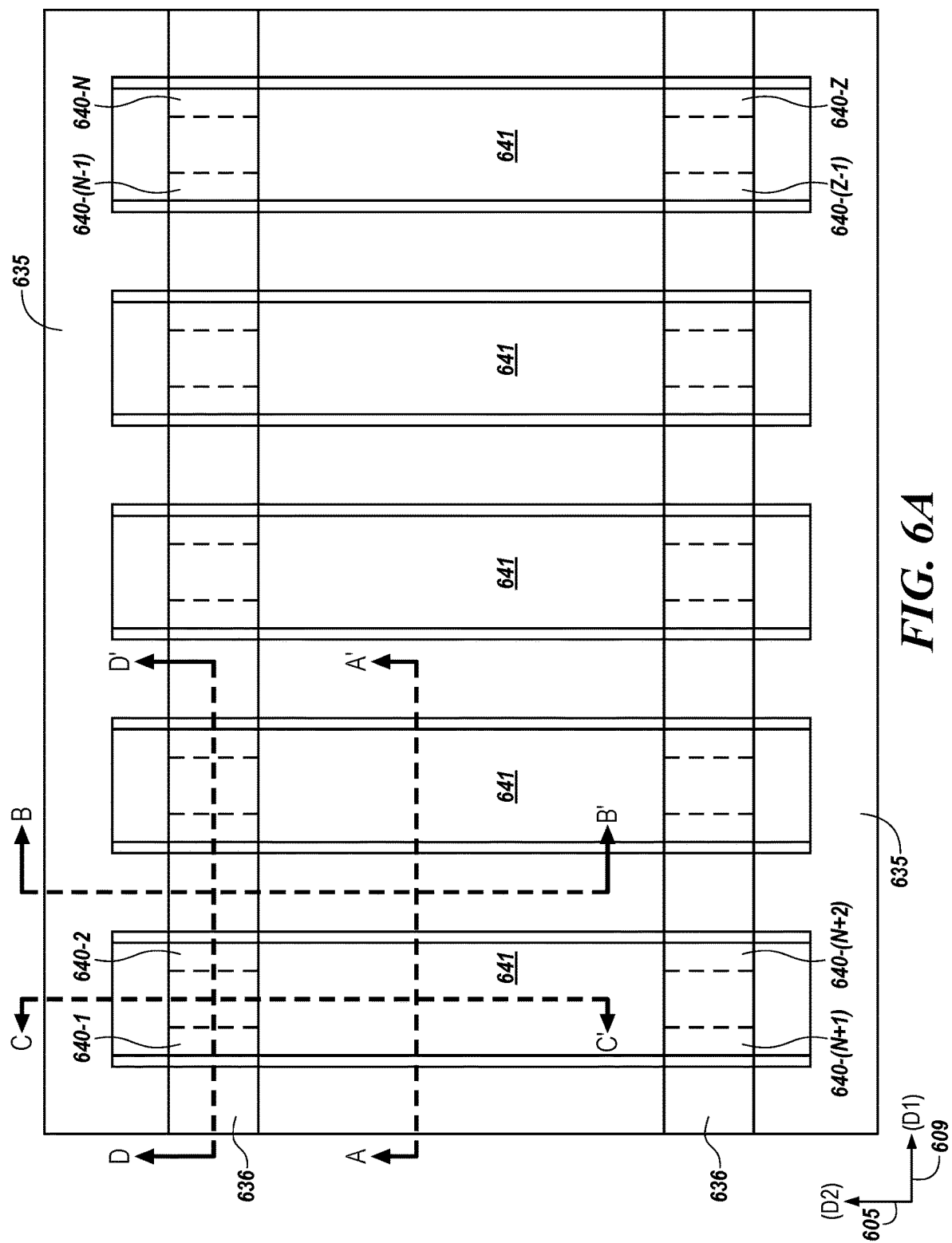

FIG. 6A illustrates an example method, at another stage of a semiconductor fabrication process, for forming arrays of vertically stacked memory cells, having horizontally oriented access devices and vertically oriented access lines, such as illustrated in FIGS. 1-3, and in accordance with a number of embodiments of the present disclosure. FIG. 6A illustrates a top down view of a semiconductor structure, at a particular point in time, in a semiconductor fabrication process, according to one or more embodiments. In the example embodiment of FIG. 6A, the method comprises using a photolithographic process to pattern the photolithographic mask 636, 536 in FIG. 5B. The method in FIG. 6A, further illustrates using a selective, isotropic etchant process remove portions of the exposed conductive material, 640-1, 640-2, . . . , 640-N, 640-(N+1), . . . , 640-(Z−1), and 640-Z, to separate and individually form the plurality of separate, vertical access lines, 640-1, 640-2, . . . , 640-N, 640-(N+1), . . . , 640-(Z−1), and 640-Z, e.g., access lines 103-1, 103-2, . . . , 103-Q in FIG. 1, et. seq. Hence the plurality of separate, vertical access lines, 640-1, 640-2, . . . , 640-N, 640-(N+1), . . . , 640-(Z−1), and 640-Z, are shown along the sidewalls of the elongated vertical, pillar columns, e.g., along sidewalls of the elongated vertical, pillar columns 542-1, 542-2, and 542-3 in the cross-sectional view of FIG. 5B.

As shown in the example of FIG. 6A, the exposed conductive material, 640-1, 640-2, . . . , 640-N, 640-(N+1), . . . , 640-(Z−1), and 640-Z, may be removed back to the gate dielectric material 638 in the first vertical openings, e.g., 500 in FIG. 5A, using a suitable selective, isotropic etch process. As shown in FIG. 6A, a subsequent dielectric material 641, such as an oxide or other suitable spin on dielectric (SOD), may then be deposited to fill the remaining openings from where the exposed conductive material, 640-1, 640-2, . . . , 640-N, 640-(N+1), . . . , 640-(Z−1), and 640-Z, was removed using a process such as CVD, or other suitable technique. The dielectric material 641 may be planarized to a top surface of the previous hard mask 635 of the vertical semiconductor stack, e.g., 401 as shown in FIG. 4, using a process such as CMP, or other suitable technique. In some embodiments, a subsequent photolithographic material 537, e.g., hard mask, may be deposited using CVD and planarized using CMP to cover and close the plurality of separate, vertical access lines, 640-1, 640-2, . . . , 640-N, 640-(N+1), . . . , 640-(Z−1), and 640-Z, over a working surface of the vertical semiconductor stack, 401 in FIG. 4, leaving the plurality of separate, vertical access lines, 640-1, 640-2, . . . , 640-N, 640-(N+1), . . . , 640-(Z−1), and 640-Z, protected along the sidewalls of the elongated vertical, pillar columns. Embodiments, however, are not limited to these process examples.

FIG. 6B illustrates a cross sectional view, taken along cut-line A-A' in FIG. 6A, showing another view of the semiconductor structure at this particular point in one example semiconductor fabrication process of an embodiment of the present disclosure. The cross sectional view shown in FIG. 6B is away from the plurality of separate, vertical access lines, 640-1, 640-2, . . . , 640-N, 640-(N+1), . . . , 640-(Z−1), and shows the repeating iterations of alternating layers of a dielectric material, 630-1, 630-2, . . . , 630-N, and a sacrificial semiconductor material, 632-1, 632-2, . . . , 632-N, on a semiconductor substrate 400 to form the vertical stack, e.g. 401 as shown in FIG. 4. As shown in FIG. 6B, a vertical direction 611 is illustrated as a third direction (D3), e.g., z-direction in an x-y-z coordinate system, analogous to the third direction (D3) 111, among first, second and third directions, shown in FIGS. 1-3. The plane of the drawing sheet, extending right and left, is in a first direction (D1) 609. In the example embodiment of FIG. 6B, the dielectric material 641 is shown filling the vertical openings on the residual gate dielectric 638 deposition. The hard mask 637, described above, caps the illustrated structure.

FIG. 6C illustrates a cross sectional view, taken along cut-line B-B' in FIG. 6A, showing another view of the semiconductor structure at this particular point in one example semiconductor fabrication process of an embodiment of the present disclosure. The cross sectional view shown in FIG. 6C is illustrated extending in the second direction (D2) 605 along an axis of the repeating iterations of alternating layers of a dielectric material, 630-1, 630-2, . . . , 630-N, and a sacrificial semiconductor material, 632-1, 632-2, . . . , 632-N, along and in which the horizontally oriented access devices and horizontally oriented storage nodes, e.g., capacitor cells, can be formed within the layers of sacrificial semiconductor material, 632-1, 632-2, . . . , 632-N. In FIG. 6C, a neighboring, opposing vertical access line 640-3 is illustrated by a dashed line indicating a location set in from the plane and orientation of the drawing sheet.

FIG. 6D illustrates a cross sectional view, taken along cut-line C-C' in FIG. 6A, showing another view of the semiconductor structure at this particular point in one example semiconductor fabrication process of an embodiment of the present disclosure. The cross sectional view shown in FIG. 6D is illustrated extending in the second direction (D2) 605 along an axis of the repeating iterations of alternating layers of a dielectric material, 630-1, 630-2, . . . , 630-N, and a sacrificial semiconductor material, 632-1, 632-2, . . . , 632-N, outside of a region in which the horizontally oriented access devices and horizontally oriented storage nodes, e.g., capacitor cells, will be formed within the layers of sacrificial semiconductor material, 632-1, 632-2, . . . , 632-N. In FIG. 6C, the dielectric material 641 is shown filling the space between the horizontally oriented access devices and horizontally oriented storage nodes, which can be spaced along a first direction (D1), extending into and out from the plane of the drawings sheet, for a three dimensional array of vertically oriented memory cells. At the left end of the drawing sheet is shown the repeating iterations of alternating layers of a dielectric material, 630-1, 630-2, . . . , 630-(N+1), and a sacrificial semiconductor material, 632-1, 632-2, . . . , 632-N, at which location a horizontally oriented digit line, e.g., digit lines 107-1, 107-2, . . . , 107-P shown in FIG. 1, et. seq., can be integrated to form electrical contact with the second source/drain regions, described in more detail below.

FIG. 6E illustrates a cross sectional view, taken along cut-line D-D' in FIG. 6A, showing another view of the semiconductor structure at this particular point in one example semiconductor fabrication process of an embodiment of the present disclosure. The cross sectional view shown in FIG. 6E is illustrated, right to left in the plane of the drawing sheet, extending in the first direction (D1) 609 along an axis of the repeating iterations of alternating layers of a dielectric material, 630-1, 630-2, . . . , 630-N, and a sacrificial semiconductor material, 632-1, 632-2, . . . , 632-N, intersecting across the plurality of separate, vertical access lines, 640-1, 640-2, . . . , 640-N, 640-(N+1), . . . , 640-(Z−1), and intersecting regions of the sacrificial semiconductor material, 632-1, 632-2, . . . , 632-N, in which a channel region may be formed, separated from the plurality of separate, vertical access lines, 640-1, 640-2, . . . , 640-N, 640-(N+1), . . . , 640-(Z−1), by the gate dielectric 638. In FIG. 6E, the first dielectric fill material 639 is shown separating the space between neighboring horizontally oriented access devices and horizontally oriented storage nodes, which may be formed extending into and out from the plane of the drawing sheet as described in more detail below, and can be spaced along a first direction (D1) 609 and stacked vertically in arrays extending in the third direction (D3) 611 in the three dimensional (3D) memory.

Figure 7A:
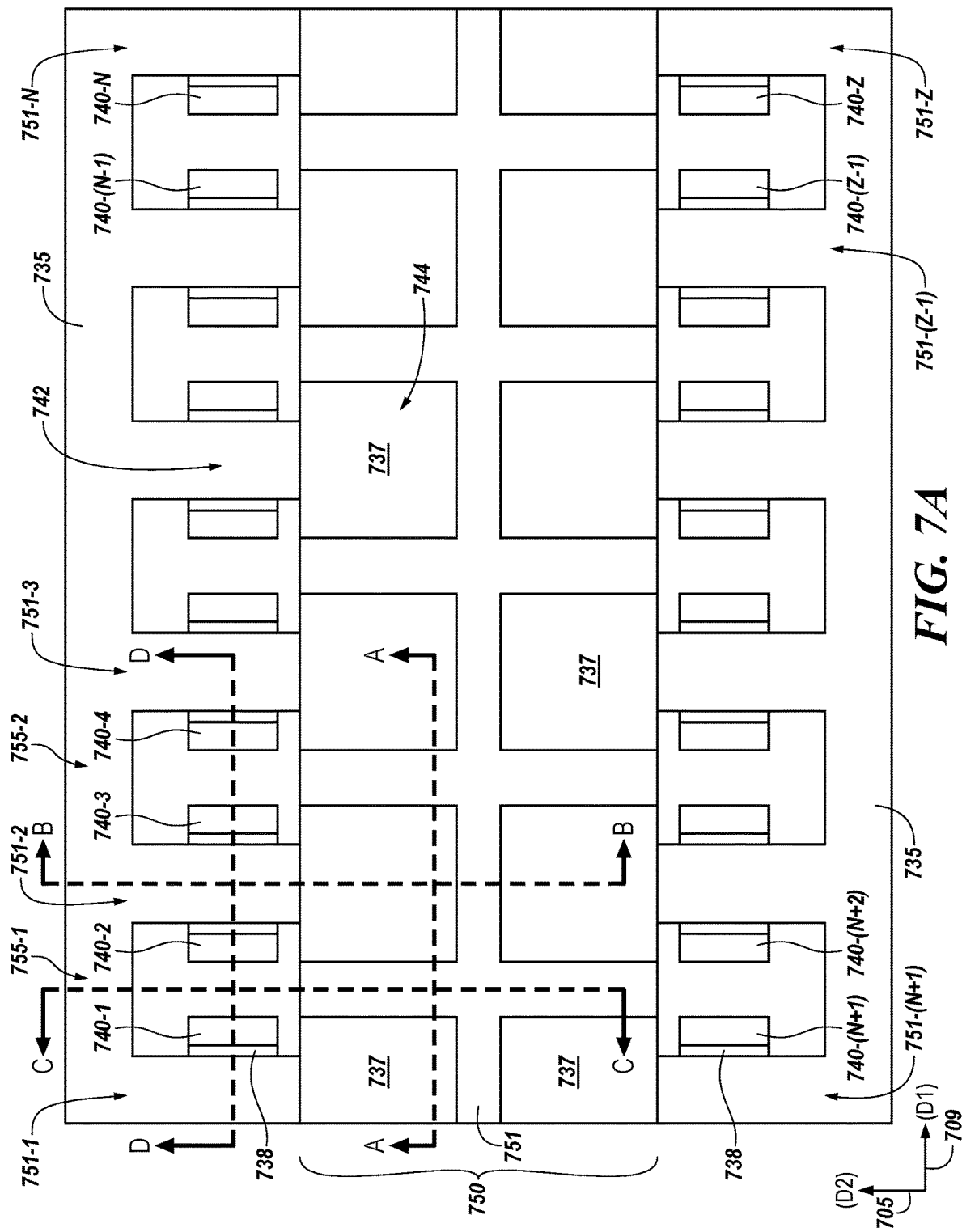

FIG. 7A illustrates an example method, at another stage of a semiconductor fabrication process, for forming arrays of vertically stacked memory cells, having horizontally oriented access devices and vertically oriented access lines, such as illustrated in FIGS. 1-3, and in accordance with a number of embodiments of the present disclosure. FIG. 7A illustrates a top down view of a semiconductor structure, at a particular point in time, in a semiconductor fabrication process, according to one or more embodiments. In the example embodiment of FIG. 7A, the method comprises using a photolithographic process to pattern the photolithographic masks 735, 736 and/or 737, e.g., 635, 636, and/or 637 in FIGS. 6A-6E. The method in FIG. 7A, further illustrates using one or more etchant processes to form a vertical opening 751 in a storage node region 750 (and 744 in FIGS. 7A and 7C) through the vertical stack and extending predominantly in the first horizontal direction (D1) 709. The one or more etchant processes forms a vertical opening 751 to expose third sidewalls in the repeating iterations of alternating layers of a dielectric material, 730-1, 730-2, . . . , 730-N, and a sacrificial semiconductor material, 732-1, 732-2, . . . , 732-N, in the vertical stack, shown in FIGS. 7B-7E, adjacent a second region of the sacrificial semiconductor material. Other numerated components may be analogous to those shown and discussed in connection with FIG. 6.

According to embodiments, a second region of the sacrificial semiconductor material, 732-1, 732-2, . . . , 732-N, may be removed from the repeating iterations of alternating layers of a dielectric material, 730-1, 730-2, . . . , 730-N, and a sacrificial semiconductor material, 732-1, 732-2, . . . , 732-N, in the vertical stack to form a storage node. In some embodiments, this process is performed before selectively removing an access device region, e.g., transistor region, of the sacrificial semiconductor material in which to form a first source/drain region, channel region, and second source/drain region of the horizontally oriented access devices. In other embodiments, this process is performed after selectively removing an access device region of the sacrificial semiconductor material in which to form a first source/drain region, channel region, and second source/drain region of the horizontally oriented access devices. According to an example embodiment, shown in FIGS. 7B-7E, the method comprises selectively etching the second region of the sacrificial semiconductor material, 732-1, 732-2, . . . , 732-N, to form a second horizontal opening a second horizontal distance back from a vertical opening 751 in the vertical stack. In some embodiments, as shown in FIGS. 7B-7E, the method comprises forming capacitor cell as the storage node in the second horizontal opening. By way of example, and not by way of limitation, forming the capacitor comprises using an atomic layer deposition (ALD) process to sequentially deposit, in the second horizontal opening, a first electrode 761 and a second electrode 756 separated by a cell dielectric 763. Other suitable semiconductor fabrication techniques and/or storage nodes structures may be used.

FIG. 7B illustrates a cross sectional view, taken along cut-line A-A' in FIG. 7A, showing another view of the semiconductor structure at this particular point in one example semiconductor fabrication process of an embodiment of the present disclosure. The cross sectional view shown in FIG. 7B is away from the plurality of separate, vertical access lines, 740-1, 740-2, . . . , 740-N, 740-(N+1), . . . , 740-(Z−1), and shows repeating iterations of alternating layers of a dielectric material, 730-1, 730-2, . . . , 730-(N+1), separated by horizontally oriented capacitor cells having first electrodes 761, e.g., bottom cell contact electrodes, cell dielectrics 763, and second electrodes 756, e.g., top, common node electrodes, on a semiconductor substrate 700 to form the vertical stack. As shown in FIG. 7B, a vertical direction 711 is illustrated as a third direction (D3), e.g., z-direction in an x-y-z coordinate system, analogous to the third direction (D3) 111, among first, second and third directions, shown in FIGS. 1-3. The plane of the drawing sheet, extending right and left, is in a first direction (D1) 709. In the example embodiment of FIG. 7B, the first electrodes 761, e.g., bottom electrodes to be coupled to source/drain regions of horizontal access devices, and second electrodes 756 are illustrated separated by a cell dielectric material 763 extending into and out of the plane of the drawing sheet in second direction (D2) and along an axis of orientation of the horizontal access devices and horizontal storage nodes of the arrays of vertically stacked memory cells of the three dimensional (3D) memory.

FIG. 7C illustrates a cross sectional view, taken along cut-line B-B' in FIG. 7A, showing another view of the semiconductor structure at this particular point in one example semiconductor fabrication process of an embodiment of the present disclosure. The cross sectional view shown in FIG. 7C is illustrated extending in the second direction (D2) 705, left and right along the plane of the drawing sheet, along an axis of the repeating iterations of alternating layers of a dielectric material, 730-1, 730-2, . . . , 730-(N+1), and a sacrificial semiconductor material, 732-1, 732-2, . . . , 732-N, along and in which the horizontally oriented access devices and horizontally oriented storage nodes, e.g., capacitor cells, can be formed within the layers of sacrificial semiconductor material, 732-1, 732-2, . . . , 732-N. In the example embodiment of FIG. 7C, the horizontally oriented storage nodes, e.g., capacitor cells, are illustrated as having been formed been formed in this semiconductor fabrication process and first electrodes 761, e.g., bottom electrodes to be coupled to source/drain regions of horizontal access devices, and second electrodes 756, e.g., top electrodes to be coupled to a common electrode plane such as a ground plane, separated by cell dielectrics 763, are shown. However, embodiments are not limited to this example. In other embodiments the first electrodes 761, e.g., bottom electrodes to be coupled to source/drain regions of horizontal access devices, and second electrodes 756, e.g., top electrodes to be coupled to a common electrode plane such as a ground plane, separated by cell dielectrics 763, may be formed subsequent to forming a first source/drain region, a channel region, and a second source/drain region in a region of the sacrificial semiconductor material, 732-1, 732-2, . . . , 732-N, intended for location, e.g., placement formation, of the horizontally oriented access devices, described next.

In the example embodiment of FIG. 7C, the horizontally oriented storage nodes having the first electrodes 761, e.g., bottom electrodes to be coupled to source/drain regions of horizontal access devices, and second electrodes 756, e.g., top electrodes to be coupled to a common electrode plane such as a ground plane, are shown formed in a second horizontal opening extending in second direction (D2), left and right in the plane of the drawing sheet, a second distance for the vertical opening formed in the vertical stack and along an axis of orientation of the horizontal access devices and horizontal storage nodes of the arrays of vertically stacked memory cells of the three dimensional (3D) memory. In FIG. 7C, a neighboring, opposing vertical access line 740-3 is illustrated by a dashed line indicating a location set inward from the plane and orientation of the drawing sheet.

FIG. 7D illustrates a cross sectional view, taken along cut-line C-C' in FIG. 7A, showing another view of the semiconductor structure at this particular point in one example semiconductor fabrication process of an embodiment of the present disclosure. The cross sectional view shown in FIG. 7D is illustrated extending in the second direction (D2) 705, left and right in the plane of the drawing sheet, along an axis of the repeating iterations of alternating layers of a dielectric material, 730-1, 730-2, . . . , 730-N, 730-(N+1) and a sacrificial semiconductor material, 732-1, 732-2, . . . , 732-N, outside of a region in which the horizontally oriented access devices and horizontally oriented storage nodes, e.g., capacitor cells, will be formed within the layers of sacrificial semiconductor material, 732-1, 732-2, . . . , 732-N. In FIG. 7C, the dielectric material 741 is shown filling the space between the horizontally oriented access devices, which can be spaced along a first direction (D1), extending into and out from the plane of the drawings sheet, for a three dimensional array of vertically oriented memory cells. However, in the cross sectional view of FIG. 7D, the second electrode 756, e.g., top, common electrode to the a capacitor cell structure, is additionally shown present in the space between horizontally neighboring devices. At the left end of the drawing sheet is shown the repeating iterations of alternating layers of a dielectric material, 730-1, 730-2, . . . , 730-(N+1), and a sacrificial semiconductor material, 732-1, 732-2, . . . , 732-N, at which location a horizontally oriented digit line, e.g., digit lines 107-1, 107-2, . . . , 107-P shown in FIG. 1, et. seq., can be integrated to form electrical contact with the second source/drain regions, described in more detail below.

FIG. 7E illustrates a cross sectional view, taken along cut-line D-D' in FIG. 7A, showing another view of the semiconductor structure at this particular point in one example semiconductor fabrication process of an embodiment of the present disclosure. The cross sectional view shown in FIG. 7E is illustrated, right to left in the plane of the drawing sheet, extending in the first direction (D1) 709 along an axis of the repeating iterations of alternating layers of a dielectric material, 730-1, 730-2, . . . , 730-(N+1), and a sacrificial semiconductor material, 732-1, 732-2, . . . , 732-N, intersecting across the plurality of separate, vertical access lines, 740-1, 740-2, . . . , 740-4, and intersecting regions of the sacrificial semiconductor material, 732-1, 732-2, . . . , 732-N, in which a channel region may be formed, separated from the plurality of separate, vertical access lines, 740-1, 740-2, . . . , 740-4, by the gate dielectric 738. In FIG. 7E, the first dielectric fill material 739 is shown separating the space between neighboring horizontally oriented access devices and horizontally oriented storage nodes, which may be formed extending into and out from the plane of the drawing sheet as described in more detail below, and can be spaced along a first direction (D1) 709 and stacked vertically in arrays extending in the third direction (D3) 711 in the three dimensional (3D) memory.

Figure 8A:
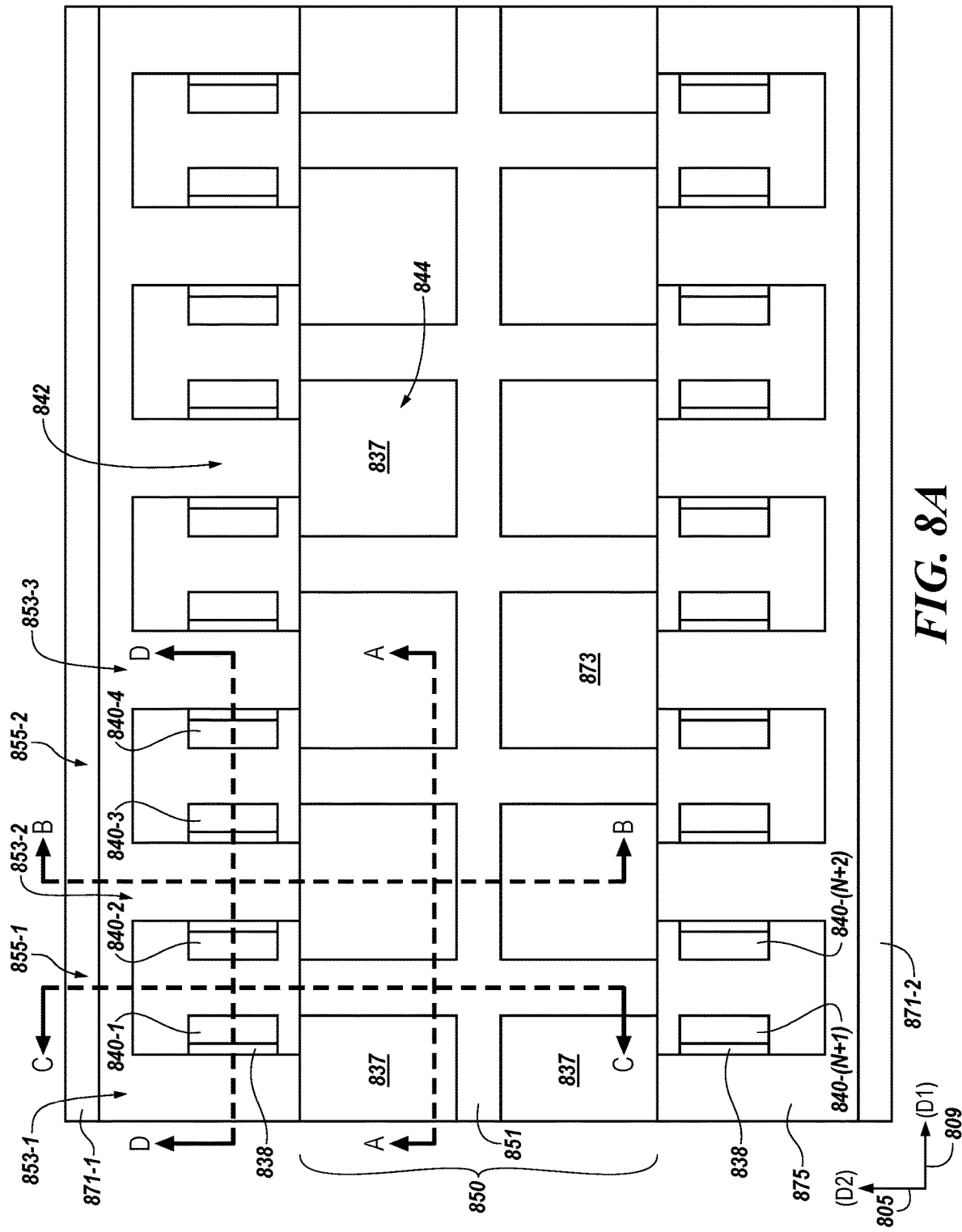

FIG. 8A illustrates an example method, at another stage of a semiconductor fabrication process, for forming arrays of vertically stacked memory cells, having horizontally oriented access devices and vertically oriented access lines, such as illustrated in FIGS. 1-3, and in accordance with a number of embodiments of the present disclosure. FIG. 8A illustrates a top down view of a semiconductor structure, at a particular point in time, in a semiconductor fabrication process, according to one or more embodiments. In the example embodiment of FIG. 8A, the method comprises using a photolithographic process to pattern the photolithographic masks 835, 836 and/or 837, etc. as described in FIGS. 6 and 7. The method in FIG. 8A, further illustrates using one or more etchant processes to form a vertical opening, 871-1 and 871-2, in access device regions, e.g., 742 in FIG. 7C and 842 in FIG. 8C for replacement channel and source/drain transistor regions, through the vertical stack. The vertical openings 871-1 and 871-2 are illustrated extending predominantly in the first horizontal direction (D1) 709. The one or more etchant processes forms a vertical openings, 871-1 and 871-2, to expose third sidewalls in the repeating iterations of alternating layers of a dielectric material, 830-1, 830-2, . . . , 830-(N+1), and a sacrificial semiconductor material, 832-1, 832-2, . . . , 832-N, in the vertical stack, shown in FIGS. 8B-8E, adjacent a first region of the sacrificial semiconductor material. Other numerated components may be analogous to those shown and discussed in connection with FIGS. 6 and 7.

According to embodiments, an access device region (842 in FIG. 8A and 8C), e.g., transistor region, of the sacrificial semiconductor material, 732-1, 732-2, . . . , 732-N in FIG. 7C, may be removed from the repeating iterations of alternating layers of a dielectric material, 830-1, 830-2, . . . , 830-(N+1), and a sacrificial semiconductor material, 832-1, 832-2, . . . , 832-N, in the vertical stack to form an access device, e.g. transistor. In some embodiments, this process is performed before selectively removing a storage node region of the sacrificial semiconductor material in which to form a capacitor cell. In other embodiments, this process is performed after selectively removing a storage node region of the sacrificial semiconductor material in which to form a capacitor cell. According to an example embodiment, shown in FIGS. 8B-8E, the method comprises selectively etching the access device region of the sacrificial semiconductor material, 832-1, 832-2, . . . , 832-N, to form a first horizontal opening a first horizontal distance back from a vertical openings, 871-1 and 871-2 in the vertical stack. In some embodiments, as shown in FIGS. 8B-8E, the method comprises forming a transistor having a first source/drain region, channel region, and second source/drain region as the access device in the first horizontal opening. By way of example, and not by way of limitation, forming the first source/drain region, the channel region, and the second source/drain region comprises using an atomic layer deposition (ALD) process to sequentially deposit, in the first horizontal opening, the first source/drain region, the channel region, and the second source/drain region. Other suitable semiconductor fabrication techniques and/or storage nodes structures may be used.

FIG. 8B illustrates a cross sectional view, taken along cut-line A-A' in FIG. 8A, showing another view of the semiconductor structure at this particular point in one example semiconductor fabrication process of an embodiment of the present disclosure. The cross sectional view shown in FIG. 8B is away from the plurality of separate, vertical access lines, 840-1, 840-2, . . . , 840-N, 840-(N+1), . . . , 840-(Z−1), and shows repeating iterations of alternating layers of a dielectric material, 830-1, 830-2, . . . , 830-(N+1), separated by capacitor cells having first electrodes 861, e.g., bottom cell contact electrodes, cell dielectrics 863, and second electrodes 856, e.g., top, common node electrode, on a semiconductor substrate 800 to form the vertical stack. As shown in FIG. 8B, a vertical direction 811 is illustrated as a third direction (D3), e.g., z-direction in an x-y-z coordinate system, analogous to the third direction (D3) 111, among first, second and third directions, shown in FIGS. 1-3. The plane of the drawing sheet, extending right and left, is in a first direction (D1) 809. In the example embodiment of FIG. 8B, the first electrodes 861, e.g., bottom electrodes to be coupled to source/drain regions of horizontal access devices, and second electrodes 856 are illustrated separated by a cell dielectric material 863 extending into and out of the plane of the drawing sheet in second direction (D2) and along an axis of orientation of the horizontal access devices and horizontal storage nodes of the arrays of vertically stacked memory cells of the three dimensional (3D) memory.

FIG. 8C illustrates a cross sectional view, taken along cut-line B-B' in FIG. 8A, showing another view of the semiconductor structure at this particular point in one example semiconductor fabrication process of an embodiment of the present disclosure. The cross sectional view shown in FIG. 8C is illustrated extending in the second direction (D2) 805, left and right along the plane of the drawing sheet, along an axis of the repeating iterations of alternating layers of a dielectric material, 830-1, 830-2, . . . , 830-(N+1). However, now it is shown that the sacrificial semiconductor material has been selectively removed in a access device region 842 of the alternating layers of the vertical stack to form horizontal openings, 833-1, 833-2, . . . , 833-N, in which the horizontally oriented access devices having a first source/drain region, channel region, and second source/drain region can be formed between the vertical alternating layers of a dielectric material, 830-1, 830-2, . . . , 830-(N+1). In one example embodiment, the sacrificial semiconductor material, 732-1, 732-2, . . . , 732-N in FIG. 7C, may be selectively removed using an atomic layer etching (ALE) process. Embodiments, however, are not limited to this example.

In the example embodiment of FIG. 8C, the horizontally oriented storage nodes, e.g., capacitor cells, are illustrated as having been formed been formed in this semiconductor fabrication process in the storage node region 844 and first electrodes 861, e.g., bottom electrodes to be coupled to source/drain regions of horizontal access devices, and second electrodes 856, e.g., top electrodes to be coupled to a common electrode plane such as a ground plane, separated by a cell dielectric 863, are shown. However, embodiments are not limited to this example. In other embodiments the first electrodes 861, e.g., bottom electrodes to be coupled to source/drain regions of horizontal access devices, and second electrodes 856, e.g., top electrodes to be coupled to a common electrode plane such as a ground plane, separated by cell dielectrics 863, may be formed subsequent to forming a first source/drain region, a channel region, and a second source/drain region in the horizontal openings, 833-1, 833-2, . . . , 833-N.

In the example embodiment of FIG. 8C, the horizontally openings 833-1, 833-2, . . . , 833-N, in which to form the access devices having a first source/drain region, channel region, and second source/drain region, are shown extending in second direction 805 (D2), left and right in the plane of the drawing sheet, a distance from the vertical openings 871-1 and 871-2 formed in the vertical stack and along an axis of orientation of the horizontal access devices and horizontal storage nodes of the arrays of vertically stacked memory cells of the three dimensional (3D) memory. In FIG. 8C, a neighboring, opposing vertical access line 840-3 is illustrated by a dashed line indicating a location set inward from the plane and orientation of the drawing sheet and the gate dielectric 838 is visible.

FIG. 8D illustrates a cross sectional view, taken along cut-line C-C' in FIG. 8A, showing another view of the semiconductor structure at this particular point in one example semiconductor fabrication process of an embodiment of the present disclosure. The cross sectional view shown in FIG. 8D is illustrated extending in the second direction (D2) 805, left and right in the plane of the drawing sheet, along an axis of the repeating iterations of alternating layers of a dielectric material, 830-1, 830-2, . . . , 830-N, 830-(N+1) and horizontal openings 833-1, 833-2, . . . , 833-N, outside of a region in which the horizontally oriented access devices and horizontally oriented storage nodes, e.g., capacitor cells, will be formed. In FIG. 8D, the dielectric material 841 is shown filling the space between the horizontally oriented access devices, which can be spaced along a first direction (D1), extending into and out from the plane of the drawings sheet, for a three dimensional array of vertically oriented memory cells. However, in the cross sectional view of FIG. 8D, the second electrode 856, e.g., top, common electrode to the a capacitor cell structure, is additionally shown present in the space between horizontally neighboring devices. At the left end of the drawing sheet is shown the repeating iterations of alternating layers of a dielectric material, 830-1, 830-2, . . . , 830-(N+1), and horizontal openings, 833-1, 833-2, . . . , 833-N, at which location a horizontally oriented digit line, e.g., digit lines 107-1, 107-2, . . . , 107-P shown in FIG. 1, et. seq., can be integrated to form electrical contact with the second source/drain regions, of the formed horizontal access devices.

FIG. 8E illustrates a cross sectional view, taken along cut-line D-D' in FIG. 8A, showing another view of the semiconductor structure at this particular point in one example semiconductor fabrication process of an embodiment of the present disclosure. The cross sectional view shown in FIG. 8E is illustrated, right to left in the plane of the drawing sheet, extending in the first direction (D1) 809 along an axis of the repeating iterations of alternating layers of a dielectric material, 830-1, 830-2, . . . , 830-(N+1), and horizontal openings, 833-1, 833-2, . . . , 833-N, in which channel regions will be formed separated from the plurality of separate, vertical access lines, 840-1, 840-2, . . . , 840-4, by the gate dielectric 838. In FIG. 8E, the first dielectric fill material 839 is shown separating the space between neighboring horizontally oriented access devices and horizontally oriented storage nodes, which may be formed extending into and out from the plane of the drawing sheet as described in more detail below, and can be spaced along a first direction (D1) 809 and stacked vertically in arrays extending in the third direction (D3) 811 in the three dimensional (3D) memory.

Figure 9A:
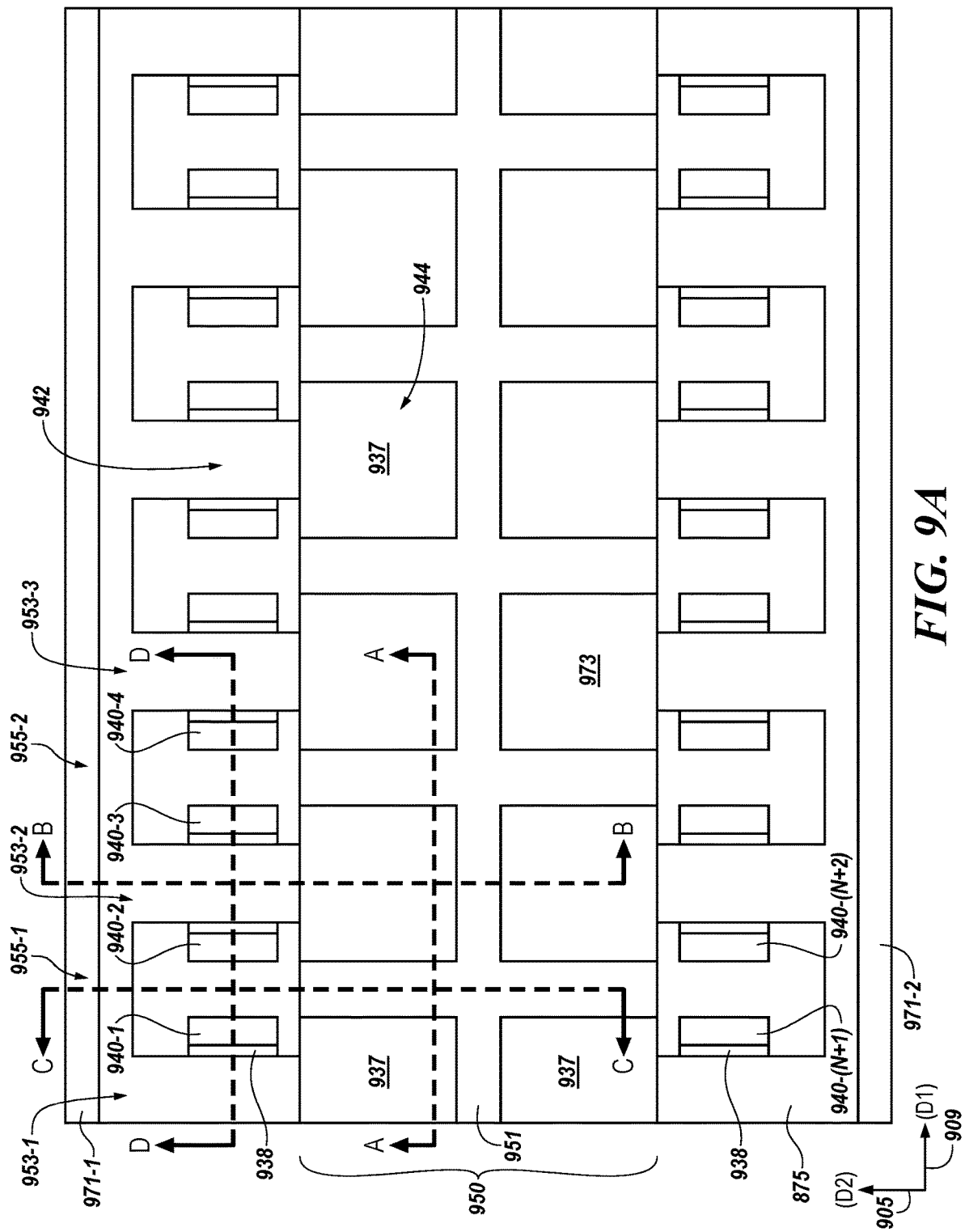
Figure 9C:
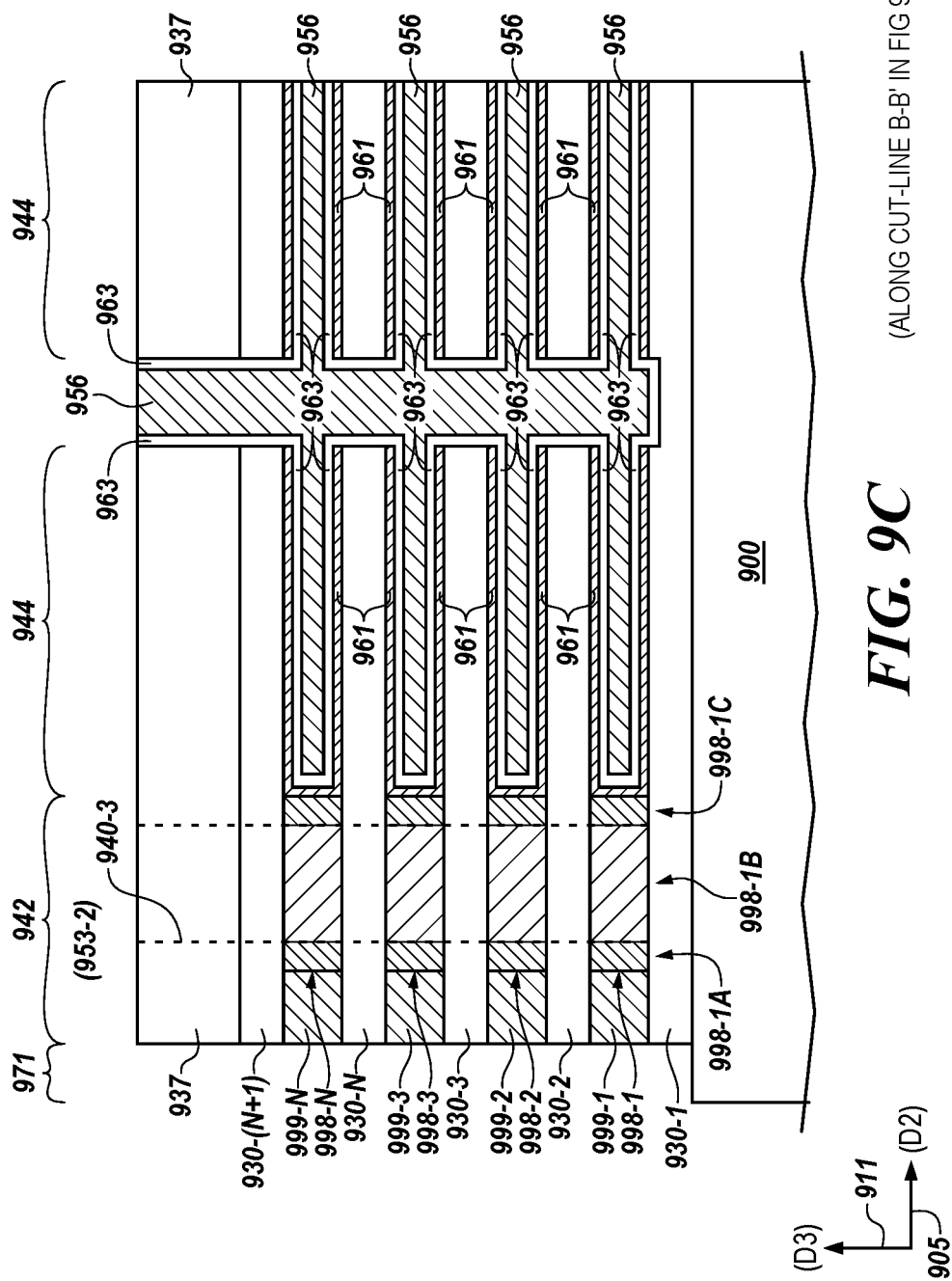

FIG. 9A illustrates an example method, at another stage of a semiconductor fabrication process, for forming arrays of vertically stacked memory cells, having horizontally oriented access devices and vertically oriented access lines, such as illustrated in FIGS. 1-3, and in accordance with a number of embodiments of the present disclosure. FIG. 9A illustrates a top down view of a semiconductor structure, at a particular point in time, in a semiconductor fabrication process, according to one or more embodiments. In the example embodiment of FIG. 9A, the vertical openings 971-1 and 971-2 remain present from FIG. 8A-8E. However, in FIGS. 9A-9F, horizontal access devices, 998-1, 998-2, . . . , 998-N, having first source/drain regions, channel regions, and second source/drain regions, shown respectively as 998-1A, 998-1B, and 998-1C, in FIG. 9C, have been formed in the horizontal openings, 833-1, 833-2, . . . , 833-N shown in FIGS. 8C and 8D. The horizontal access devices, 998-1, 998-2, 998-N, are formed extending in the second direction 905 (D2) in the horizontal access device regions 942 of the vertical stack. Additionally, horizontal digit lines, 999-1, 999-2, 999-N, have been formed and integrated in contact with the second source/drain regions, e.g., 998-1C, as shown in FIGS. 9C and 9E. Other numerated components may be analogous to those shown and discussed in connection with FIGS. 6, 7, and 8.

According to embodiments, in the access device region 942, e.g., transistor region, the sacrificial semiconductor material, 832-1, 832-2, . . . , 832-N, in FIGS. 8A-8E, has been removed to leave the repeating iterations of alternating layers of a dielectric material, 830-1, 830-2, . . . , 830-(N+1), and horizontal openings, 833-1, 833-2, . . . , 833-N, in the vertical stack of FIG. 8 to form an access device, e.g., transistor. In some embodiments, this process is performed before selectively removing a storage node region 944 of the sacrificial semiconductor material in which to form a capacitor cell. In other embodiments, this process is performed after selectively removing a storage node region 944 of the sacrificial semiconductor material in which to form a capacitor cell. According to an example embodiment, shown in FIGS. 9B-9F, the method comprises selectively depositing, using an atomic layer deposition (ALD) process, or other suitable deposition technique, a first source/drain region 938-1A, channel region 938-1B, and second source/drain region 938-1C in each of the horizontal openings, 833-1, 833-2, . . . , 833-N, in FIGS. 8A-8E. By way of example, and not by way of limitation, forming the first source/drain region, the channel region, and the second source/drain region comprises using an atomic layer deposition (ALD) process to sequentially deposit, in the first horizontal opening, the first source/drain region, the channel region, and the second source/drain region according to a process and techniques described in co-filed, co-pending, U.S. patent application Ser. No. 16/986,510, having at least one common inventor and titled "Source/Drain Integration in a Three-Node Access Device for Vertical Three Dimensional (3D) Memory". Other suitable semiconductor fabrication techniques and/or storage nodes structures may be used.

FIG. 9B illustrates a cross sectional view, taken along cut-line A-A' in FIG. 9A, showing another view of the semiconductor structure at this particular point in one example semiconductor fabrication process of an embodiment of the present disclosure. The cross sectional view shown in FIG. 9B is away from the plurality of separate, vertical access lines, 940-1, 940-2, . . . , 940-N, 940-(N+1), . . . , 940-(Z−1), and shows repeating iterations of alternating layers of a dielectric material, 930-1, 930-2, . . . , 930-(N+1), separated by capacitor cells having first electrodes 961, e.g., bottom cell contact electrodes, cell dielectrics 963, and second electrodes 956, e.g., top, common node electrode, on a semiconductor substrate 900 to form the vertical stack. As shown in FIG. 9B, a vertical direction 911 is illustrated as a third direction (D3), e.g., z-direction in an x-y-z coordinate system, analogous to the third direction (D3) 111, among first, second and third directions, shown in FIGS. 1-3. The plane of the drawing sheet, extending right and left, is in a first direction (D1) 909. In the example embodiment of FIG. 9B, the first electrodes 961, e.g., bottom electrodes to be coupled to source/drain regions of horizontal access devices, and second electrodes 956 are illustrated separated by a cell dielectric material 963 extending into and out of the plane of the drawing sheet in second direction (D2) and along an axis of orientation of the horizontal access devices and horizontal storage nodes of the arrays of vertically stacked memory cells of the three dimensional (3D) memory.

FIG. 9C illustrates a cross sectional view, taken along cut-line B-B' in FIG. 9A, showing another view of the semiconductor structure at this particular point in one example semiconductor fabrication process of an embodiment of the present disclosure. The cross sectional view shown in FIG. 9C is illustrated extending in the second direction (D2) 905, left and right along the plane of the drawing sheet, along an axis of the repeating iterations of alternating layers of a dielectric material, 930-1, 930-2, . . . , 930-(N+1). However, now is shown that the first source/drain region material, channel region material, and second source/drain region material, 998-1, 998-2, . . . , 998-N have been deposited in the horizontal openings, 833-1, 833-2, . . . , 833-N, in FIGS. 8A-8E, extending in the second direction 905 (D2). As one example, a first source/drain region 998-1, a channel region 998-1B, and 998-1C are illustrated distinctly. Further, horizontal digit line, 999-1,

999-2, ..., 999-N, integration is achieved in contact with the second source/drain regions, e.g., 998-1C, extending in a first direction (D1), e.g., extending into and out from the plane of the drawing sheet in alternating layers vertically with the dielectric material, 930-1, 930-2, ..., 930-(N+1) in direction (D3) 911.

Hence, three-node horizontal access devices, 938-1, 938-2, ..., 938-N, have been formed and integrated to vertical access lines, 940-1, 940-2, ..., 940-(Z+1) and integrated to digit lines, 999-1, 999-2, ..., 999-N, without body contacts. Advantages to the structure and process described herein can include a lower off-current (Ioff) for the access devices, as compared to silicon based (Si-based) access devices. The channel region, e.g., 938-1B, may be free from minority carriers for the access devices and thus removing the need to control a body potential to a body region of the access device, and/or reduced gate/drain induced leakage (GIDL) for the access devices. In some embodiments channel and/or source/drain region replacement fabrication steps may be performed after a capacitor cell formation process, thus reducing a thermal budget. The digit line integration may be more easily achieved in the fabrication process since a body contact to a body region of the access device is not used. Additionally, the embodiments described herein may achieve a better lateral scaling path than achieved with doped polysilicon based channel regions due to less channel length and lower source/drain semiconductor fabrication process formation overhead.

Again, the first source/drain region, the channel region, and the second source/drain region of the horizontal access devices, 998-1, 998-2, ..., 998-N, and the horizontal digit line, 999-1, 999-2, ..., 999-N, integration may be performed according to processes and techniques described in co-filed, co-pending, U.S. patent application Ser. No. 16/986,510, having at least one common inventor and titled "Source/Drain Integration in a Three-Node Access Device for Vertical Three Dimensional (3D) Memory". According to various embodiments, a further benefit is the avoidance, e.g., no use of, gas phase doping (GPD) in the formation of the source/drain regions. Other suitable semiconductor fabrication techniques and/or storage nodes structures may be used.

Figure 10:
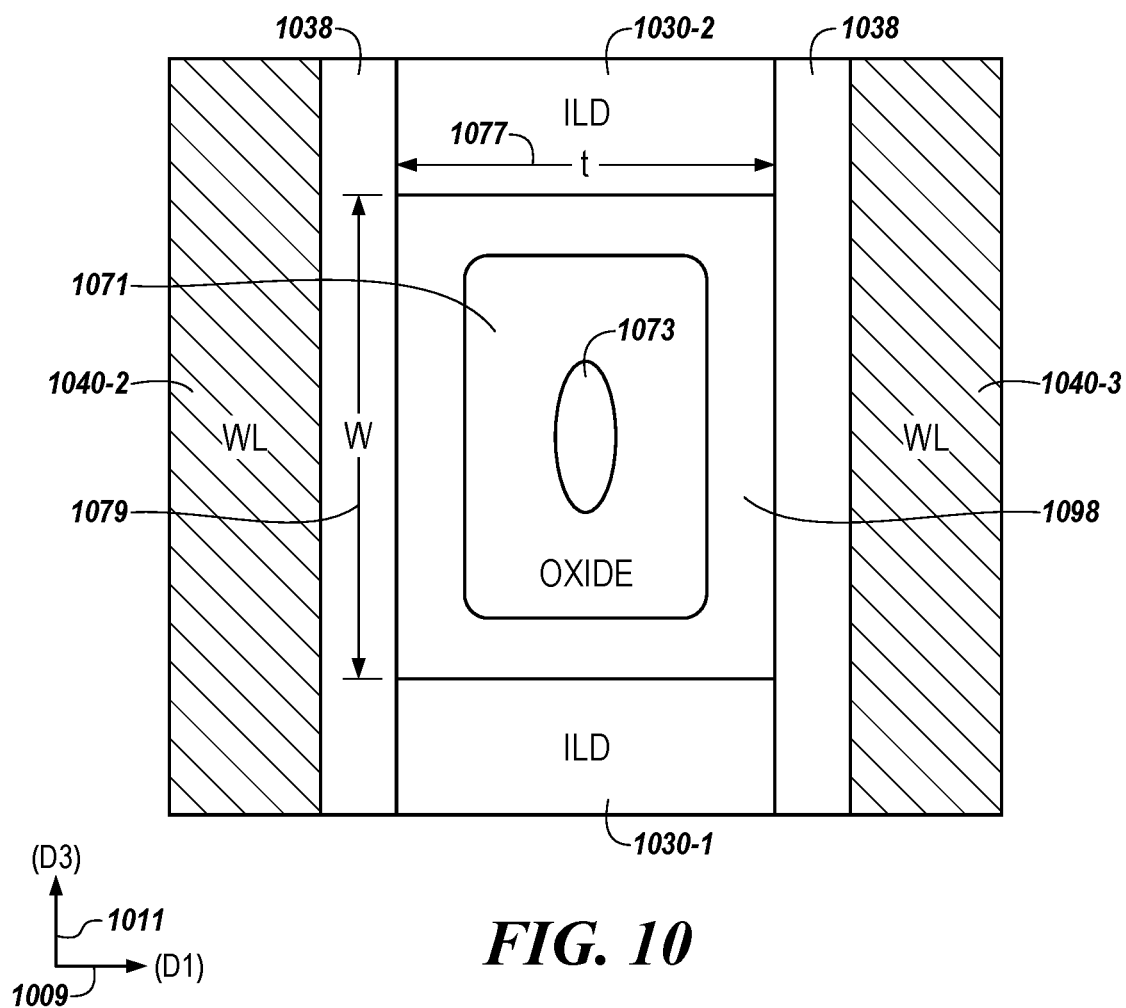
FIG. 10 illustrates one example method for forming a channel region having backchannel passivation, using an atomic layer deposition (ALD) process, to form a three-node access device, in accordance with a number of embodiments of the present disclosure.

In the example embodiment of FIG. 9C, the horizontal access devices having a first source/drain region, channel region, and second source/drain region, 998-1, 998-2, ..., 989-N, are shown extending in second direction 905 (D2), left and right in the plane of the drawing sheet, a distance from the vertical openings 971-1 and 971-2 formed in the vertical stack and along an axis of orientation of the horizontal access devices and horizontal storage nodes of the arrays of vertically stacked memory cells of the three dimensional (3D) memory. As shown in FIG. 10, as dielectric material may be deposited to fill the vertical openings 971-1 and 971-3. In FIG. 9C, a neighboring, opposing vertical access line 940-3 is illustrated by a dashed line indicating a location set inward from the plane and orientation of the drawing sheet.

FIG. 9D illustrates a cross sectional view, taken along cut-line B-B' in FIG. 9A, showing another embodiment using two-dimensional (2D) channel materials including one or more of a transition metal dichalcogenide, including molybdenum disulfide ($MoS_2$), molybdenum diselenide ($MoSe_2$), molybdenum ditelluride ($MoTe_2$), tungsten sulfide ($WS_2$), and tungsten selenide ($WSe_2$). Embodiments, however, are not limited to these 2D channel material examples. The example embodiment of FIG. 9D, illustrates the semiconductor structure at this particular point in the example semiconductor fabrication process having the 2D channel material deposited in the horizontal openings, 833-1, 833-2, ..., 833-N in FIGS. 8A-8E. The cross sectional view shown in FIG. 9D is illustrated extending in the second direction (D2) 905, left and right along the plane of the drawing sheet, along an axis of the repeating iterations of alternating layers of a dielectric material, 930-1, 930-2, ..., 930-(N+1). However, now is shown that the first source/drain region material, channel region material, and second source/drain region material, 998-1, 998-2, ..., 998-N have been deposited using a 2D material 997 in the horizontal openings, 833-1, 833-2, ..., 833-N in FIGS. 8A-8E, extending in the second direction 905 (D2).

In one embodiment the 2D material 997 may be deposited in the horizontal openings, 833-1, 833-2, ..., 833-N in FIGS. 8A-8E, using an atomic layer deposition (ALD) process to cover the surfaces of the horizontal openings, 833-1, 833-2, ..., 833-N in FIGS. 8A-8E, in contact with a bottom electrode 961. In one example embodiment, an insulator material 995 is deposited using an atomic layer deposition (ALD) process as a backchannel passivation material, as described more FIG. 10-12.

Further, horizontal digit line, 999-1, 999-2, ..., 999-N, integration is achieved in contact with the second source/drain regions, as described above in the example embodiment of FIG. 1C, and on a surface of the deposited 2D material 997. According to this embodiment, the 2D material 997 in contact with the digit lines, 999-1, 999-2, ..., 999-N, can provide more contact area for better electrical connection to the digit lines, 999-1, 999-2, ..., 999-N. Again, the horizontal digit lines, 999-1, 999-2, ..., 999-N, extending in a first direction (D1), e.g., extending into and out from the plane of the drawing sheet in alternating layers vertically with the dielectric material, 930-1, 930-2, ..., 930-(N+1) in direction (D3) 911.

Figure 13:
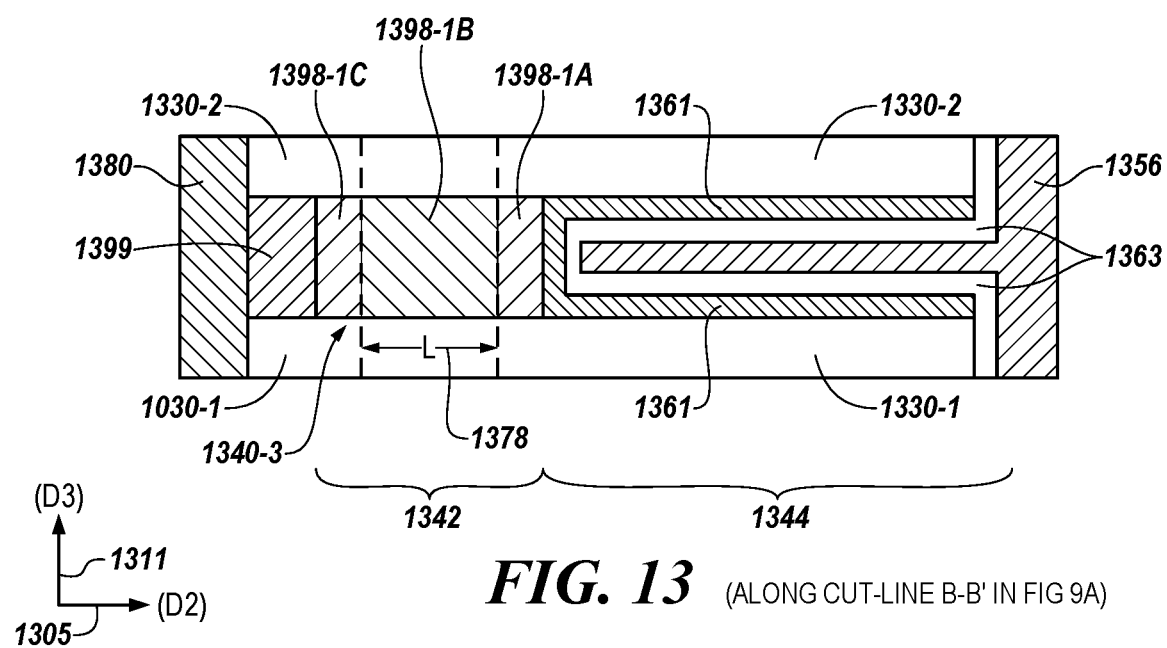
FIG. 13 illustrates an example of a three-node horizontally oriented access device coupled to a horizontally oriented storage node and coupled to vertically oriented access lines and horizontally oriented digit lines, in accordance with a number of embodiments of the present disclosure.

As in the embodiment shown in FIG. 9C, the three-node horizontal access devices have been formed and integrated to vertical access lines, e.g., 940-3 and integrated to digit lines, 999-1, 999-2, ..., 999-N, without body contacts. The structure and process described herein can include a lower off-current (Ioff) for the access devices, as compared to silicon based (Si-based) access devices. The 2D channel material 997 may be free from minority carriers for the access devices and thus removing the need to control a body potential to a body region of the access device. This may achieve reduced gate/drain induced leakage (GIDL) for the access devices and the digit line integration may be more easily achieved in the fabrication process since a body contact to a body region of the access device is not used. According to various embodiments, a further benefit is the avoidance, e.g., no use of, gas phase doping (GPD) in the formation of the source/drain regions. Other suitable semiconductor fabrication techniques and/or storage nodes structures may be used. As shown in FIG. 13, a dielectric material may be deposited to fill the vertical openings 971-1.

FIG. 9E illustrates a cross sectional view, taken along cut-line C-C' in FIG. 9A, showing another view of the semiconductor structure at a particular point in one example semiconductor fabrication process continuing after the example embodiment of FIG. 9C. The cross sectional view shown in FIG. 9E is illustrated extending in the second direction (D2) 905, left and right in the plane of the drawing sheet, along an axis of the repeating iterations of alternating layers of a dielectric material, 930-1, 930-2, ..., 930-N, 930-(N+1) and horizontal digit lines, 999-1, 999-2, ..., 999-N, extending into and out from the plane of the drawing sheet in a first direction (D1), outside of a region in which the horizontally oriented access devices, 938-1, 938-2, ..., 938-N, and horizontally oriented storage nodes, e.g., capacitor cells, in access device region 942 and storage node region 944 are formed. In FIG. 9E, the dielectric material 941 is shown filling the space between the horizontally oriented access devices, which can be spaced along a first direction (D1), extending into and out from the plane of the drawings sheet, for a three dimensional array of vertically oriented memory cells. However, in the cross sectional view of FIG. 9E, the second electrode 956, e.g., top, common electrode to the a capacitor cell structure, is additionally shown present in the space between horizontally neighboring devices. At the left end of the drawing sheet is shown the repeating iterations of alternating layers of a dielectric material, 930-1, 930-2, ..., 930-(N+1), and horizontal digit lines, 999-1, 999-2, ..., 999-N, e.g., digit lines 107-1, 107-2, ..., 107-P shown in FIG. 1, et. seq., integrated to form electrical contact with the second source/drain regions, e.g., 938-1C, of the formed horizontal access devices.

FIG. 9F illustrates a cross sectional view, taken along cut-line D-D' in FIG. 9A, showing another view of the semiconductor structure at this particular point in one example semiconductor fabrication process of an embodiment of the present disclosure. The cross sectional view shown in FIG. 9F is illustrated, right to left in the plane of the drawing sheet, extending in the first direction (D1) 909 along an axis of the repeating iterations of alternating layers of a dielectric material, 930-1, 930-2, ..., 930-(N+1), and channel regions of the horizontal access devices, 998-1, 998-2, ..., 998-N, separated from the plurality of separate, vertical access lines, 940-1, 940-2, ..., 940-4, by the gate dielectric 938. In FIG. 9F, the first dielectric fill material 939 is shown separating the space between neighboring horizontally oriented access devices and horizontally oriented storage nodes, which may be formed extending into and out from the plane of the drawing sheet as described in more detail below, and can be spaced along a first direction (D1) 909 and stacked vertically in arrays extending in the third direction (D3) 911 in the three dimensional (3D) memory.

FIG. 10 illustrates one example method for forming a channel region, e.g., channel region 938-1B shown in FIGS. 9C and 9F, having backchannel passivation by using an atomic layer deposition (ALD) process, to form a three-node access device, according to a number of embodiments disclosure herein. As shown in the example of FIG. 10 the method can comprise using an atomic layer deposition (ALD) process to form a first layer 1098, e.g., 998-1B in FIG. 9C, in contact with a gate dielectric 1038, e.g., deposited within the horizontal openings, 833-1, 833-2, ..., 833-N, in FIGS. 8A-8E, extending in the second direction 905 (D2), of the three-node access device for a memory cell. The method further comprises using an ALD process to form, e.g., deposit, a leakage suppression layer 1071 as an "outer layer", farther from a surface of the channel region, e.g., first layer 1098 opposing the gate dielectric 1038, on the first layer 1098. In one example embodiment, the first layer 1098 can be a two-dimensional (2D) channel material including one or more of a transition metal dichalcogenide, including molybdenum disulfide ($MoS_2$), molybdenum diselenide ($MoSe_2$), molybdenum ditelluride ($MoTe_2$), tungsten sulfide ($WS_2$), and tungsten selenide ($WSe_2$). The leakage suppression layer 1071 can be an insulator material such as insulator material 995 shown in the example embodiment of FIG. 9D. Embodiments, however, are not limited to these 2D channel material examples.

In some embodiments, using an ALD process to form a first layer 1098 comprises depositing an indium (In) rich, indium gallium zinc oxide ($In_2Ga_2ZnO_7$) material as a channel material to form the first layer 1098. In this example, the first layer 1098 is in contact with the gate dielectric 1038 and forms the main, transistor channel. The first layer has a higher charge carrier mobility and a lower electronic bandgap relative to the leakage suppression layer 1071.

In some embodiments, using an ALD process to form leakage suppression layer 1071 comprises depositing an indium (In) lean, indium gallium zinc oxide ($In_2Ga_2ZnO_7$) material, relative to the first layer 1098, as the leakage suppression layer 1071. In some embodiments, using an ALD process to form leakage suppression layer 1071 comprises depositing a gallium (Ga) rich, indium gallium zinc oxide ($In_2Ga_2ZnO_7$) material, relative to the first layer 1098, as the leakage suppression layer 1071. In some embodiments, using an ALD process to form leakage suppression layer 1071 comprises depositing a zinc (Zn) rich, indium gallium zinc oxide ($In_2Ga_2ZnO_7$) material, relative to the first layer 1098, as the leakage suppression layer 1071. In some embodiments, using an ALD process to form leakage suppression layer 1071 comprises depositing only gallium oxide ($Ga_2O_3$) as the leakage suppression layer 1071. The leakage suppression layer 1071 has a lower charge carrier mobility and a higher electronic bandgap relative to the first layer 1098.

According to various embodiment, the channel first layer 1098 is formed using an ALD process such that a width (W) 1079 of the first layer 1098 of the channel is greater than a thickness (t) 1077 of the first layer 1098 of the channel material. As shown in FIG. 10, a void 1073 may still be formed within a center portion of the horizontal openings, 833-1, 833-2, ..., 833-N, in FIGS. 8A-8E, extending in the second direction 905 (D2), resulting from the ALD process.

Figure 11:
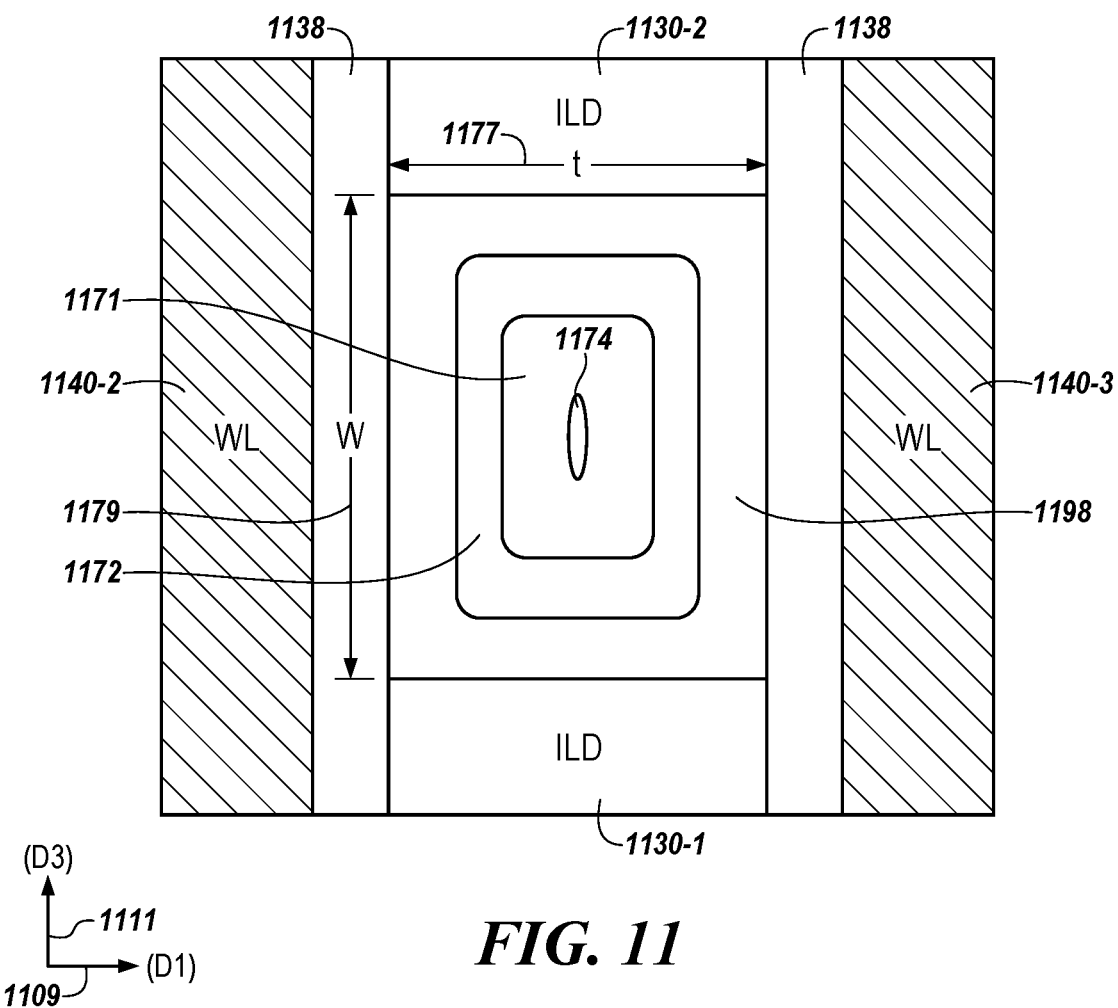
FIG. 11 illustrates another example method for forming a channel region having backchannel passivation, using an atomic layer deposition (ALD) process, to form a three-node access device, in accordance with a number of embodiments of the present disclosure.

FIG. 11 illustrates another example method for forming a channel region, e.g., channel region 938-1B shown in FIGS. 9C and 9F, having backchannel passivation by using an atomic layer deposition (ALD) process, to form a three-node access device, according to a number of embodiments disclosure herein. As shown in the example of FIG. 11 the method can comprise using an atomic layer deposition (ALD) process to form a multi-layer channel material, e.g., channel region 938-1B shown if FIGS. 9C and 9F, having backchannel passivation. Again the method can comprise using an ALD process to form a first layer 1198, e.g., 998-1B in FIG. 9C, in contact with a gate dielectric 1038, e.g., deposited within the horizontal openings, 833-1, 833-2, ..., 833-N, in FIGS. 8A-8E, of the three-node access device for a memory cell. The method further comprises using an ALD process to form, e.g., deposit, a dielectric layer 1171 as an "outer layer", farthest from a surface of the channel region, e.g., first layer 1198 opposing the gate dielectric 1138. In some embodiments, the dielectric layer 1171, e.g., backchannel passivation, is an oxide material. For example, the dielectric layer 1171 may be a silicon dioxide ($SiO_2$) material and/or an aluminum oxide ($Al_2O_3$) material, etc. In some embodiments the dielectric layer 1171 may be a silicon nitride ($Si_3N_4$) material (also referred to herein a "SiN"). In another example the dielectric material 1171 may comprise a silicon oxy-carbide ($SiO_xC_y$) material (also referred to herein as "SiOC"). In another example the dielectric material 1171 may include a silicon oxy-nitride ($SiO_xN_y$) material (also referred to herein as "SiON"), and/or combinations thereof.

As shown in FIG. 11, in some embodiments, the method can include using an ALD process to form at least one intermediate layer 1172 as an interface layer between the first layer 1198 in contact with the gate dielectric 1138 of the three node device, and an Nth layer, e.g., dielectric layer 1171, spaced further from first layer 1198 than the intermediate layer 1172. In some embodiments, the method comprises using an ALD process to deposit an interface layer 1172 having a carrier mobility and an electronic band gap intermediate between a carrier mobility and an electronic band gap of the first layer 1198 and the Nth layer, e.g., dielectric 1171, spaced furthest from the first layer 1198. According to embodiments, the intermediate layer suppresses a concentration of unbound valence electrons at the interface layer 1172 relative to a concentration of unbound valence electrons at the first layer 1198 and the dielectric layer 1171. In some embodiments, the method comprises using an ALD process to deposit an interface layer 1172 between the first layer 1198 and the dielectric layer 1171 that reduces electronic trapping and reduces a change (Δ) in a threshold voltage (Vt) shift, e.g., Δ Vt shift, during quick access operation modes and under bias temperature instability (BTI) conditions for the three-node access device.

In some embodiments, using an ALD process to form a first layer 1198 comprises depositing an indium (In) rich, indium gallium zinc oxide ($In_2Ga_2ZnO_7$) material as a channel material to form the first layer 1198. In this example, the first layer 1198 is in contact with the gate dielectric 1138 and forms the main, transistor channel. The first layer has a higher charge carrier mobility and a lower electronic bandgap relative to the leakage suppression layer 1171.

In some embodiments, using an ALD process to form the intermediate layer 1172 comprises depositing an indium (In) lean, indium gallium zinc oxide ($In_2Ga_2ZnO_7$) material, relative to the first layer 1198, as the intermediate layer 1172. In some embodiments, using an ALD process to form intermediate layer 1172 comprises depositing a gallium (Ga) rich, indium gallium zinc oxide ($In_2Ga_2ZnO_7$) material, relative to the first layer 1198, as the intermediate layer 1172. In some embodiments, using an ALD process to form intermediate layer 1172 comprises depositing a zinc (Zn) rich, indium gallium zinc oxide ($In_2Ga_2ZnO_7$) material, relative to the first layer 1198, as the intermediate layer 1172. In some embodiments, using an ALD process to form the intermediate layer 1172 comprises depositing only gallium oxide ($Ga_2O_3$) as the intermediate layer 1172. The leakage suppression layer 1171 has a lower charge carrier mobility and a higher electronic bandgap relative to the first layer 1198.

According to various embodiment, the multi-layer channel material, 1198, 1172, 1171, etc., is formed using an ALD process such that a width (W) 1179 of the multi-layer channel is greater than a thickness (t) 1177 of the multi-layer channel material, 1198, 1172, 1171, etc. As shown in FIG. 11, a seam 1074 and/or void may still be formed within a center portion of the horizontal openings, 833-1, 833-2, . . . , 833-N, in FIGS. 8A-8E, resulting from the ALD process.

Figure 12:
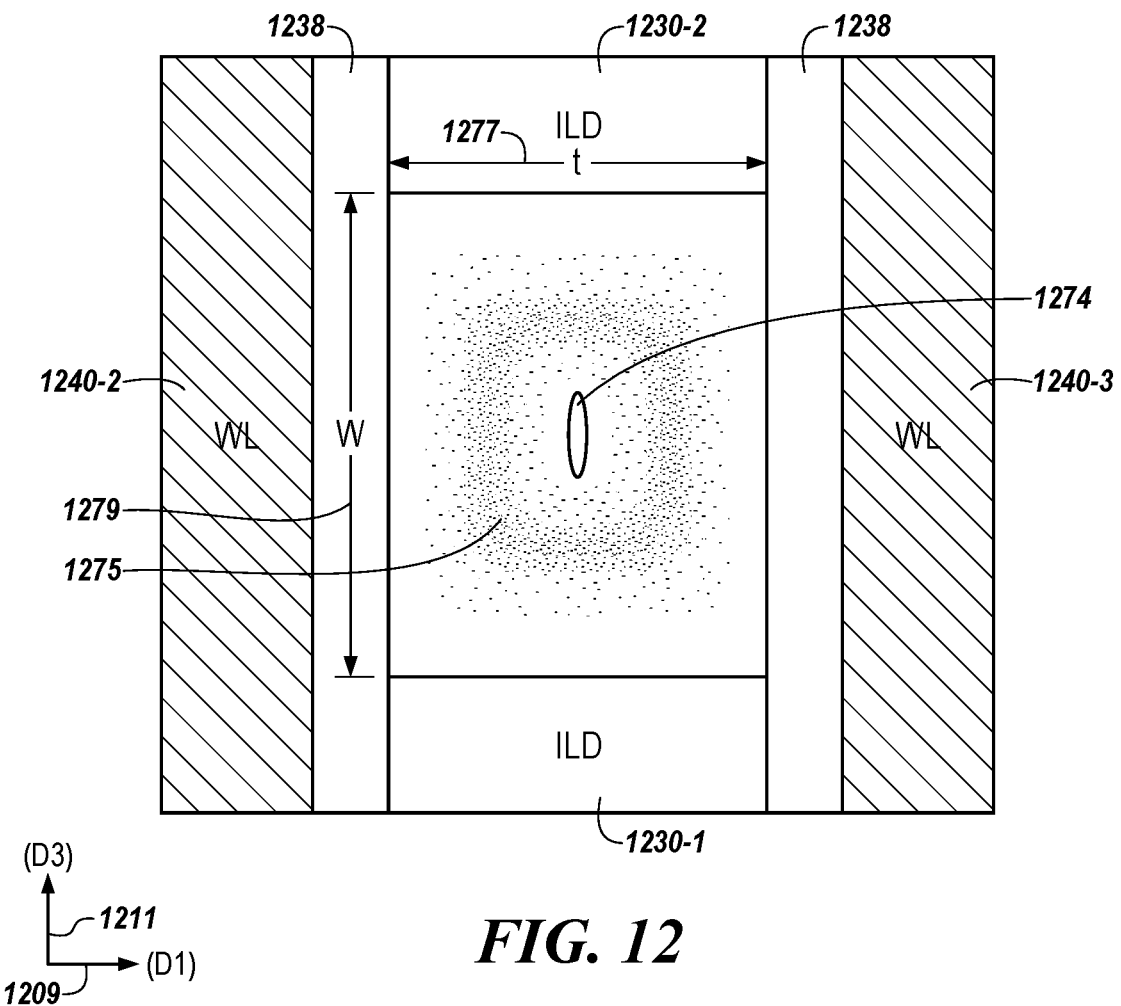
FIG. 12 illustrates another example method for forming a channel region having backchannel passivation, using an atomic layer deposition (ALD) process, to form a three-node access device, in accordance with a number of embodiments of the present disclosure.

FIG. 12 illustrates another example method for forming a channel region, e.g., channel region 938-1B shown in FIGS. 9C and 9F, having backchannel passivation by using an atomic layer deposition (ALD) process, to form a three-node access device, according to a number of embodiments disclosure herein. In the example embodiment of FIG. 12, the method can comprise using an atomic layer deposition (ALD) process to form a gradient channel material 1275 having backchannel passivation. Again the method can comprise using an ALD process to deposit the gradient conductive channel material 1275 to have a composition having a highest carrier mobility in the gradient channel material 1275 adjacent the gate dielectric 1238, e.g., deposited within the horizontal openings, 833-1, 833-2, . . . , 833-N, in FIGS. 8A-8E, of the three-node access device for the memory cell and having a lowest conductivity, e.g., lowest carrier mobility, backchannel passivation in the gradient channel material 1275 furthest away from the gate dielectric 1238. In this example, the gradient channel 1275 can be deposited, using ALD, to have an increasing electronic bandgap, an increasing conduction band offset, and a reduced carrier mobility all in a direction away from the gate dielectric 1238.

In some embodiments, an ALD process is used to deposit an indium gallium zinc oxide ($In_2Ga_2ZnO_7$) gradient channel material 1275 having a decreasing indium (In) concentration, e.g., backchannel passivation, in the gradient channel 1275 in a direction inward, away from the gate dielectric 1238 of the three-node access device for the memory cell. In some embodiments, an ALD process is used to deposit an indium gallium zinc oxide ($In_2Ga_2ZnO_7$) gradient channel material 1275 having an increasing gallium (Ga) concentration, e.g., backchannel passivation, in the gradient channel 1275 in a direction inward, away from the gate dielectric 1238 of the three-node access device for the memory cell. In some embodiments, an ALD process is used to deposit an indium gallium zinc oxide ($In_2Ga_2ZnO_7$) gradient channel material 1275 having an increasing zinc (Zn) concentration, e.g., backchannel passivation, in the gradient channel 1275 in a direction inward, away from the gate dielectric 1238 of the three-node access device for the memory cell.

According to various embodiment, the gradient channel material 1275 is formed using an ALD process such that a width (W) 1279 of the gradient channel 1275 is greater than a thickness (t) 1277 of the gradient channel 1275. In some embodiments, an ALD process may additionally be used to form, e.g., deposit, a dielectric layer (not shown) as an "outer layer", farthest from a surface of the gradient channel region 1275 opposing the gate dielectric 1238. Such a dielectric layer could again be an oxide material, for example, a silicon dioxide ($SiO_2$) material and/or an aluminum oxide ($Al_2O_3$) material, etc. Additionally, such a dielectric layer may comprise a silicon nitride ($Si_3N_4$) material (also referred to herein a "SiN"), a silicon oxy-carbide ($SiO_xC_y$) material (also referred to herein as "SiOC"), a silicon oxy-nitride ($SiO_xN_y$) material (also referred to herein as "SiON"), and/or combinations thereof.

As shown in FIG. 12, a seam 1274 and/or void may still be present with the ALD process within a center region of the gradient channel material 1275, a distance farthest away from the gate dielectric 1238. The method described herein can include using an ALD process to deposit a first source/drain material, 998-1A in FIG. 9C, the replacement channel material 1275 having backchannel passivation, and a second source/drain material, 998-1C in FIG. 9C, sequentially in the horizontal openings, 833-1, 83-3-2, . . . , 833-N, in FIGS. 8A-8E. The method described herein can further comprise integrating a horizontally oriented digit line, 999 in FIG. 9C and 1399 in FIG. 13, to form electrical contact with the second source/drain material, 998-1C, and integrating a vertically oriented access line, e.g., word lines 1240-2 and 1240-3, opposing the gradient channel material 1275 having a backchannel passivation and separated therefrom by a gate dielectric 1238 to form the three-node access device for the memory cell without a body contact.

FIG. 13 illustrates a three-node horizontally oriented access device 1342 coupled to a horizontally oriented storage node 1344 for vertical three dimensional (3D) memory, according to embodiments of the present disclosures. In FIG. 13, the three-node horizontally oriented access device 1342 is illustrated extending in a second direction (D2) 1305, left and right in the plane of the drawing sheet. The horizontally oriented access device 1342 is illustrated having a first source/drain region 1398-1A in electrical contact with a first electrode 1361, e.g., bottom electrode, of the horizontally oriented storage node 1344, e.g., capacitor cell. The storage node 1344 is further illustrated with a dielectric material 1363 separating the first electrode 1361 from a second electrode 1356, e.g., top, common node electrode of the capacitor cell.

A channel region 1398-1B is illustrated in electrical contact with the first source/drain region 1398-1A. A vertically oriented access line 1340-3 opposes the channel region 1398-1B and is separated therefrom by a gate dielectric. The vertically oriented access line 1340-2 is illustrated by dashed lines indicating that the vertically oriented access line is set into and/or out from the plane of the drawing sheet. The vertically oriented access line 1340 may be formed to have a length (L) 1378 that extends longer and/or shorter than a length of the channel region in the second direction (D2) 1305, e.g., having source/drain overlap and/or underlap, according to particular design rules.

A second source/drain region 1398-1C is illustrated in electrical contact with the channel region 1398-1B and in electrical contact with and integrated to a horizontally oriented digit line 1399 extending into and out from a plane of the drawing sheet. As shown in FIG. 13, the horizontally oriented digit line 1399 is in direct electrical contact with the second source/drain region 1398-1C on a "same plane", e.g., level with, the second source/drain region 1398-1C extending the second direction (D2) 1305, and not on a top or bottom surface of the second source/drain region 1398-1C, above or below the second source/drain region 1398-1C. This is advantageous for more easier digit line integration in a semiconductor fabrication process. As shown in FIG. 13, the horizontally oriented access device 1342 and horizontally oriented storage node 1344 may be spaced horizontally from neighboring memory cells by an interlayer dielectric material 1380 along the second direction (D2) 1305 and may be spaced vertically from stacked, neighboring cells in a three dimensional (3D) memory by dielectric layers 1330-1 and 1330-2.

Figure 14:
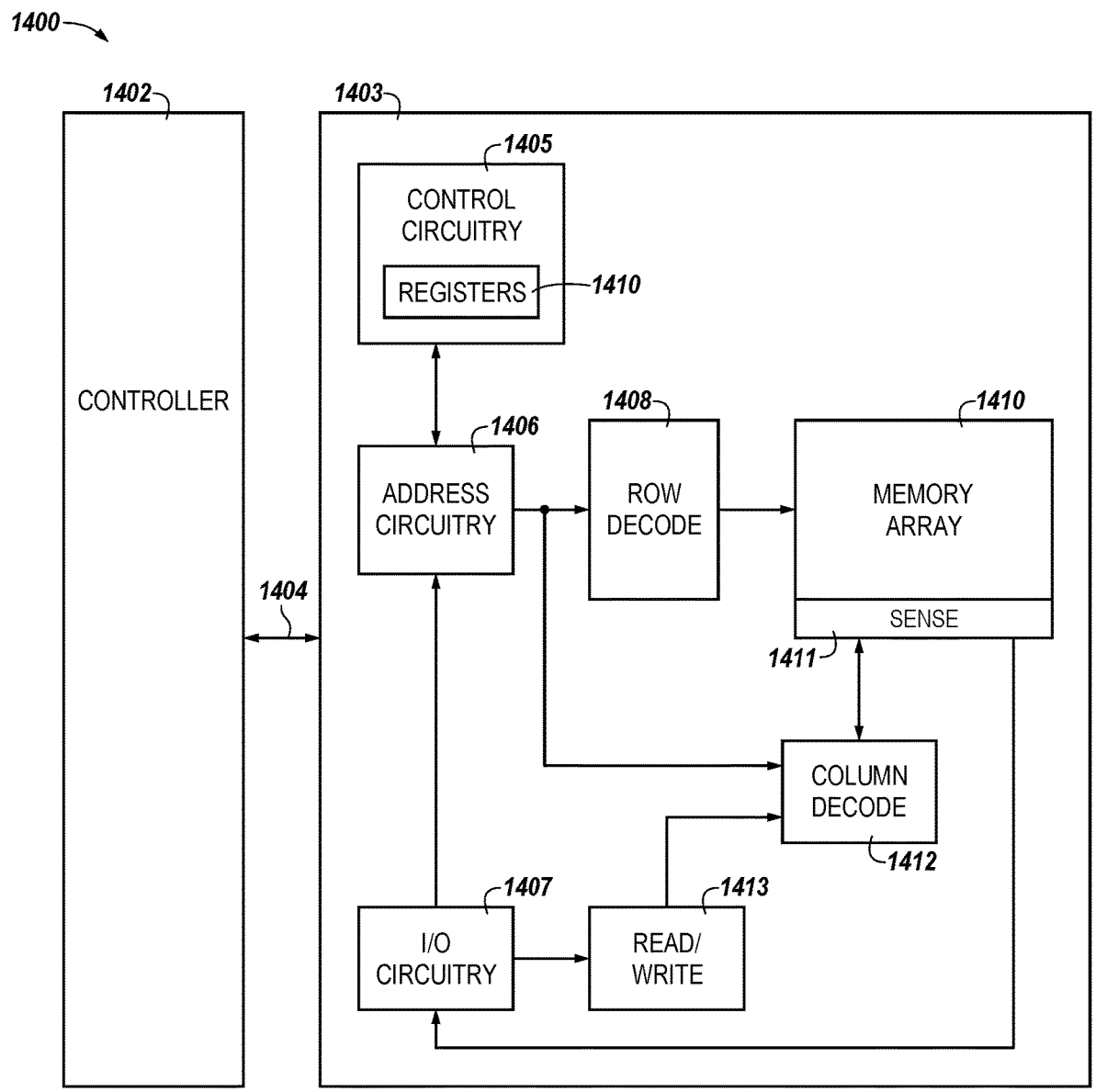
FIG. 14 is a block diagram of an apparatus in the form of a computing system including a memory device in accordance with a number of embodiments of the present disclosure.

FIG. 14 is a block diagram of an apparatus in the form of a computing system 1400 including a memory device 1403 in accordance with a number of embodiments of the present disclosure. As used herein, a memory device 1403, a memory array 1410, and/or a host 1402, for example, might also be separately considered an "apparatus." According to embodiments, the memory device 1402 may comprise at least one memory array 1410 having a three-node access device for vertical three dimensional (3D) memory, as has been described herein.

In this example, system 1400 includes a host 1402 coupled to memory device 103 via an interface 1404. The computing system 1400 can be a personal laptop computer, a desktop computer, a digital camera, a mobile telephone, a memory card reader, or an Internet-of-Things (IoT) enabled device, among various other types of systems. Host 1402 can include a number of processing resources (e.g., one or more processors, microprocessors, or some other type of controlling circuitry) capable of accessing memory 1403. The system 1400 can include separate integrated circuits, or both the host 1402 and the memory device 1403 can be on the same integrated circuit. For example, the host 1402 may be a system controller of a memory system comprising multiple memory devices 1403, with the system controller 1405 providing access to the respective memory devices 1403 by another processing resource such as a central processing unit (CPU).

In the example shown in FIG. 1, the host 1402 is responsible for executing an operating system (OS) and/or various applications (e.g., processes) that can be loaded thereto (e.g., from memory device 1403 via controller 1405). The OS and/or various applications can be loaded from the memory device 1403 by providing access commands from the host 1402 to the memory device 1403 to access the data comprising the OS and/or the various applications. The host 1402 can also access data utilized by the OS and/or various applications by providing access commands to the memory device 1403 to retrieve said data utilized in the execution of the OS and/or the various applications.

For clarity, the system 1400 has been simplified to focus on features with particular relevance to the present disclosure. The memory array 1410 can be a DRAM array, SRAM array, STT RAM array, PCRAM array, TRAM array, RRAM array, NAND flash array, and/or NOR flash array, comprising at least one three-node access device for three dimension (3D) memory. For example, the memory array 1410 can be an unshielded DL 4F2 array such as a 3D-DRAM memory array. The array 1410 can comprise memory cells arranged in rows coupled by word lines (which may be referred to herein as access lines or select lines) and columns coupled by digit lines (which may be referred to herein as sense lines or data lines). Although a single array 1410 is shown in FIG. 1, embodiments are not so limited. For instance, memory device 1403 may include a number of arrays 1410 (e.g., a number of banks of DRAM cells).

The memory device 1403 includes address circuitry 1406 to latch address signals provided over an interface 1404. The interface can include, for example, a physical interface employing a suitable protocol (e.g., a data bus, an address bus, and a command bus, or a combined data/address/command bus). Such protocol may be custom or proprietary, or the interface 1404 may employ a standardized protocol, such as Peripheral Component Interconnect Express (PCIe), Gen-Z, CCIX, or the like. Address signals are received and decoded by a row decoder 1408 and a column decoder 1412 to access the memory array 1410. Data can be read from memory array 1410 by sensing voltage and/or current changes on the sense lines using sensing circuitry 1411. The sensing circuitry 1411 can comprise, for example, sense amplifiers that can read and latch a page (e.g., row) of data from the memory array 1410. The I/O circuitry 1407 can be used for bi-directional data communication with the host 1402 over the interface 1404. The read/write circuitry 1413 is used to write data to the memory array 1410 or read data from the memory array 1410. As an example, the circuitry 1413 can comprise various drivers, latch circuitry, etc.

Control circuitry 1405 decodes signals provided by the host 1402. The signals can be commands provided by the host 1402. These signals can include chip enable signals, write enable signals, and address latch signals that are used to control operations performed on the memory array 1410, including data read operations, data write operations, and data erase operations. In various embodiments, the control circuitry 1405 is responsible for executing instructions from the host 1402. The control circuitry 1405 can comprise a state machine, a sequencer, and/or some other type of control circuitry, which may be implemented in the form of hardware, firmware, or software, or any combination of the three. In some examples, the host 1402 can be a controller external to the memory device 103. For example, the host 1402 can be a memory controller which is coupled to a processing resource of a computing device.

The term semiconductor can refer to, for example, a material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial silicon supported by a base semiconductor structure, as well as other semiconductor structures. Furthermore, when reference is made to a semiconductor in the preceding description, previous process steps may have been utilized to form regions/junctions in the base semiconductor structure, and the term semiconductor can include the underlying materials containing such regions/junctions.

The figures herein follow a numbering convention in which the first digit or digits correspond to the drawing figure number and the remaining digits identify an element or component in the drawing. Similar (e.g., the same) elements or components between different figures may be identified by the use of similar digits. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure and should not be taken in a limiting sense.

As used herein, "a number of" or a "quantity of" something can refer to one or more of such things. For example, a number of or a quantity of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements (e.g., by direct physical contact), indirectly coupled and/or connected with intervening elements, or wirelessly coupled. The term coupled may further include two or more elements that co-operate or interact with each other (e.g., as in a cause and effect relationship). An element coupled between two elements can be between the two elements and coupled to each of the two elements.

It should be recognized the term vertical accounts for variations from "exactly" vertical due to routine manufacturing, measuring, and/or assembly variations and that one of ordinary skill in the art would know what is meant by the term "perpendicular." For example, the vertical can correspond to the z-direction. As used herein, when a particular element is "adjacent to" an other element, the particular element can cover the other element, can be over the other element or lateral to the other element and/or can be in direct physical contact the other element. Lateral to may refer to the horizontal direction (e.g., the y-direction or the x-direction) that may be perpendicular to the z-direction, for example.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:

1. A method for forming arrays of vertically stacked memory cells, having horizontally oriented access devices and vertically oriented access lines, comprising:
    depositing alternating layers of a dielectric material and a sacrificial material in repeating iterations to form a vertical stack;
    using a first etchant process to form a first vertical opening exposing vertical sidewalls in the vertical stack adjacent a first portion of the sacrificial material;
    selectively etching the first portion of the sacrificial material to form a first horizontal opening removing the sacrificial material in a first region, a first horizontal distance back from the first vertical opening;
    depositing a first source/drain material, a replacement channel material having a backchannel passivation, and a second source/drain material in the first horizontal opening to form a three-node access device for a memory cell among the arrays of vertically stacked memory cells, wherein the three-node access devices do not have direct, electrical body contact to a body region or the replacement channel material;
    depositing gates opposing the replacement channel material and separated therefrom by a gate dielectric;
    depositing the vertically oriented access lines coupled to the gates and separated from the replacement channel regions by the gate dielectric;
    depositing horizontally oriented storage nodes electrically coupled to the first source/drain regions of the three node access devices; and
    depositing horizontally oriented digit lines electrically coupled to the second source/drain regions of the horizontally oriented access devices.

2. The method of claim 1, wherein depositing the replacement channel material having a backchannel passivation, comprises:
    using an atomic layer deposition (ALD) process to form a first layer in contact with a gate oxide of the three-node access device for the memory cell; and
    using an ALD process to form a leakage suppression layer.

3. The method of claim 1, wherein depositing the replacement channel material comprises depositing an oxide semiconductor material.

4. The method of claim 1, wherein depositing the replacement channel material comprises depositing:
    an indium rich, indium gallium zinc oxide (IGZO) channel material to form a first layer;
    and
    an indium lean, relative to the first layer, as a leakage suppression layer.

5. The method of claim 2, further comprising depositing a gallium rich, relative to the first layer, leakage suppression layer.

6. The method of claim 2, further comprising depositing a zinc rich, relative to the first layer, leakage suppression layer.

7. The method of claim 2, further comprising depositing a gallium oxide ($GaO_x$) leakage suppression layer.

8. The method of claim 1, further comprising depositing the replacement channel material having the backchannel passivation layer with a lower charge mobility than a first layer in contact with the gate dielectric.

9. The method of claim 1, further comprising depositing the replacement channel material having the backchannel passivation material with a higher electrical bandgap than a first layer in contact with the gate dielectric.

10. A method for forming arrays of vertically stacked memory cells, having horizontally oriented access devices and vertically oriented access lines, comprising:
depositing alternating layers of a dielectric material and a sacrificial material in repeating iterations to form a vertical stack;
forming a plurality of first vertical openings, having a first horizontal direction and a second horizontal direction, through the vertical stack and extending predominantly in the second horizontal direction to form elongated vertical, pillar columns with sidewalls in the vertical stack;
conformally depositing first conductive material on a gate dielectric material in the first vertical openings;
removing portions of the first conductive material to form a plurality of separate, vertical access lines along the sidewalls of the elongated vertical, pillar columns;
forming a second vertical opening exposing vertical sidewalls in the vertical stack adjacent a first portion of the sacrificial material;
selectively removing the first portion of the sacrificial material to form a first horizontal opening in a first region, a first horizontal distance back from the second vertical opening;
depositing a first source/drain material, a multilayer channel material having a backchannel passivation, and a second source/drain material in the first horizontal opening to form a three-node access device for a memory cell among the arrays of vertically stacked memory cells, wherein the horizontally oriented access devices do not have direct, electrical body contact to a body region or the multilayer channel region of the horizontally oriented access device;
forming a gate opposing the multilayer channel material and separated therefrom by a gate dielectric material,
forming vertically oriented access lines coupled to the gate and separated from the multilayer channel material by the gate dielectric;
forming horizontally oriented storage nodes electrically coupled to the first source/drain regions of the three-node access devices; and
forming horizontally oriented digit lines electrically coupled to the second source/drain regions of the three-node access devices.

11. The method of claim 10, wherein depositing the multilayer channel material comprises depositing an oxide semiconductor material.

12. The method of claim 10, further comprising using an atomic layer deposition (ALD) process to deposit the multilayer channel material having a first semiconductor material as a first layer in contact with the gate dielectric of the horizontally oriented access device for the memory cell and a second semiconductor material as a second layer further from the gate dielectric, the second semiconductor material having an electronic bandgap higher than the first layer to serve as the backchannel passivation.

13. The method of claim 10, further comprising depositing the multilayer channel material to have at least one intermediate layer as an interface layer between a first layer in contact with the gate dielectric of the horizontally oriented access device and an Nth layer spaced further from first layer.

14. The method of claim 10, further comprising depositing the multilayer channel material to have an interface semiconductor material having a charge carrier mobility and an electronic band gap intermediate between a charge carrier mobility and an electronic band gap of a first layer in contact with the gate dielectric and an Nth layer spaced further from the first layer.

15. The method of claim 10, further comprising depositing the multilayer channel material to have an interface layer between a first semiconductor layer and a second semiconductor layer to suppress a concentration of unbound valence electrons at the interface layer relative to a concentration of unbound valence electrons at the first semiconductor layer and the second semiconductor layer.

16. The method of claim 10, further comprising depositing the multilayer channel material to have an interface layer between a first semiconductor layer and a second dielectric layer to reduce electronic trapping and to reduce threshold voltage (Vt) shift of the horizontally oriented access device.

17. The method of claim 10, further comprising depositing the multilayer channel material to have a silicon oxide ($SiO_x$) material as the backchannel passivation.

18. The method of claim 10, further comprising depositing the multilayer channel material to have an aluminum oxide ($AlO_x$) materials the backchannel passivation.

19. The method of claim 10, further comprising depositing the multilayer channel material to have a silicon nitride (SiN) material as the backchannel passivation.

20. The method of claim 10, further comprising depositing the multilayer channel material to have a silicon oxycarbide (SiOC) material as the backchannel passivation.

21. The method of claim 10, further comprising depositing the multilayer channel material to have a silicon oxynitride (SiON) material as the backchannel passivation.

22. A method for forming arrays of vertically stacked memory cells, having horizontally oriented access devices and vertically oriented access lines, comprising:
depositing alternating layers of a dielectric material and a sacrificial material in repeating iterations to form a vertical stack;
forming a plurality of first vertical openings, having a first horizontal direction and a second horizontal direction, through the vertical stack and extending predominantly in the second horizontal direction to form elongated vertical, pillar columns with sidewalls in the vertical stack;
conformally depositing first conductive material on a gate dielectric material in the first vertical openings;
removing portions of the first conductive material to form a plurality of separate, vertical access lines along the sidewalls of the elongated vertical, pillar columns;
forming a second vertical opening exposing vertical sidewalls in the vertical stack adjacent a first portion of the sacrificial material;
selectively removing the first portion of the sacrificial material to form a first horizontal opening in a first region a first horizontal distance back from the second vertical opening;
depositing a first source/drain material, a gradient channel material having a backchannel passivation, and a second source/drain material in the first horizontal opening to form a three-node access device for a memory cell among the arrays of vertically stacked memory cells, wherein a horizontally oriented access device does not have a direct, electrical body contact to a body region or the gradient channel material of the horizontally oriented access device;

forming gates opposing the gradient channel material and separated therefrom by a gate dielectric;

forming vertically oriented access lines coupled to the gates and separated from the gradient channel material by the gate dielectric;

forming horizontally oriented storage nodes electrically coupled to the first source/drain regions of the three-node access devices; and forming horizontally oriented digit lines electrically coupled to the second source/drain regions of the three-node access devices.

23. The method of claim 22, further comprising depositing an oxide semiconductor material as the gradient channel material.

24. The method of claim 22, further comprising depositing a gradient oxide semiconductor material using a selective deposition process.

25. The method of claim 22, using an atomic layer deposition (ALD) process to deposit the gradient channel material to have a highest charge carrier mobility in the gradient channel material adjacent the gate dielectric of the three-node access device and to have a lowest charge carrier mobility, the backchannel passivation in the gradient channel material furthest from the gate dielectric.

26. The method of claim 22, further comprising depositing a gradient semiconductor channel material having, in a direction away from a gate dielectric of the horizontally oriented access device, at least one of an increasing electronic bandgap, an increasing conduction band offset, and a reduced charge carrier mobility.

27. The method of claim 22, further comprising depositing an indium gallium zinc oxide (IGZO) gradient channel material having a decreasing indium (In) concentration in the gradient channel material in a direction away from a gate dielectric of the three-node access device.

28. The method of claim 22, further comprising depositing an indium gallium zinc oxide (IGZO) gradient channel material having an increasing gallium (Ga) concentration in the gradient channel material in a direction away from the gate dielectric of the horizontally oriented access device.

29. The method of claim 22, further comprising depositing an indium gallium zinc oxide (IGZO) gradient channel material having an increasing zinc (Zn) concentration in the gradient channel material in a direction away from the gate dielectric of the horizontally oriented access device.

30. The method of claim 22, further comprising depositing the gradient channel material to have a vertical width (W) greater than a horizontal thickness (t) of the gradient channel material.

31. The method of claim 22, further comprising
selectively etching a second portion of the sacrificial material in a second region of the vertical stack to form a storage node of the memory cell before depositing the first source/drain material, the gradient channel material, and the second source/drain material.

32. The method of claim 31, further comprising a forming capacitor cell as the storage node.

33. The method of claim 22, further comprising integrating a horizontally oriented digit line to form electrical contact on a same plane, level with, the second source/drain material.

34. A memory device, comprising:
an array of vertically stacked memory cells, the array of vertically stacked memory cells, comprising:
horizontally oriented, three-node access devices having a first source/drain region and a second source drain region separated by a replacement channel region having backchannel passivation, and gates opposing the replacement channel region and separated therefrom by a gate dielectric, wherein the three-node access devices do not have a direct, electrical body contact to a body region or the replacement channel region of the three-node access device;
vertically oriented access lines coupled to the gates and separated from the replacement channel regions by the gate dielectric;
horizontally oriented storage nodes electrically coupled to the first source/drain regions of the three-node access devices; and
horizontally oriented digit lines electrically coupled to the second source/drain regions of the three-node access devices.

35. The memory device of claim 34, wherein the three-node access devices have three nodes comprising the first source/drain region (1), the second source/drain region (2), and the gates (3).

36. The memory device of claim 34, wherein the replacement channel region comprises an oxide semiconductor material.

37. The memory device of claim 34, wherein the replacement channel region comprises a two-dimensional (2D) material comprising one or more of a transition metal dichalcogenide.

38. The memory device of claim 37, wherein the 2D channel material further extends and covers a surface of the horizontally oriented digit lines electrically coupled to the second source/drain regions to provide more contact surface area.

39. The memory device of claim 34, wherein the replacement channel region comprises an indium gallium zinc oxide (IGZO) channel material having an increasing zinc (Zn) concentration in a direction away from the gate dielectric of the three-node access device.

40. The memory device of claim 34, wherein the replacement channel region has a vertical width (W) greater than a horizontal thickness (t) of the replacement channel region.

41. The memory device of claim 34, wherein the horizontally oriented storage nodes comprise capacitor cells having a first horizontally oriented electrode electrically coupled to the first source/drain regions and a second horizontally oriented electrode separated from the first horizontally oriented electrode by a cell dielectric.

42. The memory device of claim 34, wherein the horizontally oriented storage nodes are in direct electrical contact with the first source/drain regions of the three-node access devices on a same plane, level with, the first source/drain regions.

43. The memory device of claim 34, wherein the horizontally oriented digit lines are in direct electrical contact with the second source/drain regions of the three-node access devices on a same plane, level with, the second source/drain regions.

* * * * *